US009748468B2

(12) United States Patent
Hennig et al.

(10) Patent No.: US 9,748,468 B2
(45) Date of Patent: Aug. 29, 2017

(54) ACTUATOR DEVICE

(71) Applicant: Pi Ceramic GmbH, Lederhose (DE)

(72) Inventors: Eberhard Hennig, Morsdorf (DE); Daniel Kopsch, Weida (DE)

(73) Assignee: Pi Ceramic GmbH, Lederhose (DE)

( * ) Notice: Subject to any disclaimer, the term of this patent is extended or adjusted under 35 U.S.C. 154(b) by 446 days.

(21) Appl. No.: 14/415,145

(22) PCT Filed: Jul. 19, 2013

(86) PCT No.: PCT/EP2013/002149
§ 371 (c)(1),
(2) Date: Jan. 16, 2015

(87) PCT Pub. No.: WO2014/012672
PCT Pub. Date: Jan. 23, 2014

(65) Prior Publication Data
US 2015/0236239 A1   Aug. 20, 2015

(30) Foreign Application Priority Data

Jul. 19, 2012 (DE) .................. 10 2012 014 247
Jul. 20, 2012 (DE) .................. 10 2012 014 442
Nov. 30, 2012 (DE) .................. 10 2012 023 521

(51) Int. Cl.
*H01L 41/047* (2006.01)
*H01L 41/083* (2006.01)

(52) U.S. Cl.
CPC ........ *H01L 41/083* (2013.01); *H01L 41/0471* (2013.01); *H01L 41/0472* (2013.01)

(58) Field of Classification Search
CPC   H01L 41/083; H01L 41/0471; H01L 41/0472
(Continued)

(56) References Cited

U.S. PATENT DOCUMENTS 5,128,694 A   7/1992   Kanayama
5,144,342 A   9/1992   Kubota
(Continued)

FOREIGN PATENT DOCUMENTS

DE   10215992 A1   11/2002
DE   10230117 A1    2/2003
(Continued)

OTHER PUBLICATIONS

Translation of Office Action from JP Patent Office including cover letter, Sep. 7, 2016, eight pages.
(Continued)

*Primary Examiner* — Derek Rosenau
(74) *Attorney, Agent, or Firm* — The Juhasz Law Firm

(57) ABSTRACT

Actuator device has a main body with base and superstructure bodies, the device having a plurality of actuators formed from a piezoelectric or electrostrictive material and each extend from the base body and form the superstructure body. The actuators each have at least two inner actuating electrodes of which at least one first inner actuating electrode extends, in a positive depthwise direction from the front side up to a distance from the rear side, and of which at least one second inner actuating electrode extends in a negative depthwise direction from the rear side up to a distance from the front side. At least one first inner actuating electrode of each actuator is provided for electrical connection to a first connection pole of an actuating device, a rear-side layer which is formed from electrically conductive material arranged on the rear side of the actuator device.

13 Claims, 49 Drawing Sheets

(58) Field of Classification Search
USPC .................................. 310/322, 328, 334, 335
See application file for complete search history.

(56) References Cited

U.S. PATENT DOCUMENTS

| | | | |
|---|---|---|---|
| 5,402,159 A | 3/1995 | Takahashi et al. | |
| 5,945,773 A * | 8/1999 | Nagashima | B41J 2/14274 310/328 |
| 6,140,749 A | 10/2000 | Nakatani | |
| 7,068,473 B2 | 6/2006 | O'Neill | |
| 7,414,353 B2 | 8/2008 | Hida et al. | |
| 7,677,708 B2 | 3/2010 | Kitamura et al. | |
| 2004/0227432 A1 | 11/2004 | Takahashi et al. | |
| 2005/0017601 A1* | 1/2005 | Hiyoshi | B41J 2/04541 310/328 |
| 2005/0151447 A1 | 7/2005 | Hida et al. | |
| 2010/0245490 A1 | 9/2010 | Tsukamura et al. | |

FOREIGN PATENT DOCUMENTS

| | | |
|---|---|---|
| DE | 10231929 A1 | 3/2003 |
| GB | 2379794 A | 3/2003 |
| JP | H11320881 A | 11/1999 |
| JP | 20060245026 A | 9/2006 |
| JP | 2010062196 A | 3/2010 |
| WO | 9600151 A1 | 1/1996 |

OTHER PUBLICATIONS

International Search Report, PCT/EP2013/002149, Nov. 22, 2013, 2 pages (English translation, submitted with application as filed).
Office Action for DE 102012023521.6, May 23, 2013, listing 4 US patent documents listed herein and one DE patent document, 6 pages.
International Preliminary Report on Patentability, PCT/EP2013/002149, Nov. 22, 2013, 6 pages (English translation).

* cited by examiner

ACTUATOR DEVICE

RELATED APPLICATIONS

This application claims priority under 35 U.S.C. §371(c) to PCT Application PCT/EP2013/002149, filed on Jul. 19, 2013, in the EPO; PCT/EP2013/002149 claims priority to German patent application DE 10 2012 014 247.1, which was filed on Jul. 19, 2012; PCT/EP2013/002149 also claims the benefit of German patent application DE 10 2012 014 442.3, which was filed on Jul. 20, 2012, and German patent application DE 10 2012 023 521.6, which was filed on Nov. 30, 2012. These applications are hereby incorporated by reference in their entirety.

BACKGROUND

The disclosure relates to an actuator device. From U.S. Pat. No. 5,144,342 A, U.S. Pat. Appl. Publ. 2010/0245490 A1 and U.S. Pat. Appl. Publ. 2004/0227432 A1, respectively, an actuator device is known with actuators formed from a piezoelectric material. This disclosure provides an actuator device with actuators formed from a piezoelectric material, which with different manufacturing methods is able to be produced in a simple and effective manner and ensures a high manufacturing quality and functional reliability.

This problem is solved by the features of the claims appended below.

SUMMARY OF THE DISCLOSURE

According to the present disclosure, there is provided in particular: an actuator device with a main body which has a base body and a superstructure body, and the main body extends in a longitudinal direction X, a depthwise direction Z running transversely to the longitudinal direction X and a thickness direction Y directed transversely to the longitudinal direction X and transversely to the depthwise direction Z, and which has a front side, a rear side situated opposed to the front side in relation to a longitudinal direction X of the actuator device, and two face sides situated opposed to one another and each situated between the front side and the rear side.

In this embodiment, the actuator device includes a plurality of actuators which are each formed from a piezoelectric or electrostrictive material and each extend in the thickness direction Y from the base body and form the superstructure body, and the actuators are arranged one behind the other in the longitudinal direction X of the actuator device, such that between respectively two adjacent actuators a recess is formed, wherein the actuators each have at least two inner actuating electrodes, of which at least one first inner actuating electrode extends in a positive depthwise direction Z from the front side up to a distance from the rear side, and of which at least one second inner actuating electrode extends in a negative depthwise direction Z from the rear side up to a distance from the front side.

In this embodiment, the at least one first inner actuating electrode of each actuator is provided for electrical connection to a first connection pole of an actuating device, including i. a rear-side layer, which is formed from electrically conductive material, is arranged on the rear side of the actuator device and is connected electrically to the at least one second inner actuating electrode of the actuators; ii. an outer return connecting layer, which is arranged on a return body of the main body and is connected electrically to the rear-side layer; and an outer return connection coating on the front side of the actuator device for electrical connection to a second connection pole of the actuating device, wherein the outer return connection coating is connected electrically to the outer return connecting layer.

In this embodiment, the base material of all or of a plurality of actuators can consist respectively of a piezoelectric or electrostrictive material, i.e. is formed exclusively of piezoelectric or electrostrictive material. Base material is understood here as the material of the actuator without its electrodes. With the actuator device according to the disclosure it is possible to contact both the at least one first inner actuating electrode and the at least one second inner actuating electrode from the front side of the actuator device, wherein the actuator device according to the disclosure permits a very effective return of electrical power from the front side to the rear side.

According to an embodiment of the actuator device according to the disclosure, provision is made that the actuator device has an actuator connection coating which is electrically connected to the respective first inner actuating electrode E1, E3 of the actuators of the plurality of actuators and to which respectively a first electrical pole of a plurality of electrical poles of the actuating device is able to be connected for the independent activation of the individual actuators.

According to an embodiment of the actuator device according to the disclosure, provision is made that in the return body inner return electrodes are arranged, of which at least one first inner return electrode RE1, RE3 extends in a positive depthwise direction Z from the front side up to a distance from the rear side and of which at least one second inner return electrode RE2, RE4 extends in the negative depthwise direction Z from the rear side up to a distance from the front side.

According to an embodiment of the actuator device according to the disclosure, provision is made that the rear-side layer in the region of the base body of the main body has a greater thickness in the depthwise direction Z than in the region of the superstructure body, i.e. in the region which the actuators form on the rear side of the actuator device.

According to an embodiment of the actuator device according to the disclosure, provision is made that the main body, with the base body and the superstructure body which comprises actuator bodies forming the actuators, forms a monolithic body.

According to an embodiment of the actuator device according to the disclosure, provision is made that the base body and the superstructure body of the main body is respectively formed as a distinct partial body.

According to an embodiment of the actuator device according to the disclosure, provision is made that the base body and the superstructure body are glued to one another.

According to an embodiment of the actuator device according to the disclosure, provision is made that the rear-side layer and the return connecting layer together form a one-piece layer.

According to an embodiment of the actuator device according to the disclosure, provision is made that the actuator device has a base body, from which actuator bodies or respectively the actuators extend, and the thus extending actuator bodies or respectively actuators form the superstructure body.

Provision can be made here in particular that in the base body at least one preferably plate-shaped shrinkage adaptation electrode is situated, wherein at least one shrinkage adaptation electrode is situated in the base body such that a marginal section thereof lies in each of two return section surfaces, in order to balance out a local shrinkage behavior of the base body during the production thereof.

In these embodiments provision can be made in particular that a shrinkage adaptation electrode lying against the return section surface, viewed in the depthwise direction, extends from the rear side into the region of a return connection piece. Furthermore, in these embodiments provision can be made in particular that the return section surface has a face-side layer section with a corresponding coating.

Generally herein the term "surface pointing in a direction" such as e.g. "surface pointing in the X direction" is understood to mean that the surface normal of the respective surface points in the said direction, such as e.g. the X direction or runs at an acute angle thereto. "Coating" is generally understood herein—in so far as no other statement is made—that this concerns a coating with an electrically conductive layer.

BRIEF DESCRIPTION OF THE DRAWINGS

Embodiments of the disclosure are described below by means of the enclosed figures, which show.

DETAILED DESCRIPTION

The actuator device AV according to the disclosure has a plurality of actuators, of which, for better illustration in the figures, generally only three actuators 11, 12, 13 are shown and described accordingly. It is conceivable that the actuator device AV according to the disclosure has a plurality of actuators, e.g. in a number between 100 and 500. Alongside this, it is conceivable that the actuator device according to the disclosure only has two actuators. The material of the actuators 11, 12, 13 is formed, apart from the electrodes, from a piezoelectric or electrostrictive material or consists of a piezoelectric or electrostrictive material. The actuators 11, 12, 13 can be actuated individually electrically by means of an electrical actuating device, not illustrated in the figures, which are connected electrically with electrodes of the actuators 11, 12, 13. To describe the actuator device AV according to the disclosure, in the figures an orthogonal coordinate system is entered with an X direction, which is directed in the longitudinal section L of the actuator device AV according to the disclosure, viewed in which the actuators 11, 12, 13 are arranged adjacent to one another. The Y direction designates a thickness direction or vertical direction of the actuator device AV according to the disclosure and the Z direction a depthwise direction or width direction of the actuator device AV according to the disclosure.

Figure 15:
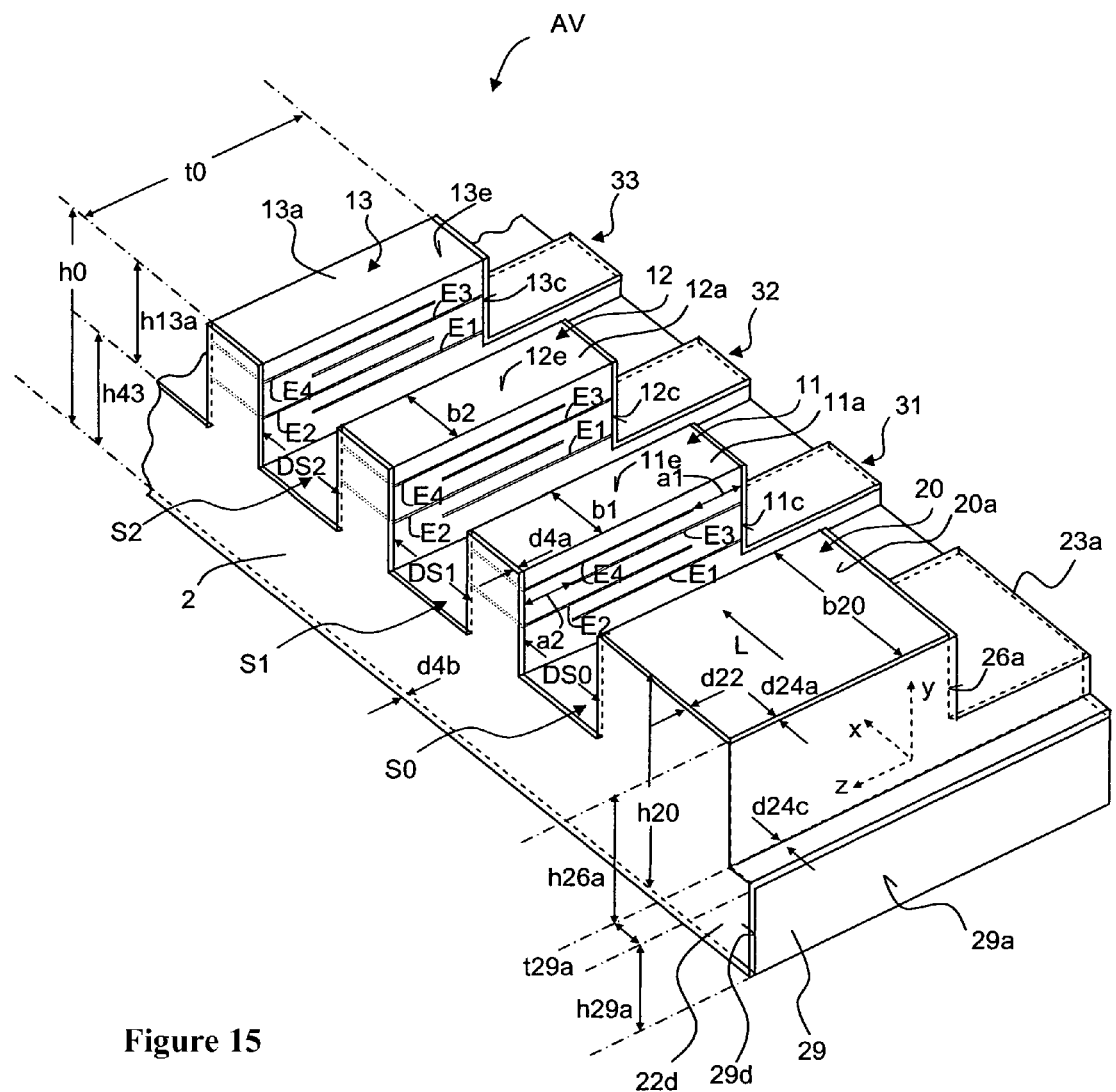
FIG. 15 is a perspective illustration of a part of a further embodiment thereof based on the embodiment of the actuator device according to the disclosure according to FIG. 12 in the manner of illustration of FIG. 12, wherein the main body end piece is coated on the rear side.
Figure 15A:
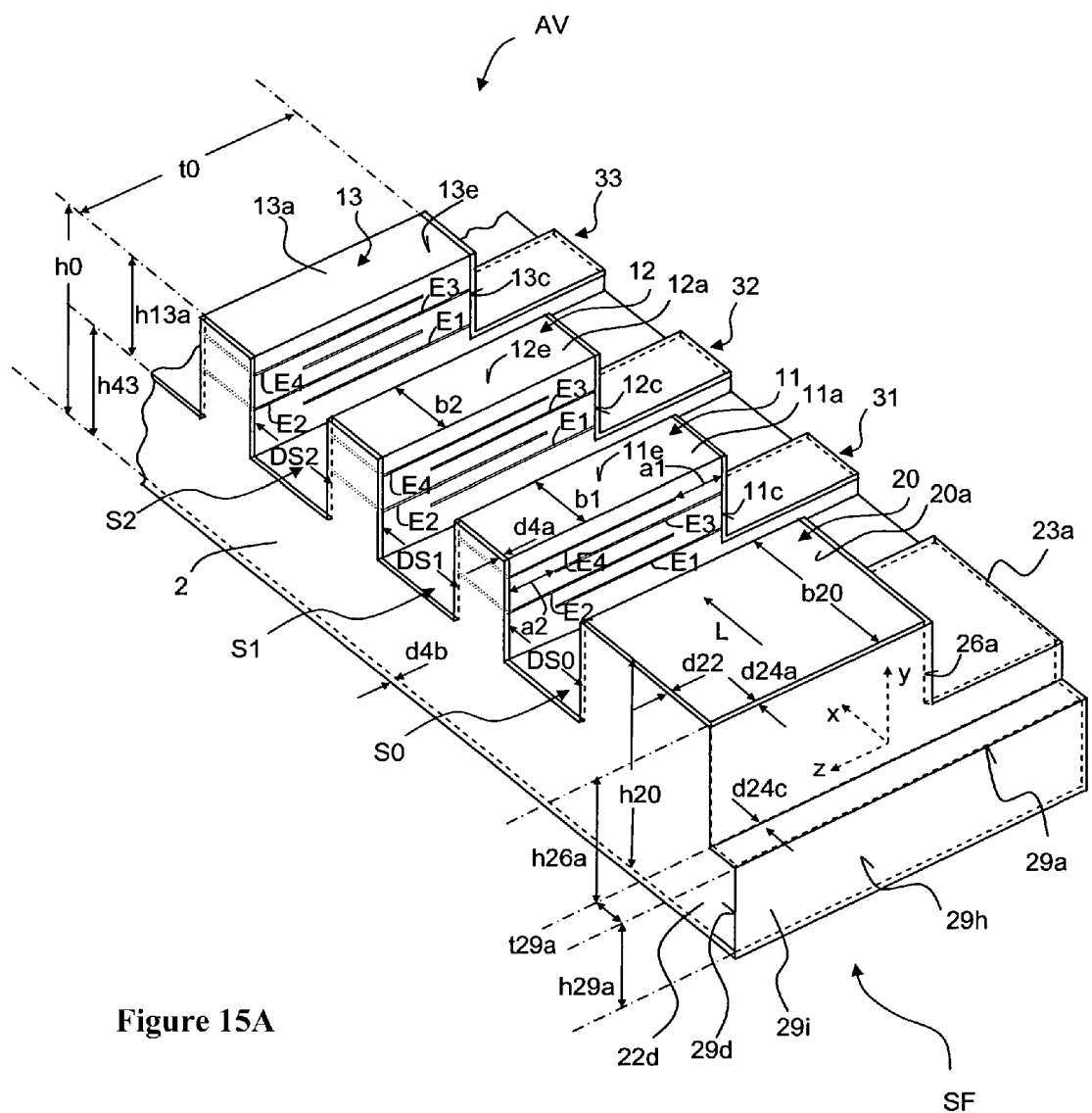
FIG. 15A is a perspective illustration of a part of an embodiment of the actuator device, which is based on the embodiment of FIG. 15 and, compared with the latter, has a further coating on the front side.

The actuator device AV generally has an actuator device main body 10, or abbreviated as main body 10, comprising a base body 10a and a superstructure body 10b, wherein the superstructure body 10b has actuators 11, 12, 13 with respectively an actuator connection coating 31a, 32a, 33a, and a return body 21 with a return connecting layer 5. In the embodiment of FIG. 15, the surface 29a is uncoated. In this embodiment, in addition the surface 29a can be coated, as is illustrated in FIGS. 15A and 16A: here, the surface 29a is coated with the layer 29h, the surface 29i of which is part of the face side SL.

In the actuator device AV according to the disclosure, the actuators 11, 12, 13 can expand in the thickness direction Y or contract owing to an actuation by the electrical actuating device, i.e. by being acted upon with an electrical voltage. In this way, these can act for example on parts or partial regions of an application component which are to be moved or which are changeable in shape.

The actuator device AV according to the disclosure can be embodied for example as a piezo motor. Alongside this, the actuator device AV according to the disclosure can be embodied as an ultrasound transducer, in particular as an ultrasound array or linear array. Furthermore, in one case of application of the disclosure an application component can be a container device of a printing means delivery device of a printer and in particular of an ink jet printer with a plurality of individual partial containers which are changeable in shape, so that through a change in shape of a partial container, caused in such a way by the actuators provided according to the disclosure, printing means contained therein, such as in the example of the ink jet printer, ink can be displaced through a nozzle thereof. Another application component can be an injection device of an engine and the partial containers can be containers to receive and inject fuel, which is brought about by the actuating of actuators provided according to the disclosure and lying against the partial containers.

The previously described applications use the so-called inverse piezoelectric effect, in which by applying an electrical voltage a deformation of the actuator or actuator part is brought about. However, it is likewise conceivable that with the actuator device according to the disclosure the piezoelectric effect is used, for example in the form of a sensor. When using a plurality of actuators, for example a sensor for position detecting is conceivable.

The actuator device AV has, furthermore: a front side 1, a rear side 2 situated opposed to the front side 1 in relation to a longitudinal direction X of the actuator device AV, an underside SL pointing in the negative Y direction and an upper side SU pointing in the positive Y direction. The front side 1, viewed in longitudinal direction X and in relation to the site of the actuators 11, 12, 13, is arranged on a side which is situated opposed to the rear side 2. Therefore, the front side 1 is arranged on the other side of the rear side 2 in relation to the actuators 11, 12, 13. The rear side 2 of the main body 10 is formed from a surface 2a, which constitutes a uniform and in particular flat surface. "Uniform" in this context is understood to mean that the surface extends along the X direction.

In particular, provision can be made here that the surface 2a has a uniform curvature over its extent, i.e. does not have a turning point. The main body 10 has a base body 10a and a superstructure body 10b with actuator bodies 11a, 12a, 13a extending in the thickness direction Y out from the base body 10a, from which actuator bodies the actuators 11, 12, 13 are formed. The actuator bodies 11a, 12a, 13a are formed from a piezoelectric or electrostrictive material and for example from PZT, and at least in some thereof actuating electrodes are arranged, which are able to be actuated by an actuating device.

The respective actuator bodies 11a, 12a, 13a with the actuating electrodes arranged respectively therein form respectively an actuator 11, 12, 13. Each actuator body 11a, 12a, 13a has an upper surface 11e or respectively 12e or respectively 13e, which are therefore a part of the upper side SU. The widths b extending in the X direction and the lengths or depths t0, extending in the Z direction, of the actuator bodies 11a, 12a, 13a of the actuator device AV according to the disclosure can, in particular, be of equal size.

In the illustrated embodiments of the actuator device AV according to the disclosure, the actuators 11, 12, 13 are arranged adjacent to one another or respectively in X direction one behind the other such that between respectively two actuators—for example between the actuators 11, 12, 13—a recess S1, S2 with the width DS1 or respectively DS2 extending in the X direction and the surfaces 41, 42 pointing in the Y direction is formed. The recesses S1 and S2 are therefore defined by the surface 41 or respectively 42 and the sides AS1, AS2, facing one another, of respectively adjacent actuators 11 and 12 or respectively 12 and 13. The width (e.g. DS1, DS2) extending in the X direction between actuators situated adjacent to one another in the X direction (e.g. actuators 11 and 12) can be, in particular, of equal size. Alternatively, different widths can also be provided. Also, between the actuator 11 and the return body 21a recess S0 with the width DS0 running in the X direction, with a surface 40 pointing in the Y direction is arranged. In particular, provision can be made that the widths DS1, DS2 between respectively two actuators, situated adjacent to one another in the X direction, with the width DS0 between the return body 21 and the adjacent actuator 11 coincide.

Figure 1:
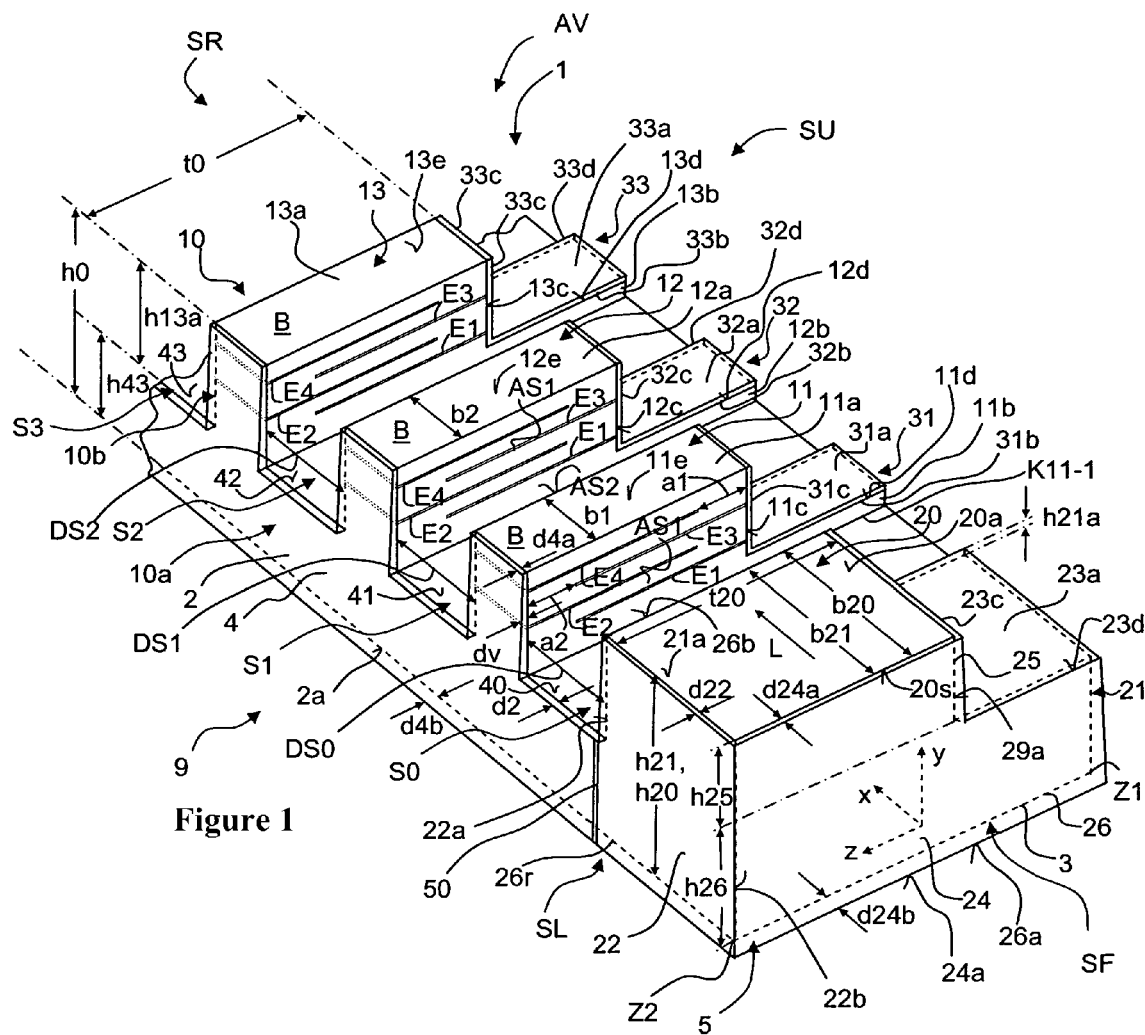
FIG. 1 is a perspective illustration of a part of a first embodiment of the actuator device according to the disclosure as a view with a viewing direction onto a rear side thereof, wherein the actuator device generally has a main body, comprising a base body and a superstructure body with actuator bodies or respectively actuators, which each have an actuator connection coating, and a return body with a return body connection coating.

The section of the main body 10 which, viewed in the Y direction, extends up to the surfaces 40, 41, 42 of the recesses S0, S1, S2, forms the base body 10a. In FIG. 1, by way of example, the height h43 of the recess S3 is entered. Accordingly, the base body 10a here has the height h43.

Preferably, provision is made that the main body 10 is formed as a block, so that the main body 10 is formed in a homogeneous manner from a base material. Here, also, provision can be made that the outer contour, which is formed from the outer surfaces of the main body 10, has a cuboid shape. The virtual upper side of the main body 10 is partially formed from the surfaces 40, 41, 42 and the virtual connecting surfaces situated between these and connecting these. The virtual connecting surfaces can be defined in particular such that between the surfaces 40, 41, 42 they have as small a curvature as possible, viewed over the entire respective connecting surface. The actuators 11, 12, 13 are preferably connected in one piece with the main body 10, so that in their respective connecting region to the main body 10 these are connected in a planar and secure manner therewith, so that neither the actuator 11, 12, 13 as a whole, nor a partial section of the respective actuator 11, 12, 13 has a degree of freedom with respect to the main body 10.

The actuator body 11a, 12a, 13a of the main body 10 or respectively of the superstructure body 10b extend from the base body 10a in the Y direction in a height which is in particular identical in size for the actuator bodies 11a, 12a, 13a of the actuator device AV according to this disclosure. In FIG. 1 by way of example the height h13a of the actuator body 13a is entered.

The actuators 11, 12, 13 have respectively at least two inner actuating electrodes, which are arranged in a plurality of the actuators and of which at least one first inner actuating electrode E1, E3 extends from the front side 1 up to a distance a2 to the rear side 2 of the actuator device AV and of which at least one second inner actuating electrode E2, E4 extends from the rear side 2 up to a distance a1 to the front side 1. With electrical activation of the at least one first inner actuating electrode E1, E3 and the at least one second inner actuating electrode E2, E4 with an electrical poling opposed to one another through an actuating device connected to the actuating electrodes, an expansion or a contraction is brought about of the piezoelectric or electrostrictive material arranged between the two electrodes and therefore of the actuator in the Y direction, in which these are situated.

The surface of an embodiment of the actuator device AV according to the disclosure, which points in the Y direction, can be provided in the region of the actuators 11, 12, 13 with an electrically conducting layer, as is illustrated in FIG. 1. In this embodiment, both the surfaces 11e, 12e, 13e and also the side walls of the actuators 11, 12, 13 pointing in the X direction and the surfaces 41, 42 of the recesses S2, S3 are uncoated.

The actuating device is able to be connected with a first electrical pole to the first electrodes E1, E3 on the front side 1. For this, each actuator 11, 12, 13 which is to be activated can have a direct connection coating or first connection layer or actuator connection coating 31a, 32a, 33a of an electrically conducting and in particular metallic material, which can be in connection electrically with the first inner actuating electrodes E1, E3 and in particular connected directly therewith, and thereby form the first pole or the first poles of the actuator device AV.

The actuator connection coating 31a, 32a, 33a is formed in particular from a layer 31a, 32c, 33c of an electrically conducting and in particular metallic material, which is situated on the side surface or face surface 11c, 12c, 13c of the respective actuator 11, 12, 13 pointing in the negative Z direction. The layer 31c, 32c, 33c is in electrical connection with the first inner actuating electrodes E1, E3 and is, in particular, connected directly therewith In the illustrated embodiments of the actuator device AV, each actuator body 11a, 12a, 13a has a step or a tongue-shaped connection piece extending in the Z direction, or a tongue-shaped extension 11b, 12b, 13b, so that the actuator body 11a, 12a, 13a is formed respectively from an actuator body actuating piece B and a connection piece 11b, 12b, 13b with the depth or length t30 running in the Z direction. The connection pieces 11b, 12b, 13b are coated on their surface pointing in the Y direction respectively with an actuator connection coating 31a, 32a, 33a of an electrically conducting and in particular metallic material. In this embodiment, therefore, the actuator connection coating 31a, 32a, 33a is formed by the partial layer situated on the respective side surface of the actuator body actuating piece B, or actuating piece connection layer 31c, 32c, 33c with the thickness d31c, d32c, d33c and the actuator connection coating, situated on the tongue-shaped extension 31b, 32b, 33b, with the thickness d31b, d32b, d33b. Furthermore, the partial layer 31c, 32c, 33c situated on the side surface 11c, 12c, 13c of the respective actuator 11, 12, 13, pointing in the negative Z direction, is connected with the actuating piece connection layer 31c, 32c, 33c and can be formed in particular in one piece with the actuating piece connection layer 31c, 32c, 33c, in order to form a uniform first connection layer 31a, 32a, 33a. In this way, the respective first pole of the actuating device can be connected to the actuator connection coating 31a, 32a, 33a.

In a further embodiment of the actuator device AV according to the disclosure, this can generally also be embodied such that it has no tongue-shaped connection piece or no tongue-shaped extension 11b, 12b, 13b with a respective actuator connection coating 31a, 32a, 33a, so that the partial layers or actuating piece connection layers 31c, 32c, 33c form the electrical connections for the actuating device or the first pole.

The actuator device AV according to the disclosure has a return partial piece 20 for the formation of a second electrical pole. The return partial piece 20 has the return body 21 and, furthermore, a return section 26 with a return section surface 26a pointing in the negative X direction, and a support section 25 extending therefrom in the Y direction. Viewed in the Y direction, the return section 26 has a height h26, and the support section 25 has a height h25, so that in the embodiment of FIG. 1 the return body 21 has a height h21=h26+h25.

In an embodiment of the actuator device AV according to the disclosure, the actuator bodies 11a, 12a, 13a, viewed in the longitudinal direction or the x direction are situated one behind the other, and the return body 21, viewed in the x direction, is situated behind the row of actuator bodies 11a, 12a, 13a. Here, provision can be made in particular, that the surface 26r of the return body 21 and the surface 2a of the rear side 2 of the main body 10 forms a uniform and in particular flat surface. "Uniform" is understood in this context to mean that the surface extends along the X direction. In particular, provision can be made here that the surface has a uniform curvature over its extent, i.e. has no turning point. The surface region with which the return section 26 occurs on the rear side 2, is given the reference number 26r.

Figure 1A:
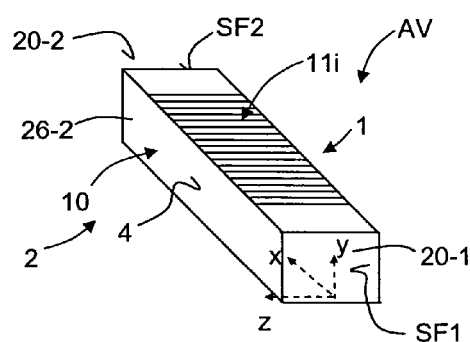
FIG. 1A is a diagrammatic and highly simplified overall illustration of an embodiment of the actuator device according to the disclosure in perspective illustration.

In FIG. 1A, an embodiment of the actuator device AV according to the disclosure is shown which has a return partial piece 20-1, 20-2 respectively on its face sides SF1, SF2 lying opposite, viewed in the X direction. In the further figures, a return partial piece is generally designated by the reference number 20 and its embodiments described herein can be arranged on each of the face sides SF1, SF2. The return partial pieces 20-1 or respectively 20-2 can be configured according to one of the embodiments mentioned herein, and in particular configured identically. In the illustration of FIG. 1A, the actuators are entered diagrammatically as individual lines, which are provided in summary with the reference number 11i.

The X coordinate of the coordinate system used herein can be defined in particular such that the origin of the coordinate system lies in the center point of the edge section, which connects the return section surface 26a and the underside SL with one another. The X coordinate runs here transversely to the longitudinal extent of the actuators 11, 12, 13, which extend from the front side 1 to the rear side 2, and through the center point of an edge section terminating the underside SL in the positive X direction, which edge section in particular can be the edge section which connects with the underside SL a surface which points in opposition to the return section surface 26a in relation to the Y direction and lies against the underside SL. For the definition of the coordinate system, the Z axis runs through the two front i.e. lower corner points Z1, Z2 situated on the return section surface 26a, of the actuator device AV. Here, the point Z1 is defined as intersection point of the underside SL, of the return section surface 26a and of the front side 1, and the point Z2 as intersection point of the underside SL, of the return section surface 26a and of the rear side 2.

With the said edge section or the points Z1, Z2, an idealized edge section or idealized points can be used, if in an embodiment or realization of the actuator device AV according to the disclosure at the locations at which the edge section or the points are assumed, a rounded transition section or respectively a rounded corner is present. In this case, provision is made according to the definition given herein, that the edge section or the points is or respectively are formed for the definition of the position of the coordinate system on the actuator device AV by lengthening the extent of the surfaces or sides respectively used for this, i.e. if applicable of the return section surface 26a, the front side 1, the underside SL, the return section surface 26a or the rear side 2.

Herein, with corresponding rounded surface regions generally for the definition of an edge line or of a point an idealized edge line or respectively an idealized point can be used, which arises or respectively arise from the intersection point of lengthenings of the extent of two respective adjacent surfaces which are running towards one another. Extent can be understood here to mean a length of 1/10 of the length over which the respective surface extends in the direction which is respectively relevant and defines this.

The surface 21a of the return body 21, pointing in the Y direction, is uncoated in the embodiment of FIG. 1, so that the surface 21a of the return body 21 is identical to the surface 21a of the return partial piece 20. Alternatively or additionally to the coating of the return section surface 26a pointing in the negative X direction, generally in the embodiments of the actuator device AV according to the disclosure also the return section surface 26b pointing in the positive X direction and facing the actuator 11 can be coated with an electrically conductive layer.

The return section 26 can have return additional piece or return connection piece 23, which can be embodied in particular as a support section and, viewed in the negative Z direction, is situated in the region of the connection pieces 11b, 12b, 13b. The return connection piece 23 rises, viewed in the Y direction, by the height h23 over the surface 40. In the embodiments of the actuator device AV according to the disclosure, generally provision can be made that the connection piece 23 is coated on its surface 23d pointing in the positive Y direction with an electrically conducting and in particular metallic return connection coating or outer connection layer 23a with the thickness d23a, which forms a second electrical pole for the connection of the actuating device.

The rear side 2 of the main body 10 is coated with a rear-side layer 4 of an electrically conducting and in particular metallic material. The thickness of the rear-side layer 4 can be constant in the X direction and in the Z direction. Also, generally in the embodiments of the actuator device AV according to the disclosure provision can be made that the thickness d4b of the rear side layer 4 in the region of the base body 10a or respectively in the region of the base body 10a which adjoins the underside SL, is greater than the thickness d4a of the rear-side layer 4 in the region of the superstructure body 10b or respectively in the region of the superstructure body 10b which adjoins the upper side SU, wherein in particular provision can be made that the thickness d4b is greater by the factor 1.5 than the thickness d4a.

The rear-side layer 4 is in electrical connection with the second inner actuating electrodes E2, E4 of the actuator device AV and in particular is connected directly therewith. The rear-side layer 4 is connected electrically with a return outer layer 5 and in particular is formed in one piece therewith, wherein the return outer layer 5 in turn can be connected with the return connection coating 23a and in particular can be formed in one piece therewith.

In the embodiment of FIG. 1, the return outer layer 5 is formed from a face-side layer section 24 with a surface 24a, which is connected electrically with a rear-side layer section 22 as section of the rear-side layer 4. The thickness of the face-side layer section 24 can be constant in the Y direction and in the Z direction. Also, generally in the embodiments of the actuator device AV according to the disclosure provision can be made that the thickness d24b on or respectively in the region of the underside is greater than the thickness d24a of the face-side layer section 24 on or respectively in the region of the upper side SU, wherein in particular provision can be made that the thickness d24b is greater by the factor 1.5 than the thickness d24a.

In order to activate the provided actuators 11, 12, 13 or some of the actuators 11, 12, 13 separately, the electrical actuating device can have several first electrical poles and the actuating device can be arranged such that it can generate different control voltages or respectively control currents for each of the first electrical poles, so that in this embodiment the actuating device can actuate the actuators 11, 12, 13 individually or respectively differently. According to a further embodiment, provision can be made that all the actuators 11, 12, 13 or some of the actuators 11, 12, 13 of the actuating device AV are connected respectively to a single first electrical pole, so that these can be actuated in the same manner.

The second pole of the actuating device is likewise able to be connected or respectively is connected on the front side 1 of the actuator device AV and in the embodiment according to FIG. 1 on the return connection coating 23a. For this, the actuator device AV according to the disclosure has an outer connecting layer or return connecting layer 5, which is preferably connected electrically in one piece with the rear-side layer 4. The return body 21 can also consist solely of the return section 26 as component of the base section 10a, so that the latter has no support section 25 placed in the Y direction (FIGS. 19 to 30), so that the return body 21 has a height h21=h26.

Depending on the production method for the production of the main body 10 or of the actuator device AV, the return body 21 can be configured in one piece with an actuator region 9 of the main body 10 and as a whole as a monolithic block. Alternatively to this, according to an alternative production method for the production of the main body 10 or of the actuator device AV with the actuator region 9, the return body 21 can be embodied as a separate piece which is glued on the actuator region 9. For this case, an adhesive layer 50 is entered diagrammatically in the illustration of FIGS. 1 and 2.

Depending on the embodiment of the return body 21, the adhesive layer 50 can also be at another location, and in particular moved in the X direction with respect to the location shown in FIG. 1. Here, the return body 21 can also form a part of the region of the main body 10 extending in the Y direction, in which the recess 40 is situated, so that the adhesive layer 50, viewed in the X direction, is situated in the region of the recess 40. The adhesive layer 50 can also run obliquely and can run here e.g. at an acute angle to the Y axis and along the Z direction.

In the formation of the return body 21 from the return section 26 and the support section 25, provision can be made in particular that the upper side 21a of the return body 21, viewed in the Y direction, lies at the same height as the actuator body surfaces 11e, 12e, 13e of the actuators 11, 12, 13, that therefore h0=h21, so that an application component which is changeable in shape can be applied onto the upper side SU of the actuator device AV according to the disclosure and therefore onto the actuators 11, 12, 13 or the actuator bodies 11a, 12a, 13a and onto the surface 21a. In this embodiment of the actuator device according to the disclosure, the return body 21 with the support section 25 has a supporting function, in addition to the function of the current return over the return connecting layer 5, by the support section 25 receiving and supporting a corresponding section of such an application component. For this case, in particular provision can be made that—as shown in FIG. 1—the upper side 21a thereof is not coated with an electrically conductive material. In the embodiment according to FIG. 1, the return connecting layer 5 is formed from a layer section 22 on the rear side 2 and a layer section 24 on the first face side SF1, which in turn is connected with the return connection coating 23a. These layers are formed from an electrically conductive material. In this way, a particularly effective current flow is ensured with a simple and favorable manner of production of the actuator device AV according to the disclosure.

In the embodiments of the actuator device AV according to the disclosure, provision can generally be made that the return partial piece 20 is formed on the face side SF1 pointing in the negative X direction. On a face side pointing in the positive X direction (not shown) of the actuator device AV according to the disclosure, a return partial piece 20 according to an embodiment thereof described herein can likewise be formed, which can be embodied identically or differently to the return partial piece 20 situated on the opposite face side. Alternatively thereto, an actuator can be situated on the face side (not shown) of the actuator device AV according to the disclosure, pointing in the positive X direction.

Figure 2:
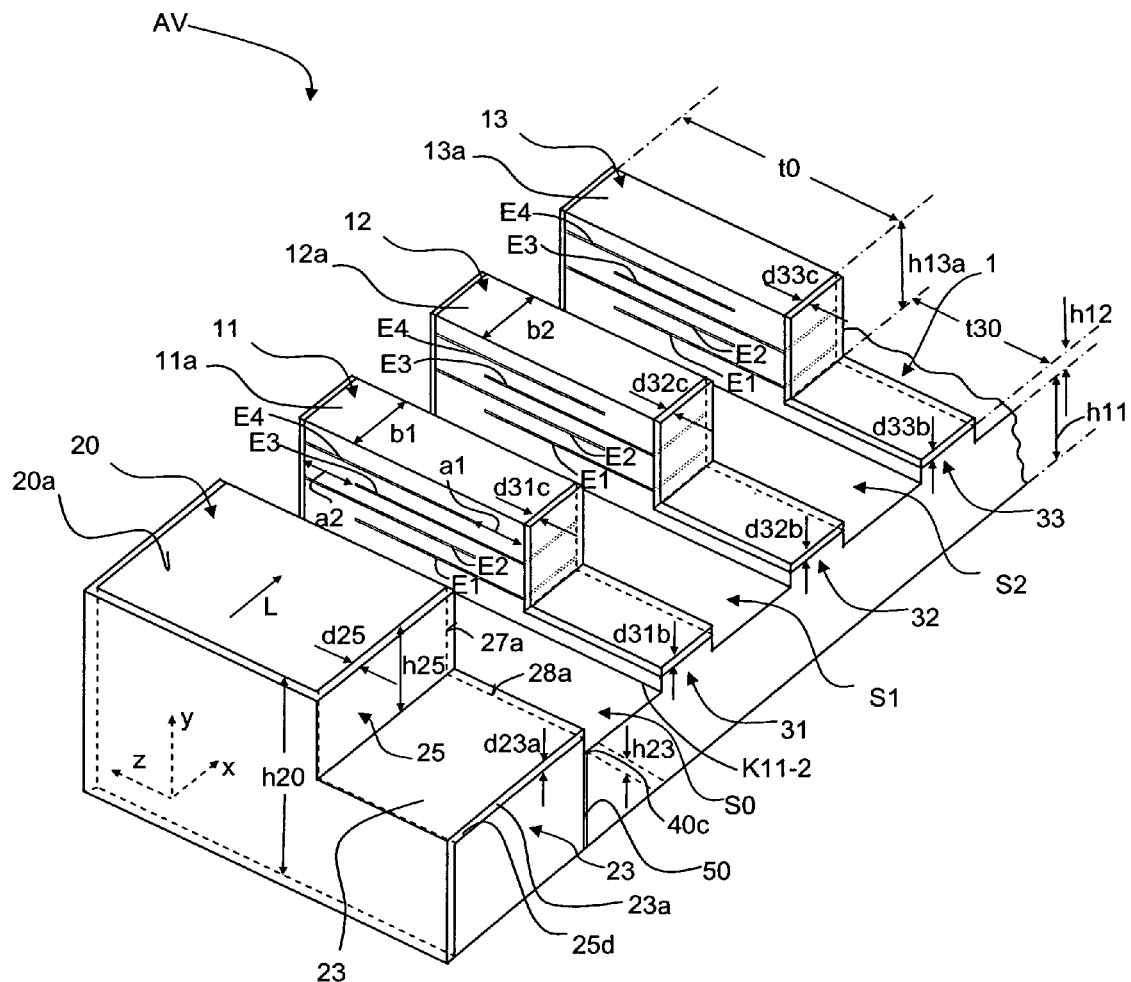
FIG. 2 is a perspective illustration of a part of the first embodiment of the actuator device according to the disclosure in accordance with FIG. 1 as a view with a viewing direction onto a front side thereof, which is situated opposed to the rear side in relation to a longitudinal direction of the actuator device.
Figure 3:
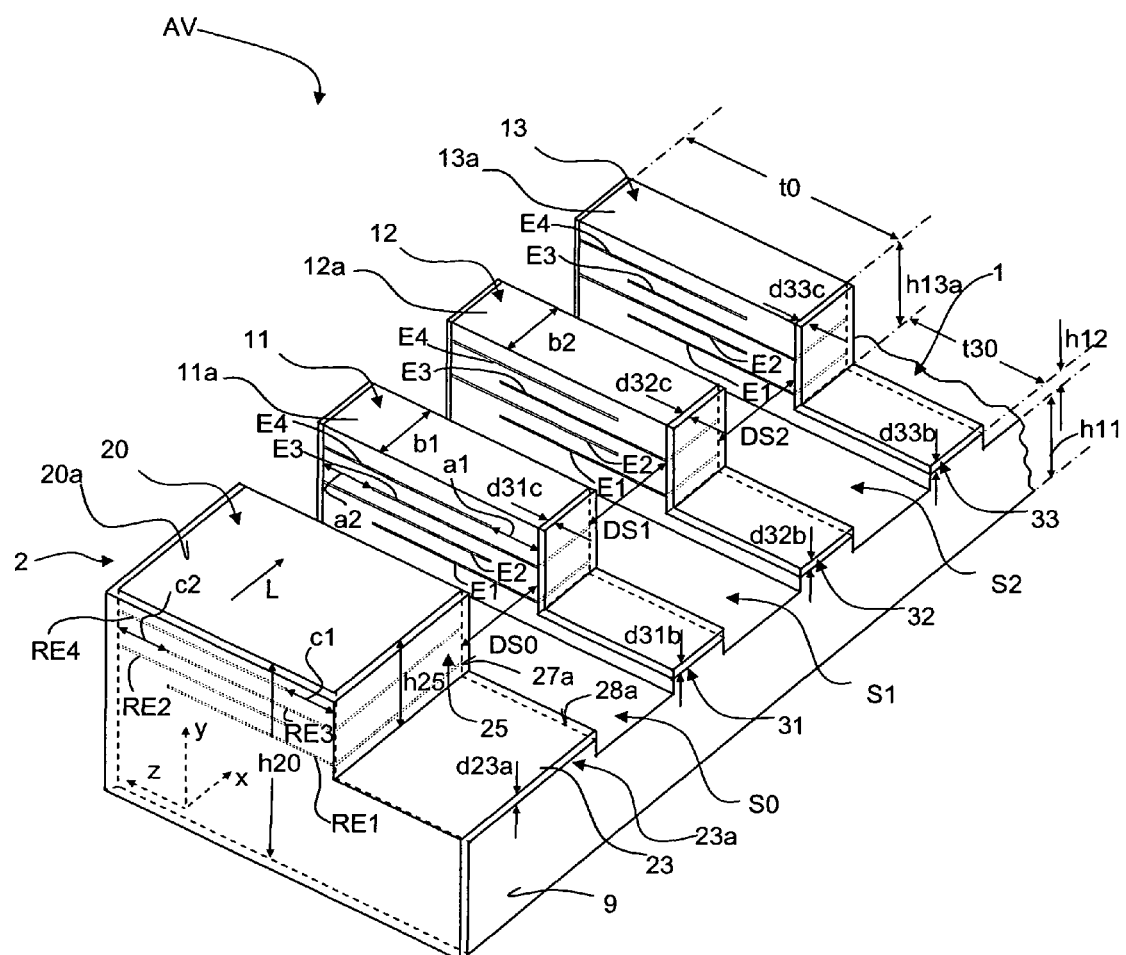
FIG. 3 is a perspective illustration of a part of a further embodiment thereof based on the first embodiment of the actuator device according to the disclosure in the manner of illustration of FIG. 2, wherein in a return partial piece return electrodes are inserted, which originate from the front side or the rear side and only extend up to a distance of the respectively opposed rear side or respectively front side, in which these realize no electrical connection between the rear side and the front side.

FIG. 3 shows a further embodiment of the actuator device AV which, compared with the embodiment shown in FIGS. 1 and 2 has in the return body 21: at least one first inner return electrode RE1, RE3, which extends in the position Z direction from the front side 1 up to a distance c2 to the rear side 2 and at least one second inner return electrode RE2, RE4, which extends in the negative Z direction from the rear side 2 up to a distance c1 to the front side 1. In the embodiments of the actuator device AV according to the disclosure, the return electrodes can generally be provided.

Figure 4:
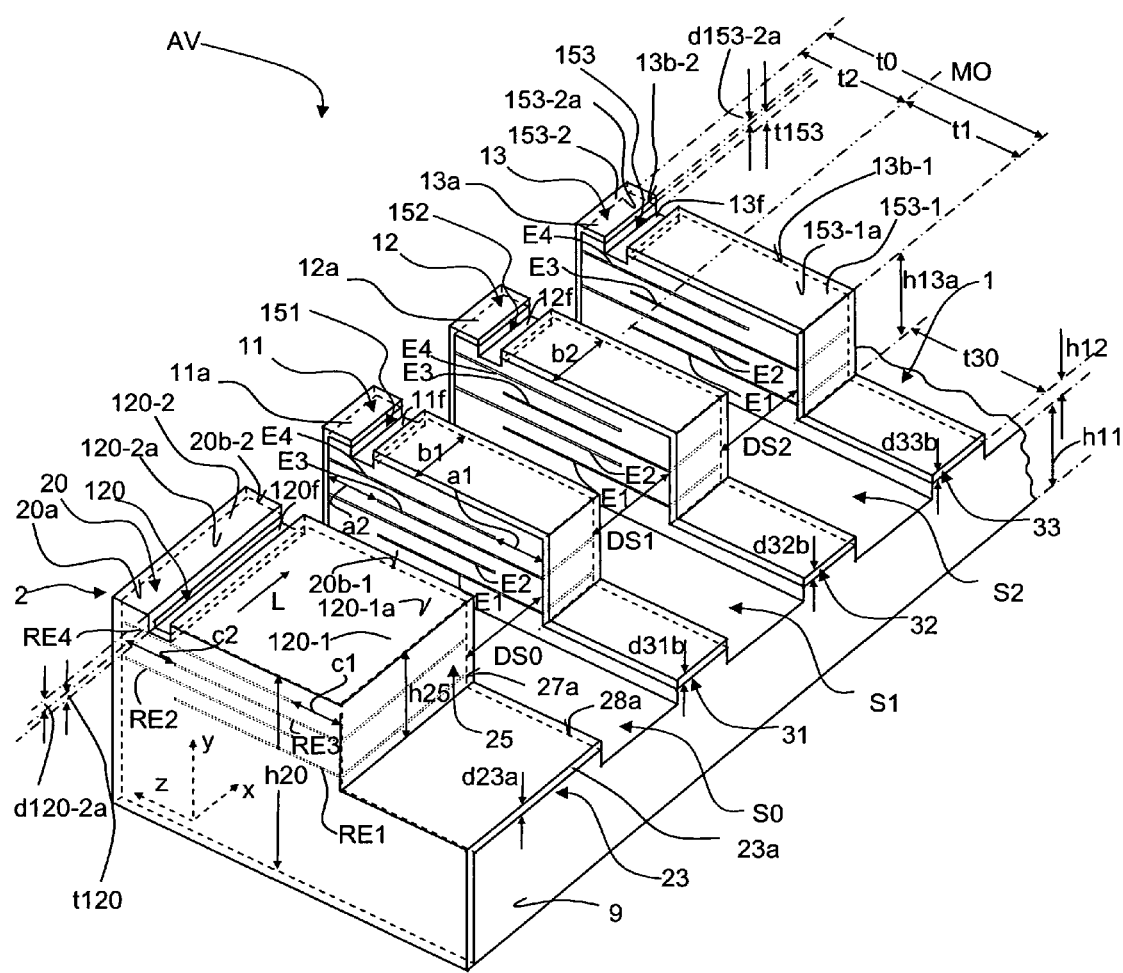
FIG. 4 is a perspective illustration of a part of a further embodiment of the actuator device according to the disclosure as a view with a viewing direction on its front side, wherein the further embodiment of the actuator device, compared with the embodiment according to FIG. 3, has a coating on an upper side thereof, which is divided by an actuator groove in the region of the rear side of the actuator device.

In the embodiment of the actuator device AV according to the disclosure, shown in FIG. 4, a groove 151, 152, 153 running in the Y direction is introduced on the upper side of each actuator body 11a, 12a, 13a. Furthermore, each actuator 11, 12, 13 is coated with an electrically conductive layer, wherein the respective groove 151, 152, 153 is deeper than the thickness of the respective layer, so that each actuator 11, 12, 13 has a layer situated laterally to the groove in the negative Z direction (reference number 153-1 for the actuator 13) and a layer situated laterally to the groove in the negative Z direction (reference number 153-2 for the actuator 13). The two opposite layers respectively in relation to a groove of an actuator 11, 12, 13 are therefore separated electrically. For illustration, in FIG. 4 for the actuator 13 the thickness d153-2a of the layer 153-2 and the depth t153 of the groove 153 is drawn in. The layer situated laterally to the groove in the negative Z direction (reference number 153-1 for the actuator 13) is connected with the actuator connection coating 31a, 32a, 33a and in particular with the actuating piece connection layer 31c, 32c, 33c. Furthermore, the layer situated laterally to the groove in the positive Z direction (reference number 153-2 for the actuator 13) is connected with the rear-side layer 4.

This realization with layers together with a groove on the respective actuator has the advantage that with corresponding actuation for the deflection thereof, also the region situated between the electrode E4 and the upper side of the actuator bodies 11a, 12a, 13a can contribute to the deflection of the respective actuator.

In the embodiment of the actuator device AV according to the disclosure, shown in FIG. 4, optionally provision can be made that a groove 120 running in the Y direction is also introduced on the upper side 21a of the return body 21. Furthermore, the return body 21 is coated with an electrically conductive layer, wherein the groove 120 is deeper than the thickness of the respective layer, so that the return body 21 has a layer situated laterally to the groove in the negative Z direction (reference number 153-1 for the actuator 13) and a layer situated laterally to the groove in the negative Z direction (reference number 153-2 for the actuator 13). The two opposite layers respectively in relation to a groove of a return body 21 are therefore separated electrically. For illustration, in FIG. 4 for the actuator 13 the thickness d153-2a of the layer 153-2 and the depth t153 of the groove 153 is drawn in. The layer situated laterally to the groove in the negative Z direction (reference number 153-1 for the actuator 13) is connected with the actuator connection coating 31a, 32a, 33a and in particular the actuating piece connection layer 31c, 32c, 33c. Furthermore the layer situated laterally to the groove in the positive Z direction (reference number 153-2 for the actuator 13) is connected with the rear-side layer 4.

The grooves of the respective actuator body 11a, 12a, 13a, in relation to a center line MO, which is the center line (t1=t2), running along the X coordinate, of the longitudinal extent of the respective actuator body 11a, 12a, 13a running in the Z direction (in the illustrated embodiments the actuator bodies 11a, 12a, 13a have the same length in the Z direction, so that the center line MO is identical for all actuator bodies 11a, 12a, 13a), are arranged laterally, i.e. either closer to the front side 1 (FIG. 1) or closer to the rear side 2 (FIG. 4). In particular, provision can be made that the center line of the surface 11f, 12f, 13f, pointing in the Y direction, is situated by more than 50% of the amount of t1 or respectively t2 laterally to the center line MO. Depending on whether the respective groove of an actuator 11, 12, 13 is situated closer to the front side 1 or closer to the rear side 2, a specific effect is produced for the deformation of the respective actuators 11, 12, 13.

Figure 5:
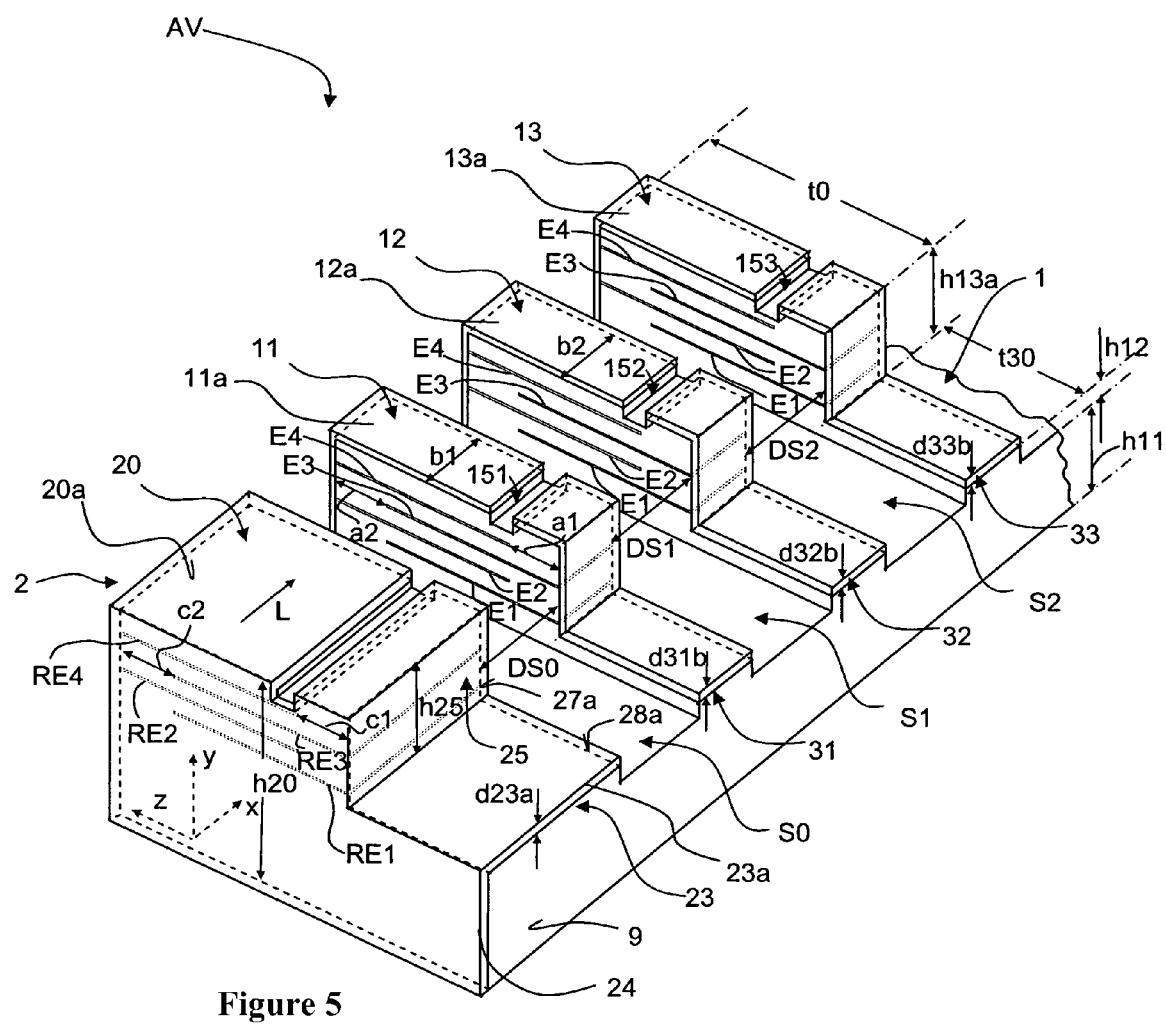
FIG. 5 is a perspective illustration of a part of a further embodiment of the actuator device according to the disclosure as a view with a viewing direction on its front side, wherein the actuator device has a coating on an upper side thereof which, compared with the embodiment of FIG. 4, is divided by an actuator groove in the region of the front side of the actuator device.

The features, described by means of FIGS. 4 and 5, with the grooves on the upper side SU of the actuators 11, 12, 13 and optionally on the upper side 21a of the return body 21, can also be provided according to the disclosure in combination with other embodiments of the disclosure described and in particular shown herein.

With the position of the groove in embodiments of the actuator device AV according to FIG. 5, no additional activation of the actuator body layer exists between the layer 151-1a, 152-1a, 153-1a and the inner electrode situated respectively closest thereto (reference number E4), when the respectively nearest inner electrode (reference number E4) is connected at the rear-side layer 4 and the respective layer 151-1a, 152-1a, 153-1a extends at a smaller distance than a1 from the respective layer 31c, 32c, 33c and therefore the respective layer 151-1a, 152-1a, 153-1a does not overlap the nearest inner electrode (reference number E4), so that no overlapping region of the electrode E4 and of the respective layer 151-1a, 152-1a, 153-1a is produced with opposed polings of the respective layer 151-1a, 152-1a, 153-1a with respect to the inner electrode (reference number E4) respectively nearest thereto.

Between the layer 151-1a, 152-1a, 153-1a and the inner electrode respectively nearest thereto (reference number E4), an additional activation of the actuator body layer then exists when the respectively nearest inner electrode (reference number E4) is connected on the rear-side layer 4 and the respective layer 151-1a, 152-1a, 153-1a, viewed from the respective layer 31c, 32c, 33c, overlaps the nearest inner electrode (reference number E4), because in the thereby resulting overlapping region an opposed poling is produced with respect to the respective layer 151-1a, 152-1a, 153-1a and the respectively nearest inner electrode (reference number E4) thereto.

Figure 6:
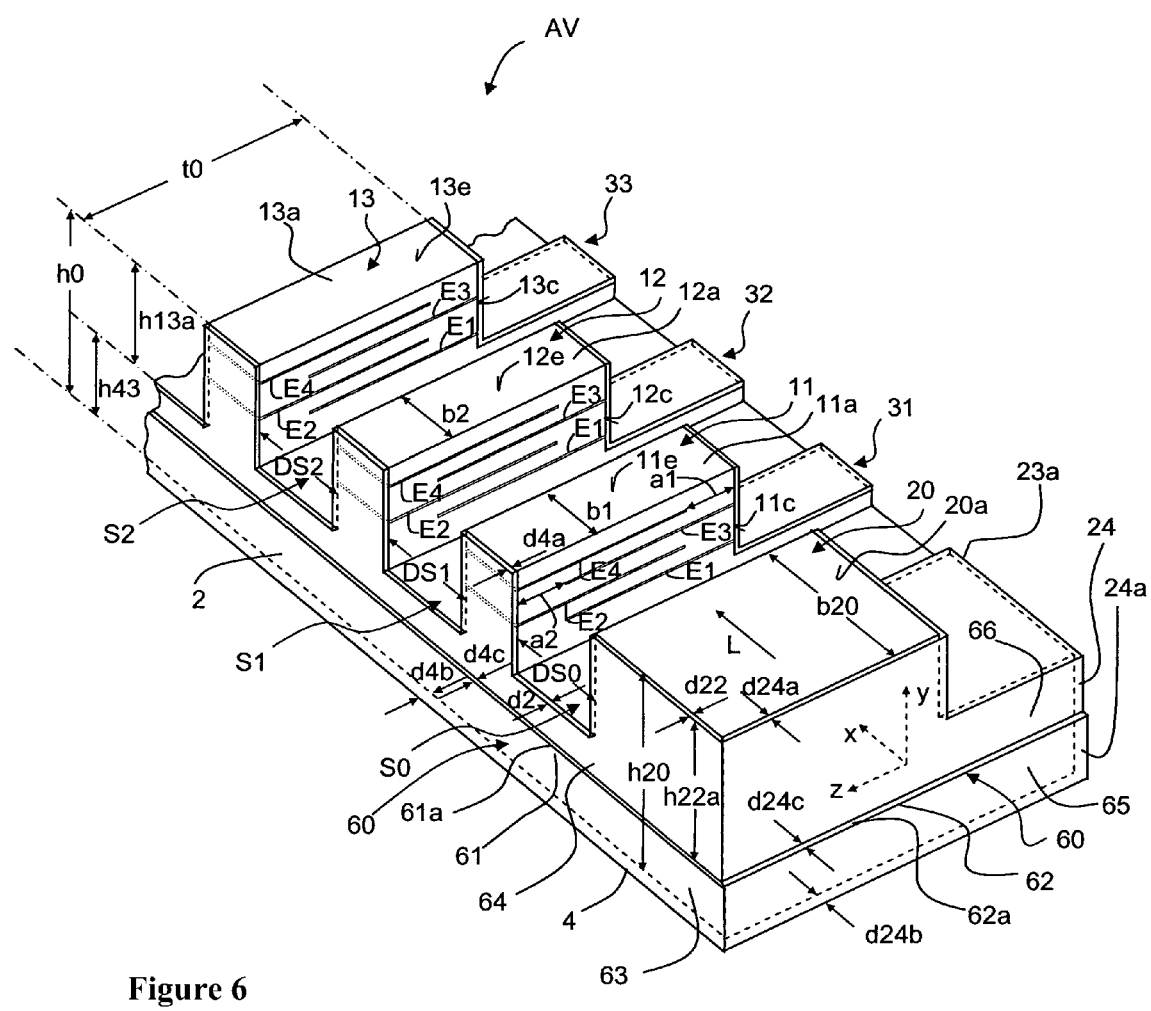
FIG. 6 is a perspective illustration of a part of a second embodiment of the actuator device according to the disclosure as a view with a viewing direction onto the rear side thereof, wherein the embodiment of the actuator device has a coating on the rear side and on the face sides, which has a greater thickness in a lower region which is adjacent to the underside SL.

FIG. 6 shows a perspective illustration of a part of a further embodiment of the actuator device AV according to the disclosure. In this embodiment, a step-like increase in thickness 60, with respect to the negative Y direction, of the rear-side layer 4 on the rear side 2 and of the return body side layer 24 on the face side SF is provided. The step on the rear side 2 is designated by the reference number 61 and the step on the face side SF is designated by the reference number 62. The step flank 61a or respectively 62a can also run obliquely here to the XZ plane. In this context, step 60 is understood to mean a thickness reduction by a difference d4c or respectively d24c, which occurs in a section running in Y direction, which is less in amount than the amount of d4c or respectively d24c. In the illustrated embodiment, a marginal section, adjoining the underside SL, of the height h60 is embodied thicker than a region, situated in the region above thereof, viewed in the Y direction, of the rear-side layer 4 on the rear side 2 and the face-side layer section 24.

Through the change in thickness, the electric power which can be directed through the rear-side layer 4 on the rear side 2 or respectively the face-side layer section or the return body side layer 24, can be set in a simple manner and adapted to the requirements for the respective actuator device AV. A further advantage is that in a specific realization of the return body side layer or of the face-side layer section 24 or respectively of the rear-side layer 4, through the provision of a correspondingly large thickness d24c or respectively d4c in the lower region of the return body side layer 24 or respectively of the rear-side layer 4, the actuator device AV can be embodied without inner return electrodes (e.g. RE1, RE2, RE3, RE4) in the return body 21.

According to a variant of this embodiment of the actuator device AV, the change in thickness can only be formed on the return body side layer or the face-side layer section 24 and not on the rear-side layer 4. Generally, provision can be made here that the average thickness (e.g. d4b or respectively D24b) of the return body side layer 24 or respectively rear-side layer 4 in the lower region, which results respectively over the extent of the return body side layer 24 or respectively of the rear-side layer 4 in Y direction, is greater by the factor 1.5 than the average thickness (e.g. d4b or respectively d24b) of the return body side layer 24 or respectively of the rear-side layer 4 in the region above the step 61 or respectively 62, which is produced respectively over the extent of the return body side layer 24 or respectively of the rear-side layer 4 in the Y direction.

Figure 7:
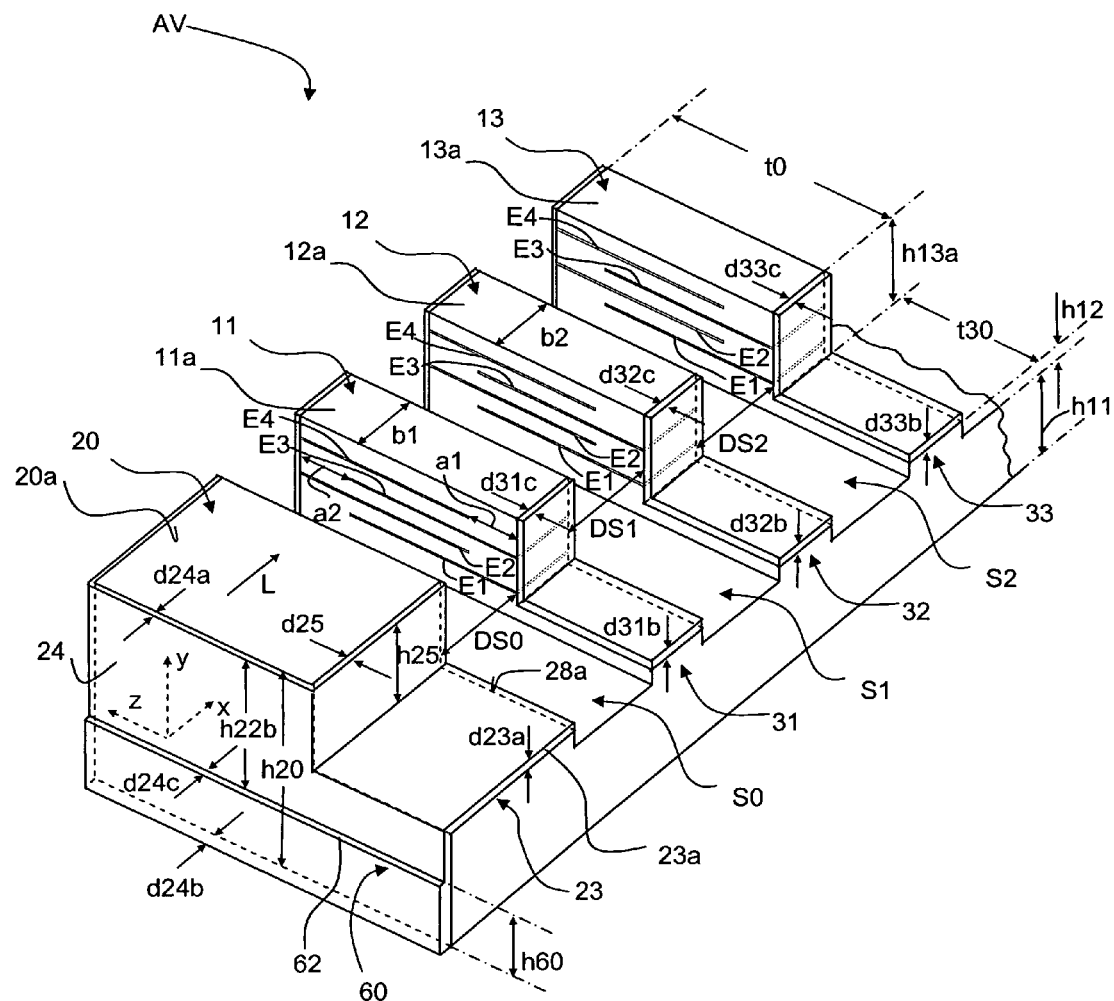
FIG. 7 is a perspective illustration of a part of the embodiment shown in FIG. 5 of the actuator device according to the disclosure as a view with a viewing direction onto the front side thereof.
Figure 8:
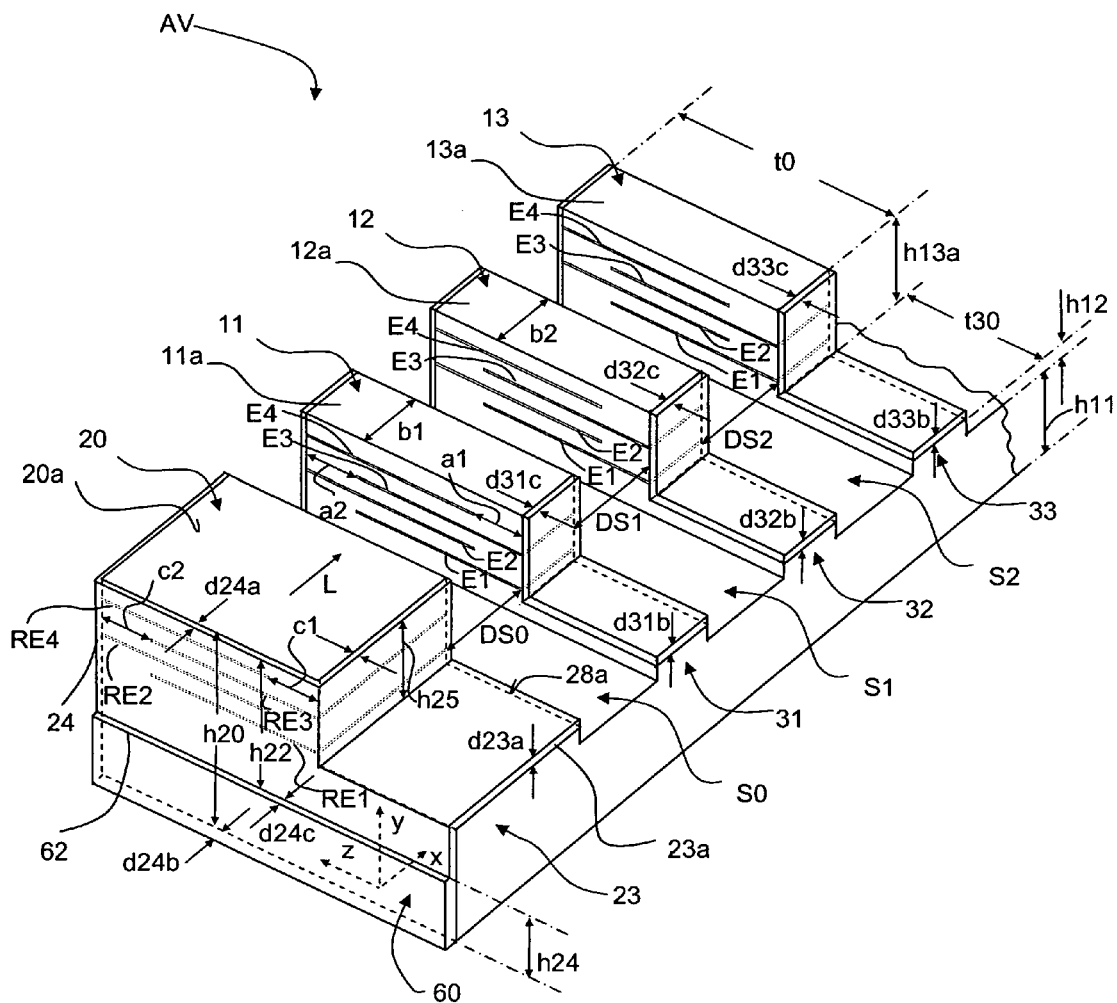
FIG. 8 is a perspective illustration of a part of a further embodiment thereof based on the embodiment of the actuator device according to the disclosure in accordance with FIG. 5 in the manner of illustration of FIG. 7, wherein in the return partial piece return electrodes are inserted, which originate from the front side or the rear side and extend only up to a distance of the respectively opposed rear side or respectively front side, in which these realize no electrical connection between the rear side and the front side.

FIG. 8 shows a further embodiment of the actuator device AV according to the disclosure which, compared with the embodiment shown in FIGS. 6 and 7, has in the return body 21: at least one first inner return electrode RE1, RE3, which extends in the positive Z direction from the front side 1 up to a distance c2 to the rear side 2 and at least one second inner return electrode RE2, RE4, which extends in the negative Z direction from the rear side 2 up to a distance c1 to the front side 1.

Figure 9:
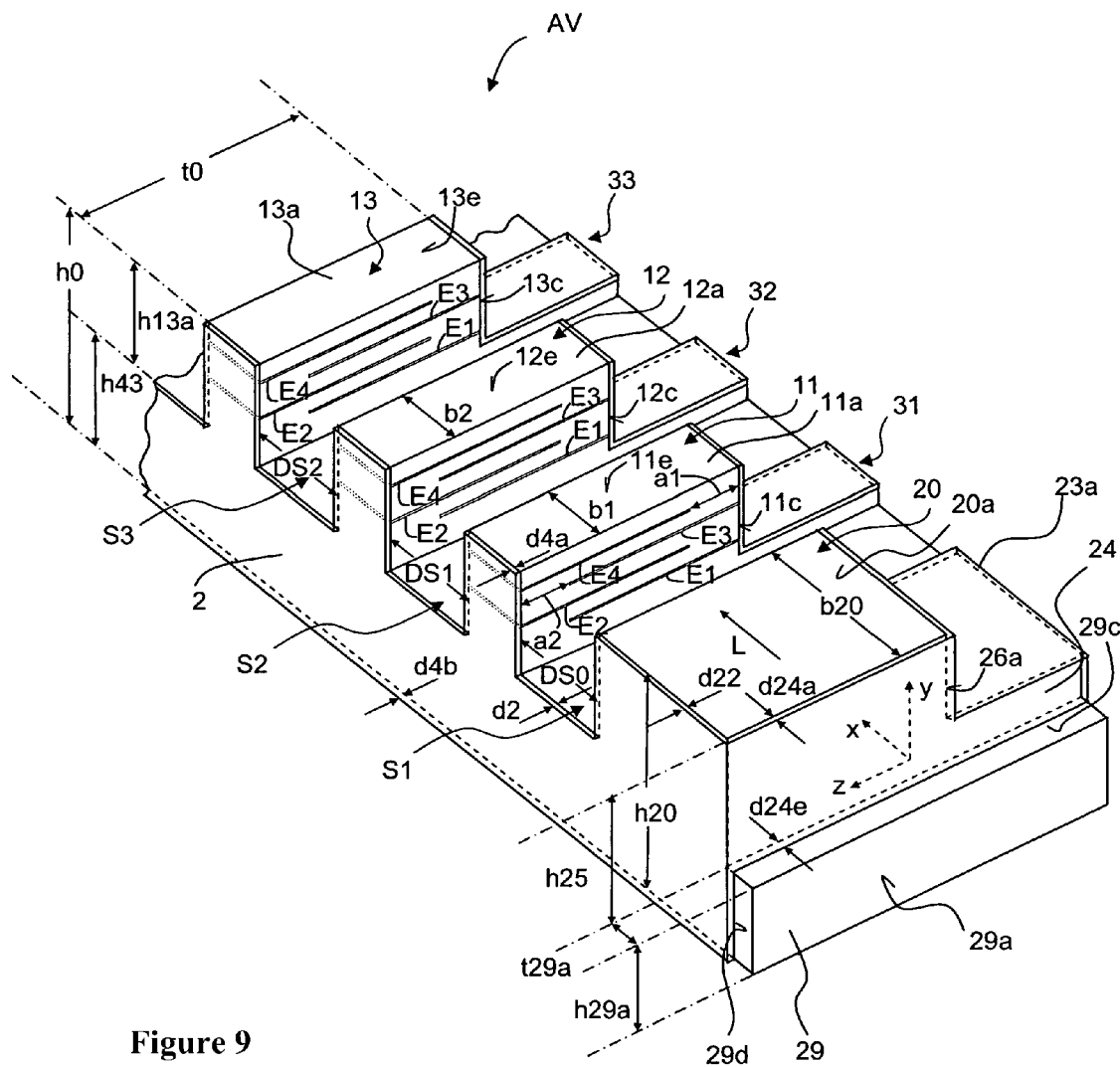
FIG. 9 is a perspective illustration of a part of a further embodiment of the actuator device according to the disclosure as a view with a viewing direction onto a rear side thereof, wherein the embodiment of the actuator device has a base-like main body end piece.
Figure 10:
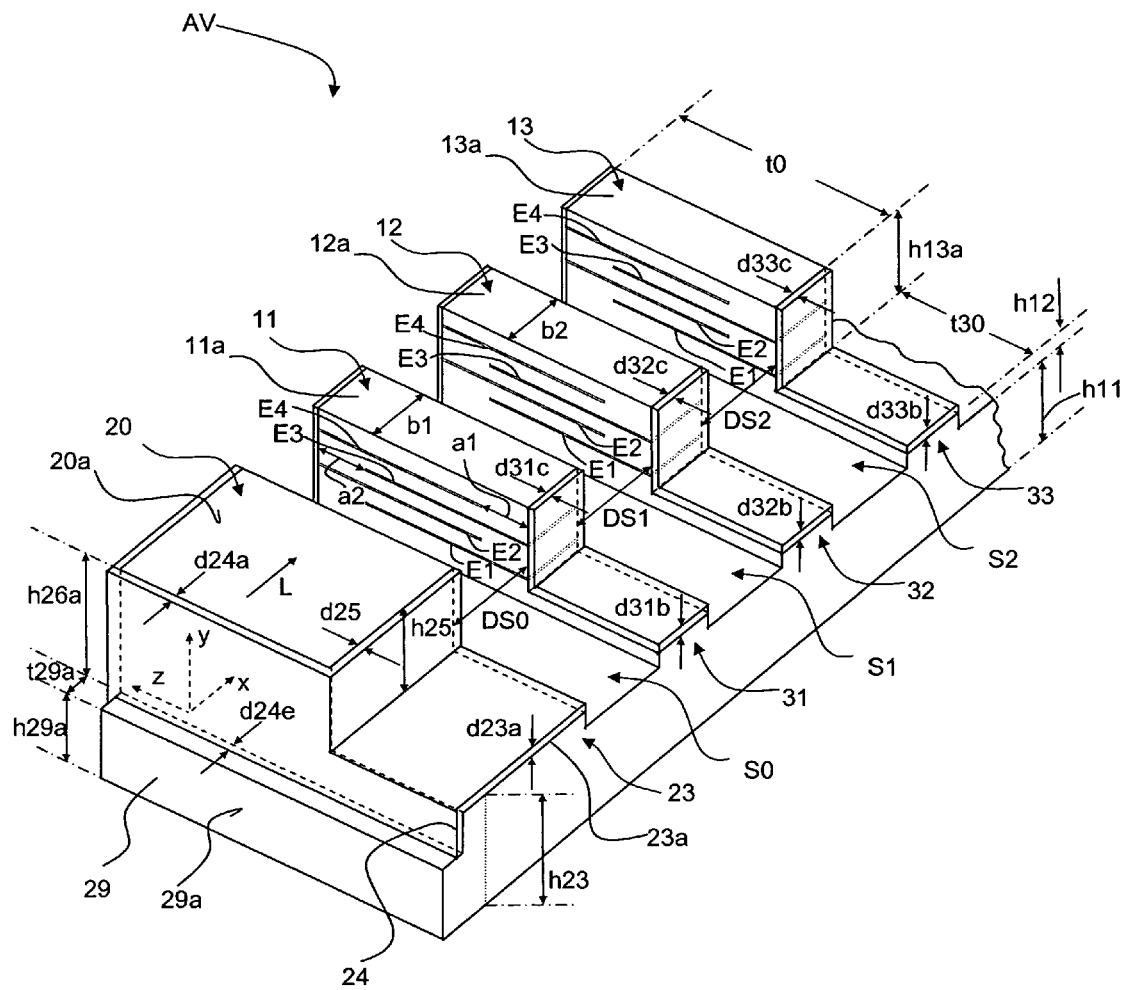
FIG. 10 is a perspective illustration of the embodiment of the actuator device according to the disclosure in accordance with FIG. 9 as a view with a viewing direction onto a front side thereof.

The embodiment of the actuator device AV shown in FIGS. 9 and 10 has a main body end piece 29. This main body end piece 29 can be provided additionally in the embodiments of the actuator device AV named herein. The main body end piece 29 extends away from the underside SL and from a central section of the return section 26 in the negative X direction. Viewed from the underside SL, the main body end piece 29 extends in the Y direction in a height h29a and forms here a surface 29a pointing in the negative X direction and an upper side 29c running therefrom towards the return section surface 26a and forming a depth t29a. At this location, a layer thickness d24e exists, which can be identical or non-identical and in particular greater than the thickness d24a. On the rear side 2 of the actuator device AV, the main body end piece 29 has a surface 29d. In the embodiment of the actuator device AV according to FIG. 9, the surfaces 29a, 29c, 29d are not coated. The actuator device AV can also likewise have such a main body end piece 29 (not shown) on the further face side situated opposed to the face side SF1. The embodiment of the actuator device AV according to the disclosure, shown in FIGS. 9 and 10, is realized without inner return electrodes (e.g. RE1, RE2, RE3, RE4 according to FIG. 3) in the return body 21 in the return section 26.

An advantage of the main body end piece 29 of the embodiment of the actuator device AV shown in FIGS. 9 and 10 is that with the main body end piece 29 an adaptation of the actuator device AV to the installation thereof into an application system can take place in a simple manner.

Figure 11:
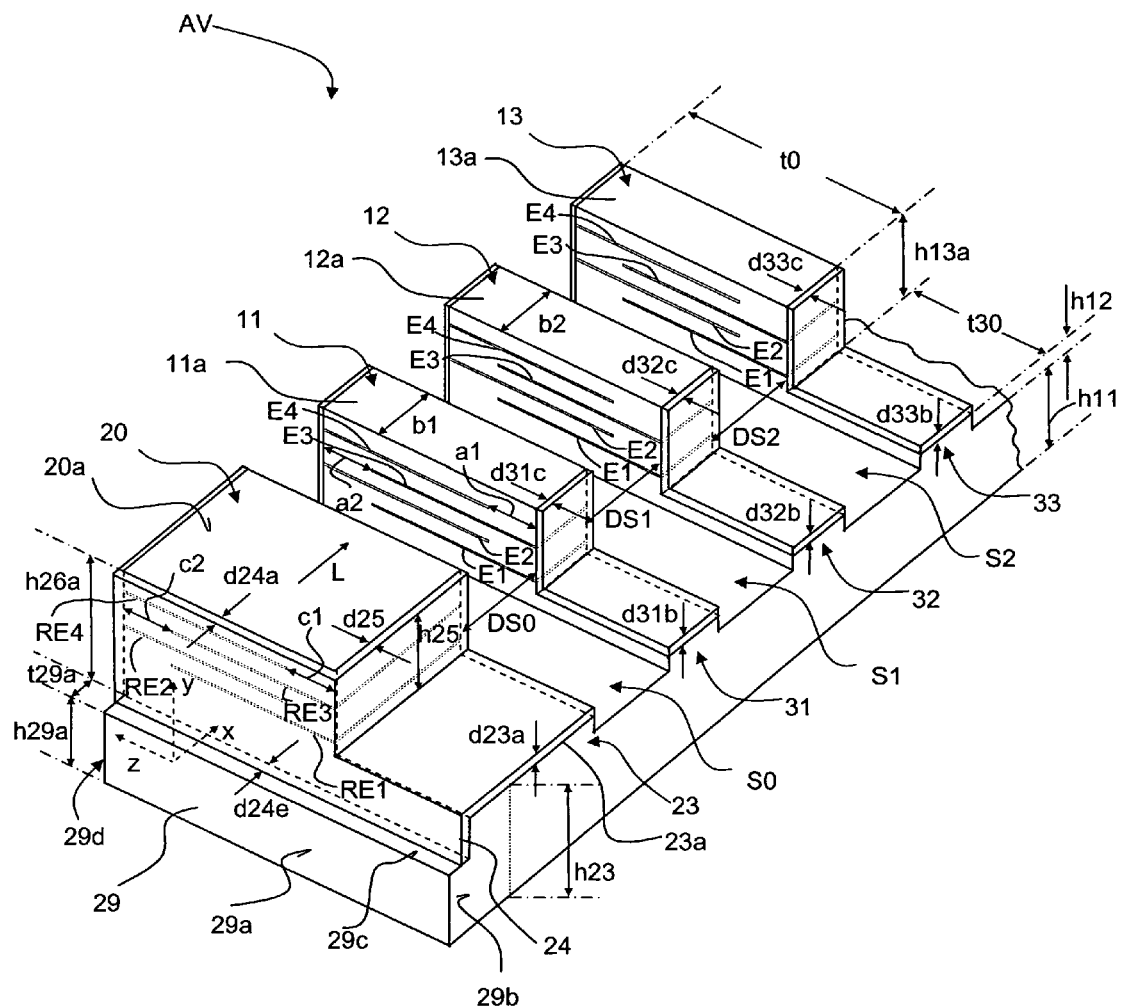
FIG. 11 is a perspective illustration of a part of a further embodiment thereof based on the embodiment of the actuator device according to the disclosure according to FIG. 9 in the manner of illustration of FIG. 10, wherein in the return partial piece return electrodes are inserted, which originate from the front side or the rear side and extend only up to a distance of the respectively opposed rear side or respectively front side, in which these realize no electrical connection between the rear side and the front side.

FIG. 11 shows a further embodiment of the actuator device AV according to the disclosure which, compared with the embodiment shown in FIGS. 9 and 10 has in the return body 21: at least one first inner return electrode RE1, RE3, which extends in the positive Z direction from the front side 1 up to a distance c2 to the rear side 2 and at least one second inner return electrode RE2, RE4, which extends in the negative Z direction from the rear side 2 up to a distance c1 to the front side 1. Through the return electrode RE1, RE2, RE3, RE4 together with the return body side layer or respectively the face-side layer section 24, the possibility exists of an adaptation of the actuator device AV for the return of an electrical minimum power to the rear-side side 2 from the front side 1.

Figure 12:
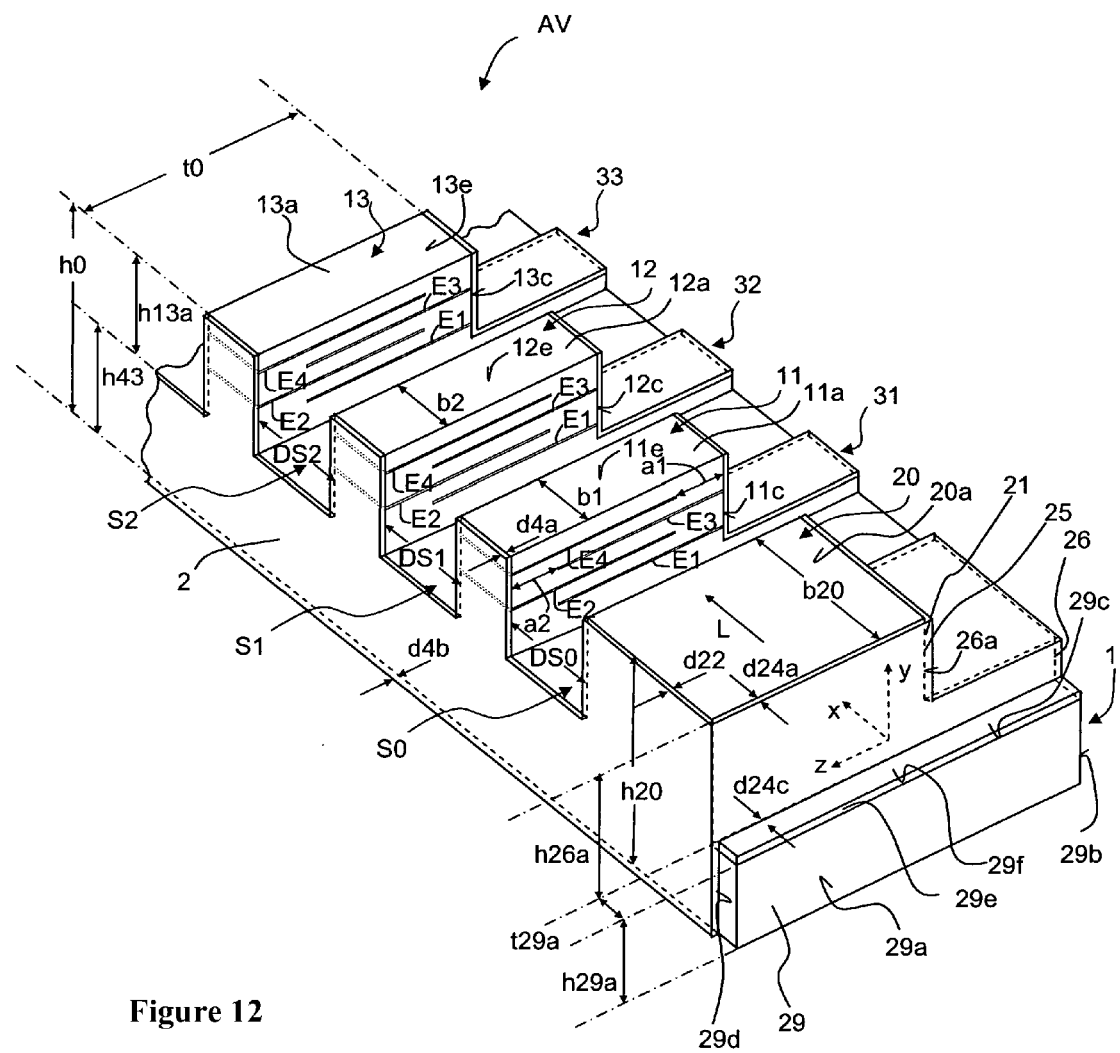
FIG. 12 is a perspective illustration of a part of a further embodiment thereof based on the embodiment of the actuator device according to the disclosure according to FIG. 9 in the manner of illustration of FIG. 9, wherein the return partial piece has no return electrodes and the main body has a main body end piece.
Figure 13:
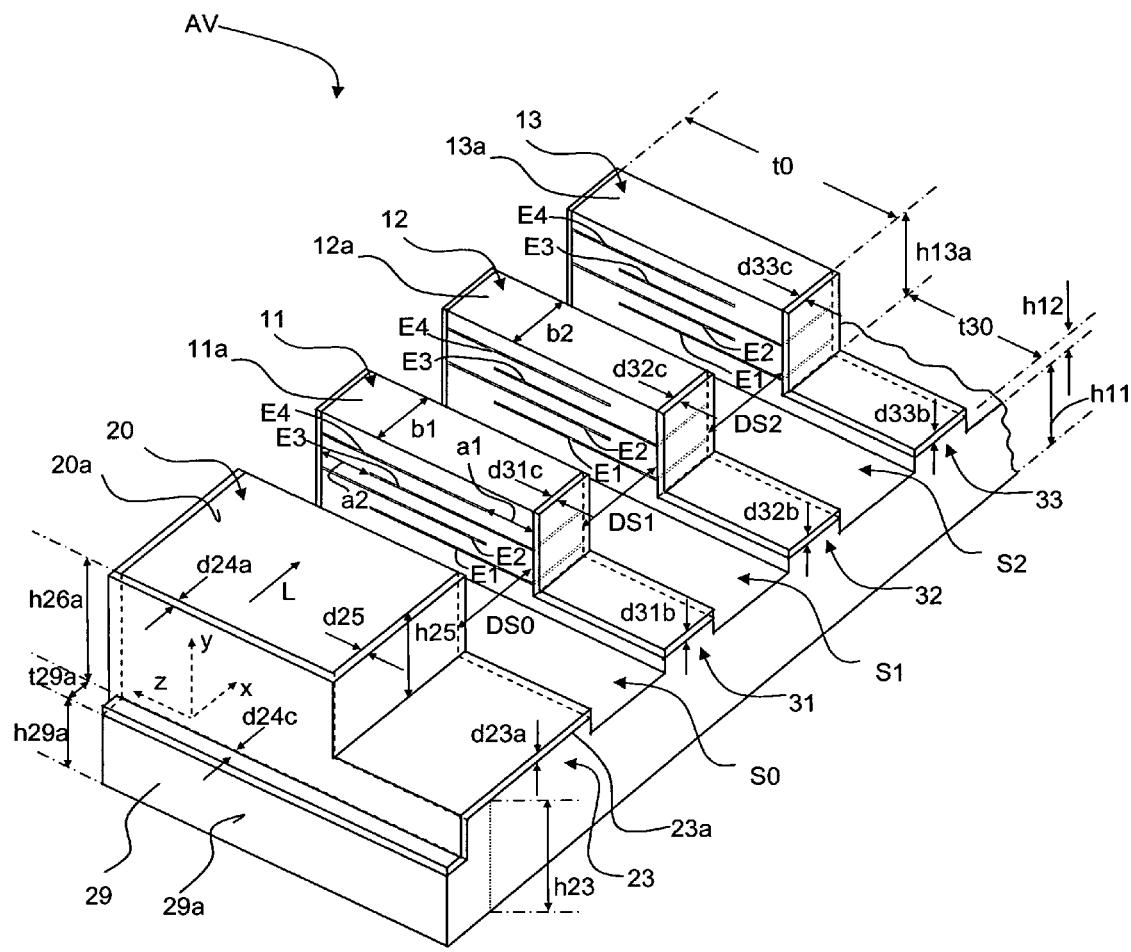
FIG. 13 is a perspective illustration of a part of the embodiment of the actuator device according to FIG. 12 as a view with a viewing direction onto a front side thereof, which is situated opposed to the rear side in relation to a longitudinal direction of the actuator device.

The embodiment of the actuator device AV shown in FIGS. 12 and 13 likewise has the main body end piece 29. This embodiment of the actuator device AV according to the disclosure is realized without inner return electrodes (e.g. RE1, RE2, RE3, RE4 according to FIG. 3) in the return body 21 in the return section 26. On the surface 29c of the main body end piece 29 an electrically conducting layer 29e with a surface 29f pointing in the Y direction is applied, through which the possibility of the return of additional electrical power to the rear side 2 exists.

Figure 14:
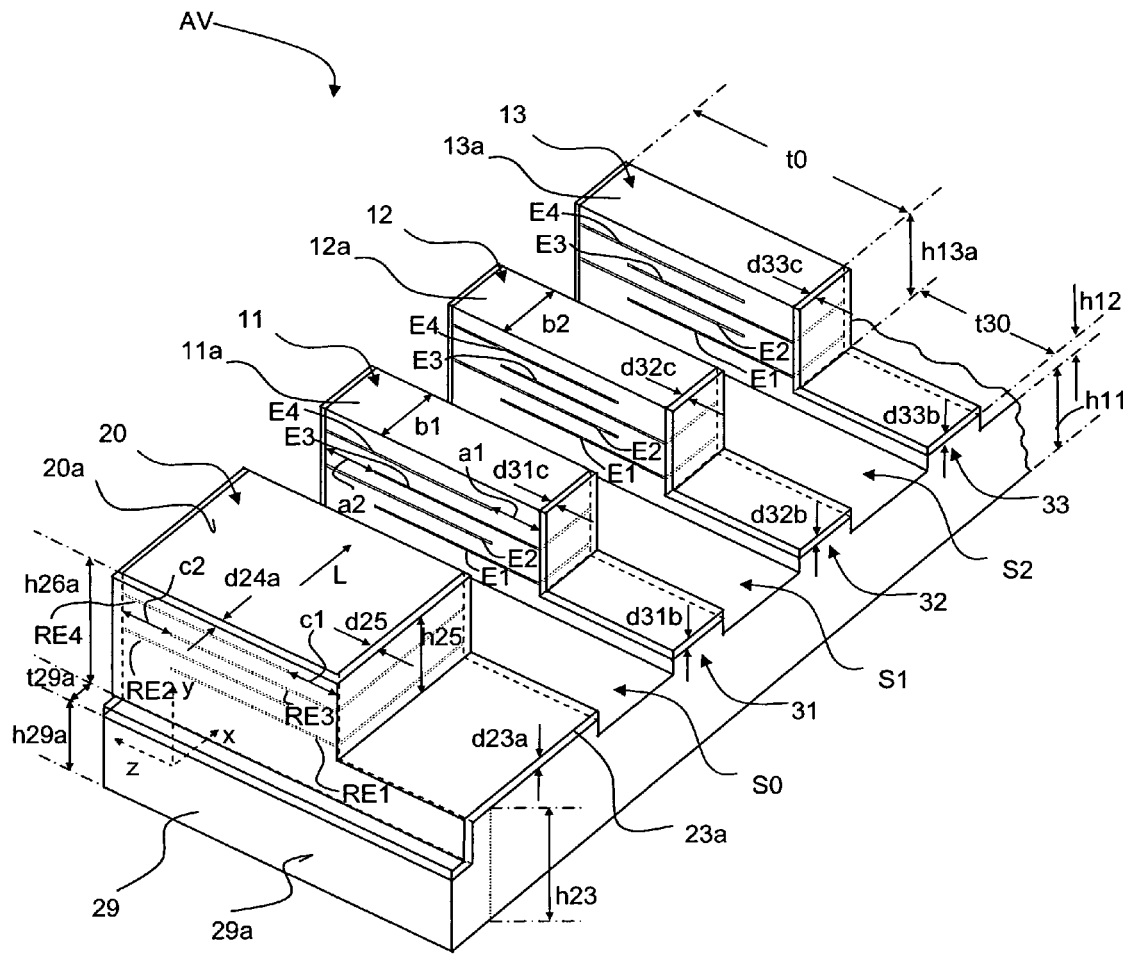
FIG. 14 is a perspective illustration of a part of a further embodiment thereof based on the embodiment of the actuator device according to the disclosure according to FIG. 13 in the manner of illustration of FIG. 13, wherein the return partial piece has return electrodes.

FIG. 14 shows a further embodiment of the actuator device AV according to the disclosure which, compared with the embodiment shown in FIGS. 12 and 13 has in the return body 21: at least one first inner return electrode RE1, RE3, which extends in the positive Z direction from the front side 1 up to a distance c2 to the rear side 2, and at least one second inner return electrode RE2, RE4, which extends in the negative Z direction from the rear side 2 up to a distance c1 to the front side 1. Through the return electrodes RE1, RE2, RE3, RE4 together with the return body side layer 24, the possibility exists of the return of additional electrical power to the rear side 2 and of an adaptation of the actuator device AV for the return of an electrical minimum power to the rear side.

Figure 16:
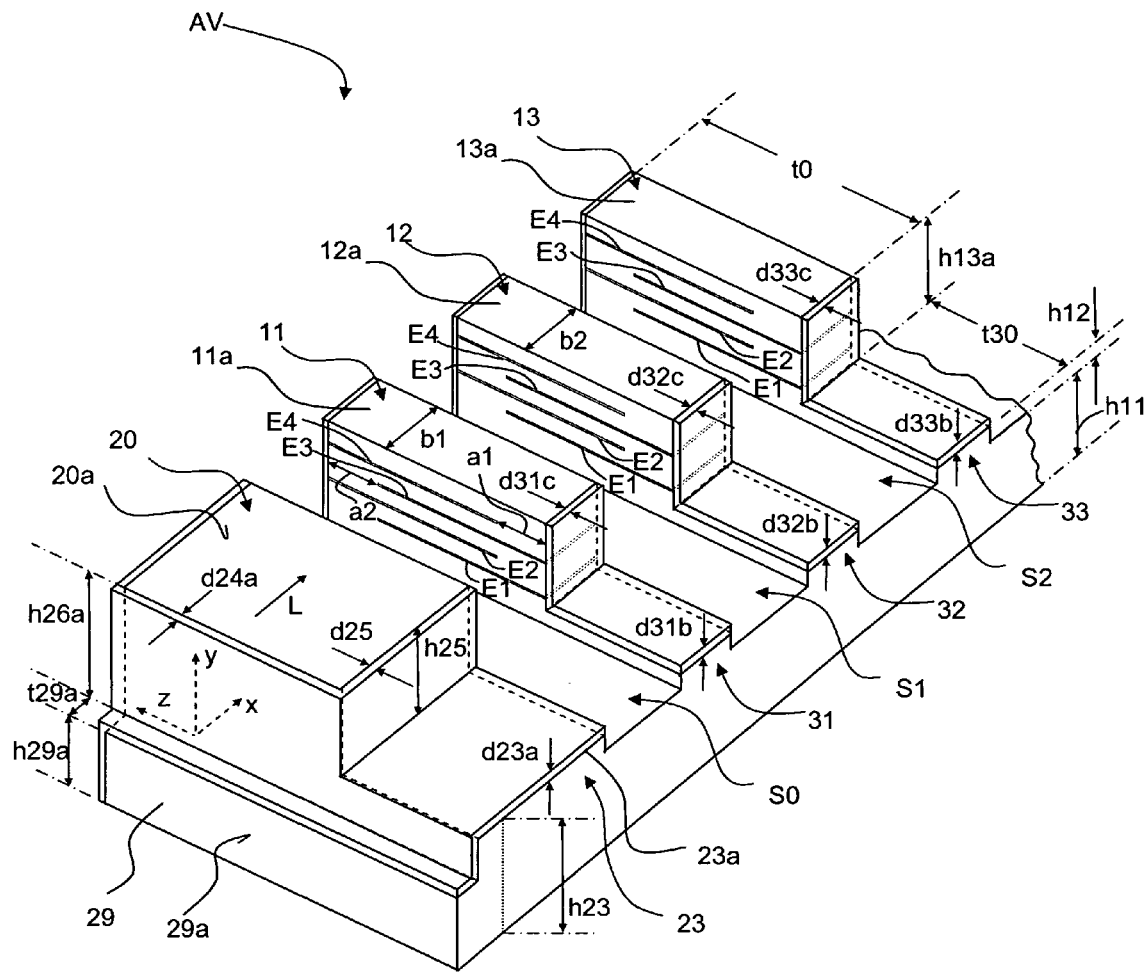
FIG. 16 is a perspective illustration of a part of the embodiment of the actuator device of the further embodiment thereof based on FIG. 15 as a view with a viewing direction onto the front side thereof.
Figure 16A:
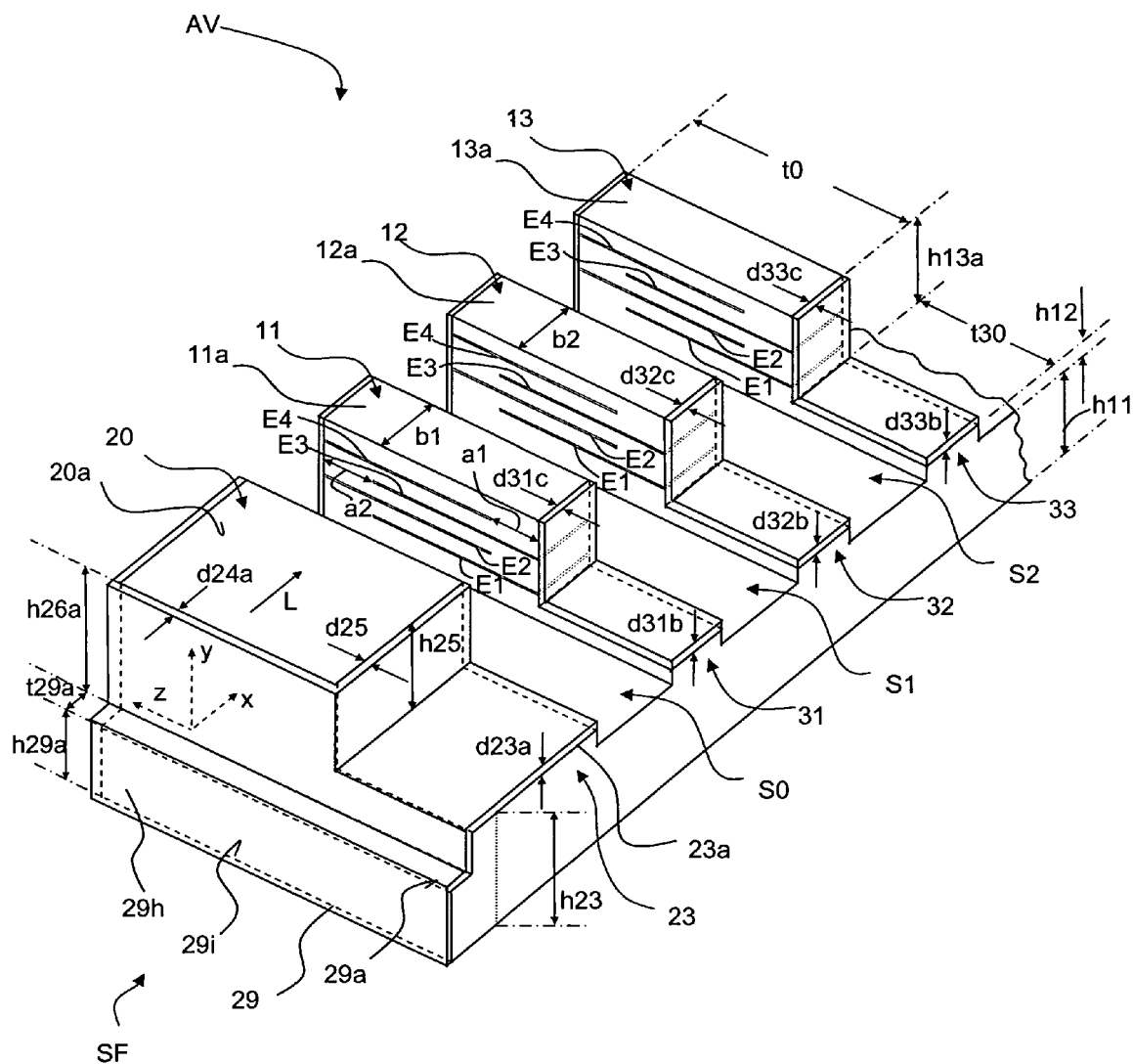
FIG. 16A is a perspective illustration of a part of the embodiment of the actuator device of the further embodiment thereof based on FIG. 15A as a view with a viewing direction onto the front side thereof.

FIGS. 15 and 16 show a further embodiment of the actuator device AV according to the disclosure, in which the surface 29d of the main body end piece 29 is also coated by an electrically conducting layer section 22d of the rear-side layer section 22. The actuator device AV can also likewise have such a main body end piece 29 (not shown) on the further face side situated opposed to the face side SF1. This embodiment of the actuator device AV according to the disclosure is realized without inner return electrodes (e.g. RE1, RE2, RE3, RE4 according to FIG. 3) in the return body 21 or respectively its return section 26.

Figure 17:
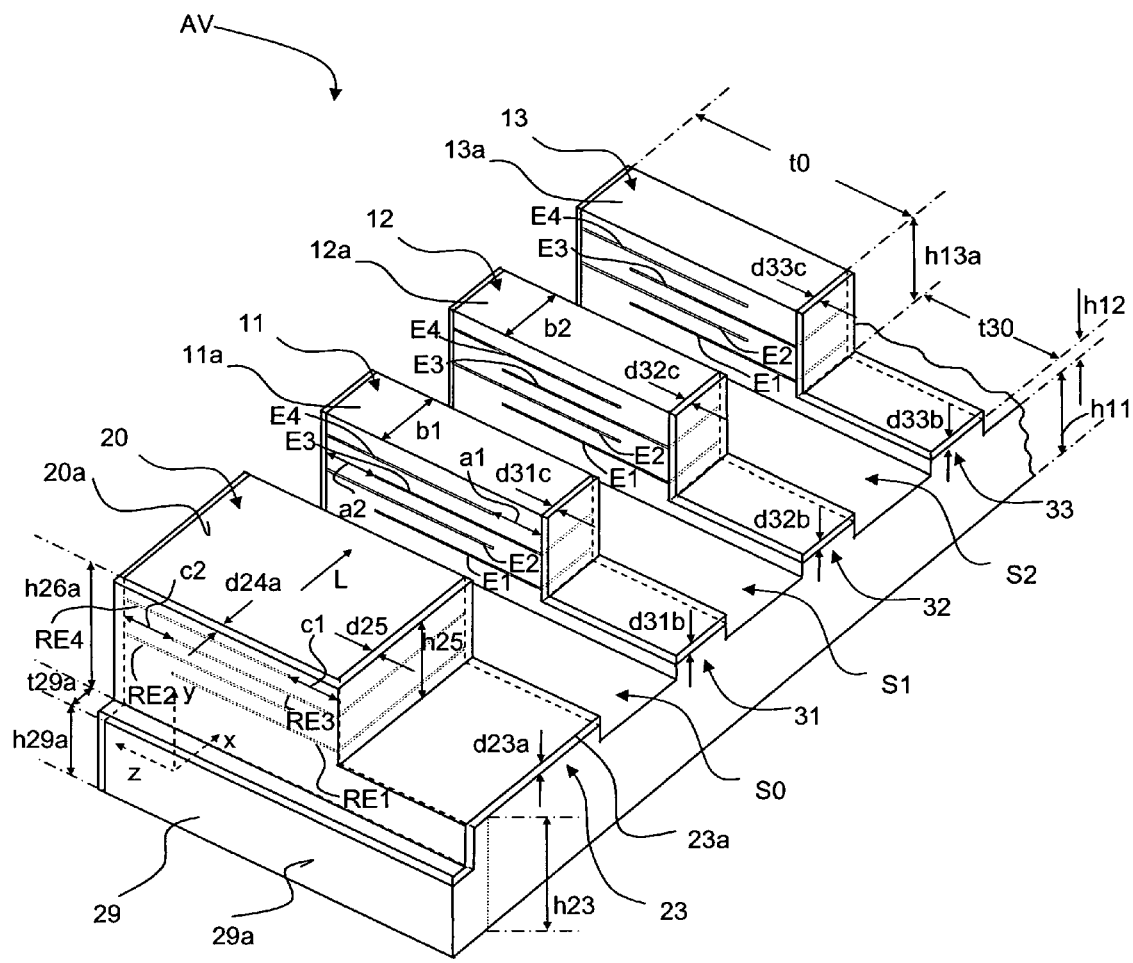
FIG. 17 is a perspective illustration of a part of a further embodiment thereof based on the embodiment of the actuator device according to the disclosure according to FIG. 15 in the manner of illustration of FIG. 16, wherein the return partial piece has return electrodes.

FIG. 17 shows a further embodiment of the actuator device AV according to the disclosure which, compared with the embodiment shown in FIGS. 15 and 16 has in the return body 21: at least one first inner return electrode RE1, RE3, which extends in the positive Z direction from the front side 1 up to a distance c2 to the rear side 2 and at least one second inner return electrode RE2, RE4, which extends in the negative Z direction from the rear side 2 up to a distance c1 to the front side 1. Through the return electrodes RE1, RE2, RE3, RE4 together with the return body side layer 24, the possibility exists of the return of additional electrical power to the rear side 2 and an adaptation of the actuator device AV for the return of an electrical minimum power to the rear side.

Figure 18:
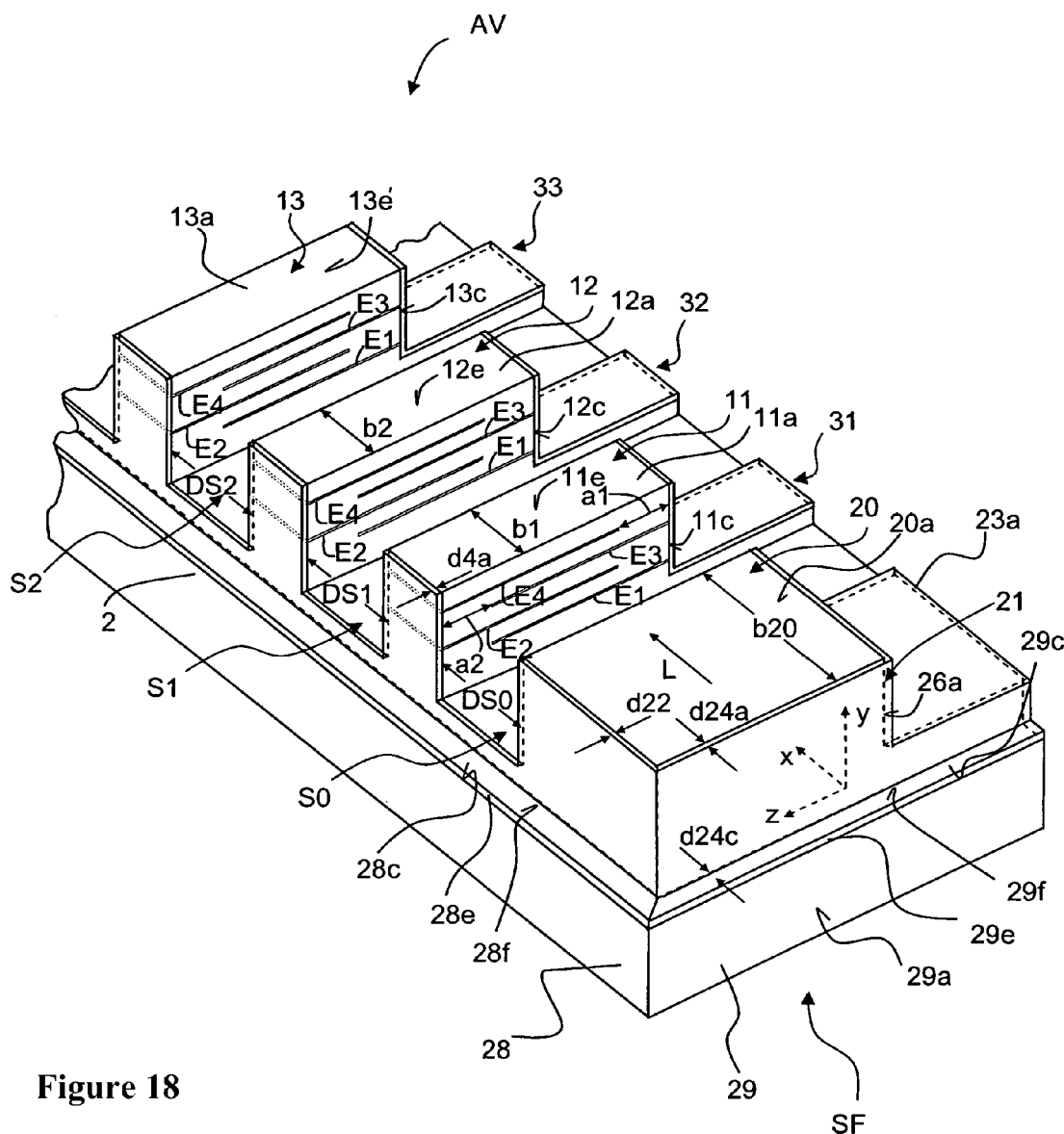
FIG. 18 is a perspective illustration of a part of a further embodiment thereof based on the embodiment of the actuator device according to the disclosure according to FIG. 15 in the manner of illustration of FIG. 15, wherein the actuator device has a further, second main body end piece on the rear side of the actuator device.

The embodiment of the actuator device AV shown in FIG. 18 has, in addition to the main body end piece 29 or the first main body end piece 29 a further or second main body end piece 28. On the surface 28c of the main body end piece 28 an electrically conducting layer 28e with a surface 28f pointing in the Y direction is applied, through which the possibility exists of the return of additional electrical power to the rear side 2. The actuator device AV can also have likewise such a main body end piece as the main body end piece 29 (not shown) on the further face side situated opposed to the face side SF1. This embodiment of the actuator device AV according to the disclosure is realized without inner return electrodes (e.g. RE1, RE2, RE3, RE4 according to FIG. 3) in the return body 21 or respectively in its return section 26.

Figure 19:
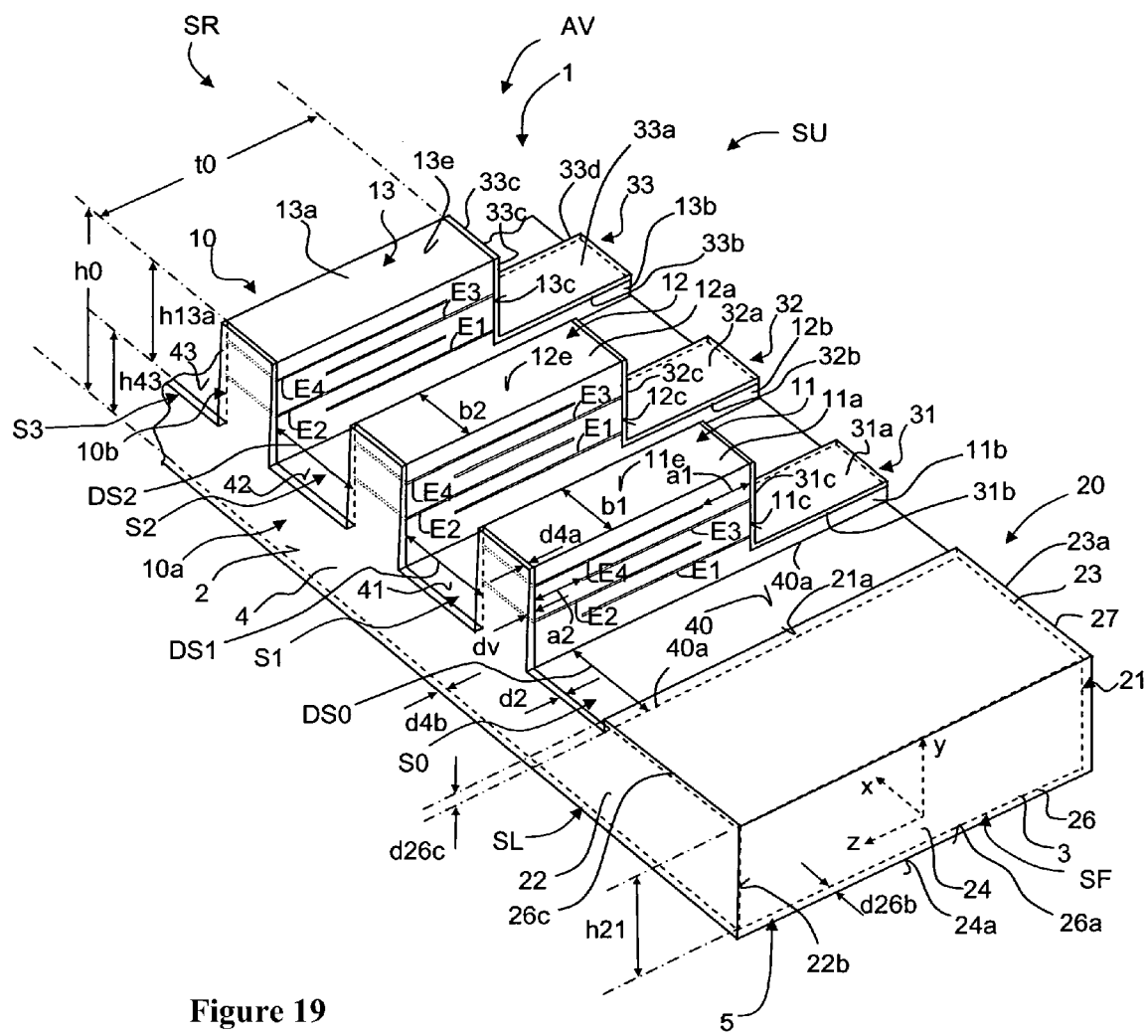
FIG. 19 is a perspective illustration of a part of further embodiment of the actuator device according to the disclosure in the manner of illustration of FIG. 1, in which, compared with the embodiment illustrated in FIG. 1, the return partial piece is embodied in an alternative manner and its support section is embodied with a smaller height.

According to the embodiment of the actuator device according to the disclosure in accordance with FIG. 19, the return section 26 is configured without a support section 25 extending in the Y direction therefrom, and extends from the underside SL into a height h26 (cf. FIG. 1), which is equal to the height h43, so that the return body 21 and—in the given embodiment—the return section 26, viewed in the Y direction, have the same height as the surface 40, viewed in the X direction, situated adjacent thereto. In this embodiment, the return section 26 therefore has no support function. The return connection piece 23 can be understood as a component of the return section 26. In this embodiment, the surface 21a of the return body 21, pointing in the Y direction, is coated with the outer layer 26c with the thickness d26c, which also forms the return connection coating 23a, which is electrically connected both with the rear-side layer section 22 on the rear side 2 and with a face-side layer section 24 on the face side SF and in particular is embodied in one piece. This permits a particularly effective current flow with a particularly simple and particularly favorable manner of production of the actuator device AV according to the disclosure and a particularly advantageous solution by which a relatively great electrical power can be returned to the rear side 2.

Figure 20:
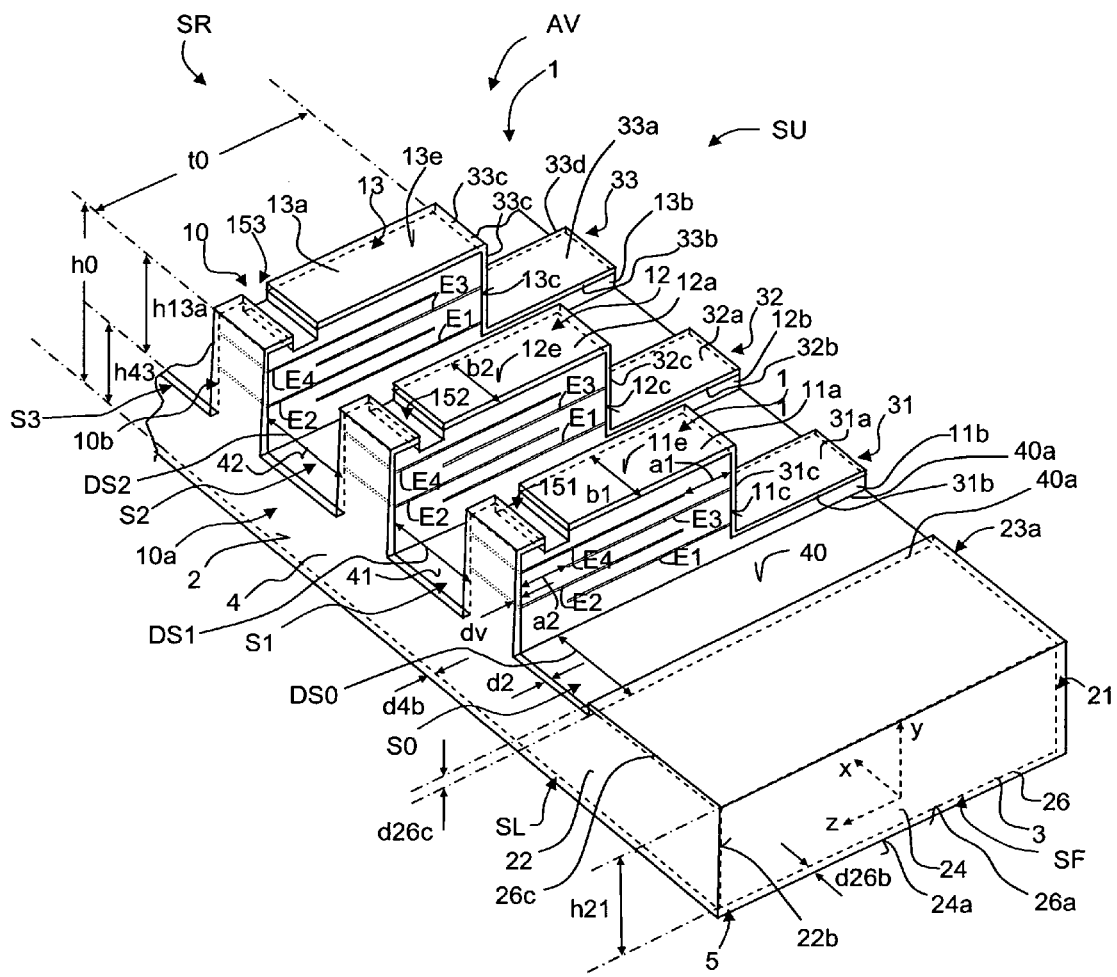
FIG. 20 is a perspective illustration of a part of a further embodiment of the actuator device according to the disclosure on the basis of the actuator device according to FIG. 19, wherein the further embodiment of the actuator device, compared with the embodiment of FIG. 19, has a coating on the upper side of the actuator bodies, which is divided by an actuator groove in the region of the rear side of the actuator device.
Figure 21:
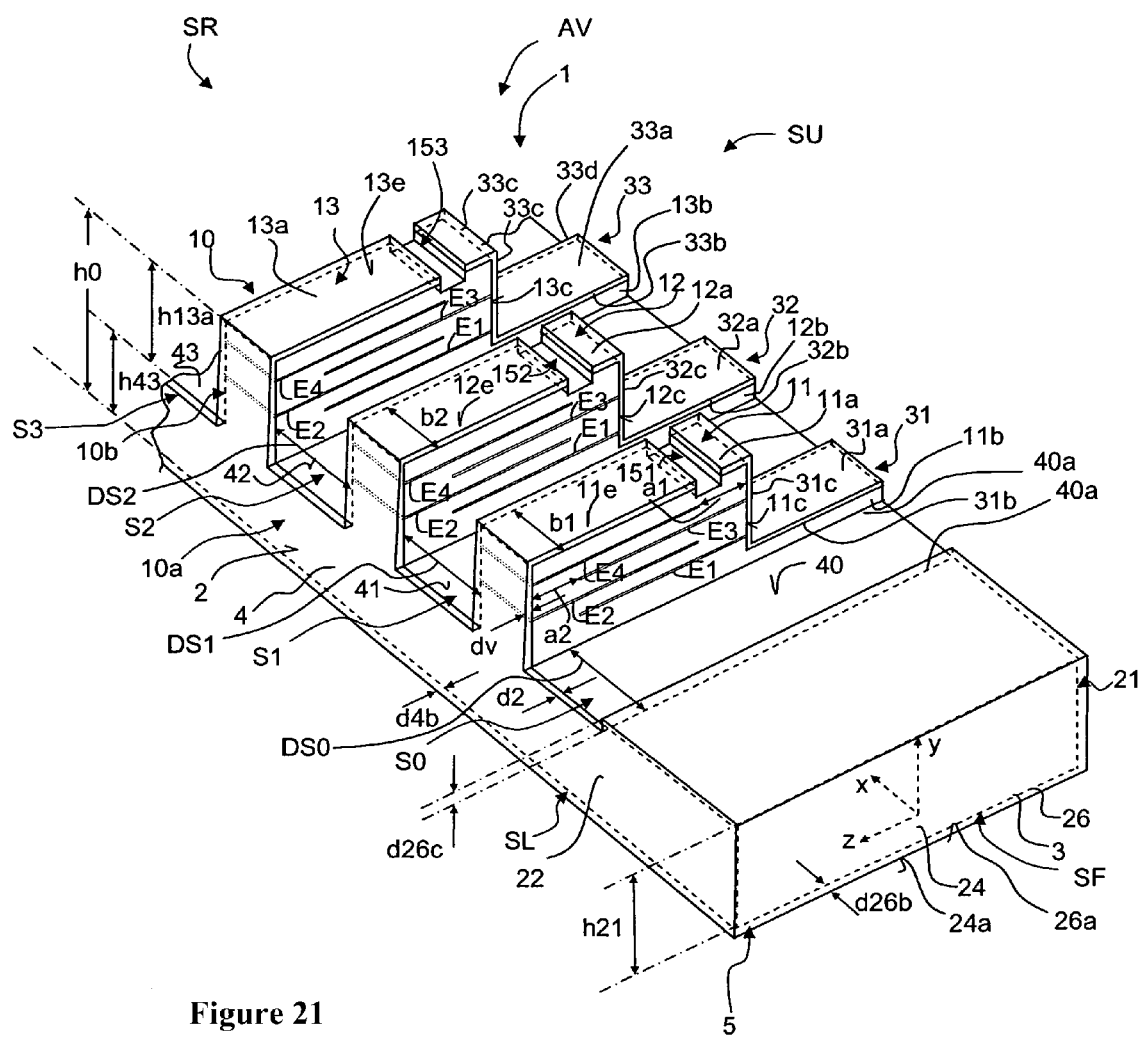
FIG. 21 is a perspective illustration of a part of a further embodiment of the actuator device according to the disclosure on the basis of the actuator device of FIG. 20, wherein the upper conductive layer on the upper side thereof is divided by an actuator groove in the region of the front side of the actuator device.

FIGS. 20 and 21 show further embodiments of the actuator device AV according to the disclosure which, compared with the embodiment shown in FIGS. 1 and 2, have respectively grooves 151, 152, 153 on the upper side of the actuators 11, 12, 13 and optionally on the upper side 21a of the return body 21, as were described with their function by means of FIGS. 4 and 5.

Figure 22:
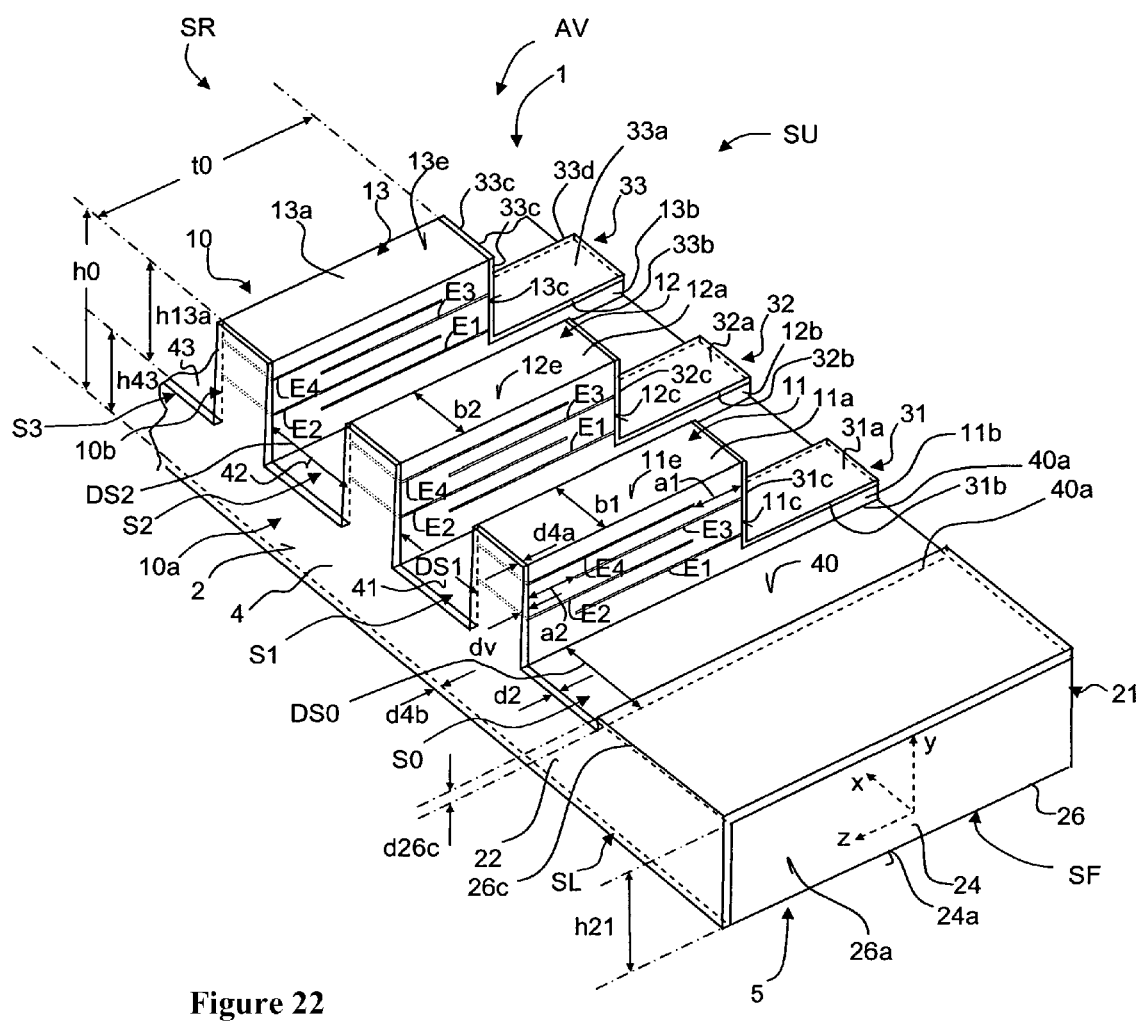
FIG. 22 is a perspective illustration of a part of a further embodiment of the actuator device according to the disclosure in the manner of illustration of FIG. 1, in which, compared with the embodiment illustrated in FIG. 1, the return partial piece is embodied in an alternative manner and without a support section and without a coating on the face surface.

The embodiment of the actuator device according to the disclosure in accordance with FIG. 22 is based on the embodiment illustrated in FIG. 19, wherein the return section surface 26a on the first face side SF1 is not coated with an electrically conductive material, so that compared with the embodiment according to FIG. 10 no face-side layer section 24 is provided. Thereby, the return section surface 26a can be adapted to connection points or fastening devices of an application system, so that an improved mechanical integration possibility of the actuator device AV according to the disclosure exists.

Figure 23:
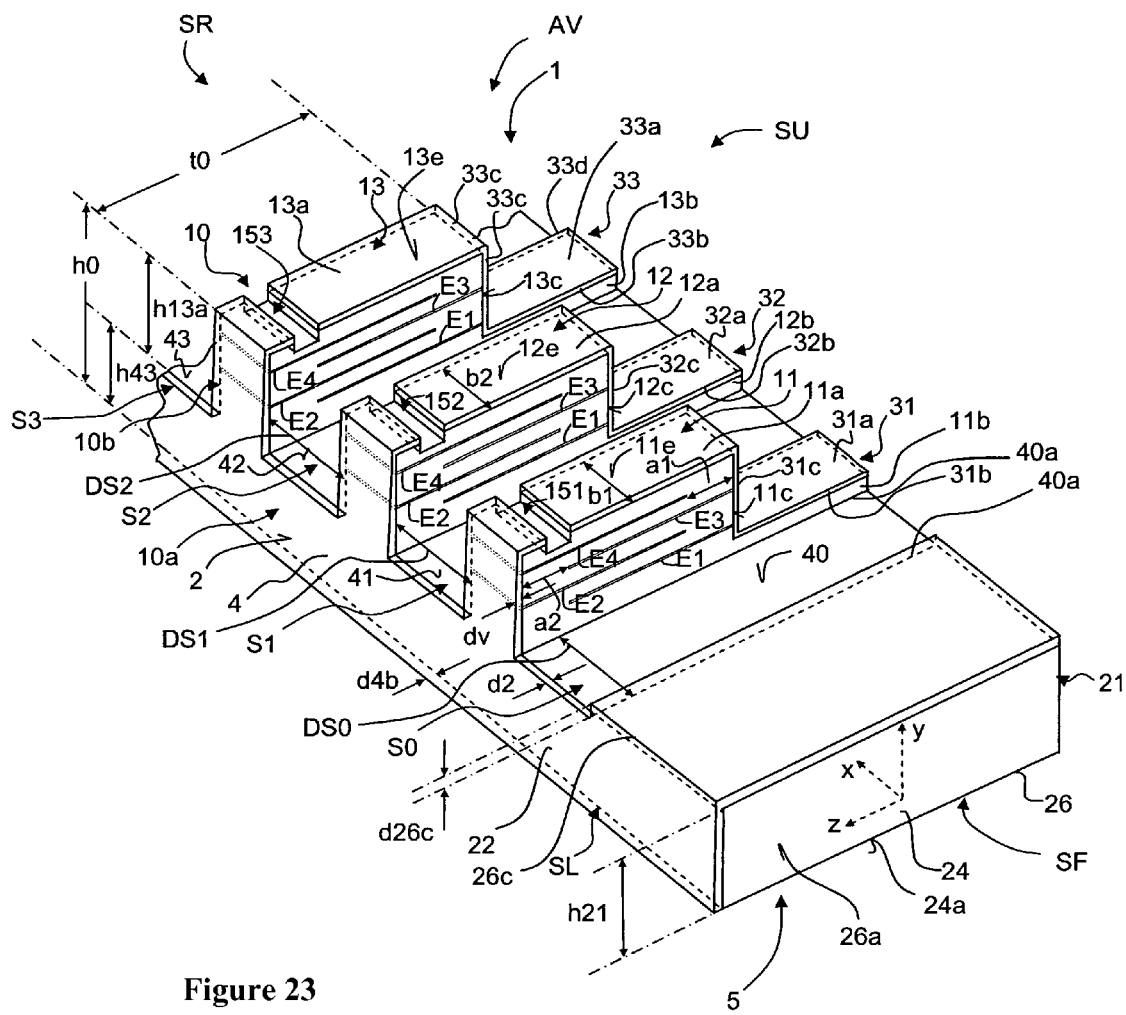
FIG. 23 is a perspective illustration of a part of a further embodiment of the actuator device according to the disclosure on the basis of the actuator device of FIG. 22, wherein the further embodiment of the actuator device, compared with the embodiment of FIG. 22, has a coating on the upper side of the actuator bodies, which is divided by an actuator groove in the region of the rear side of the actuator device.
Figure 24:
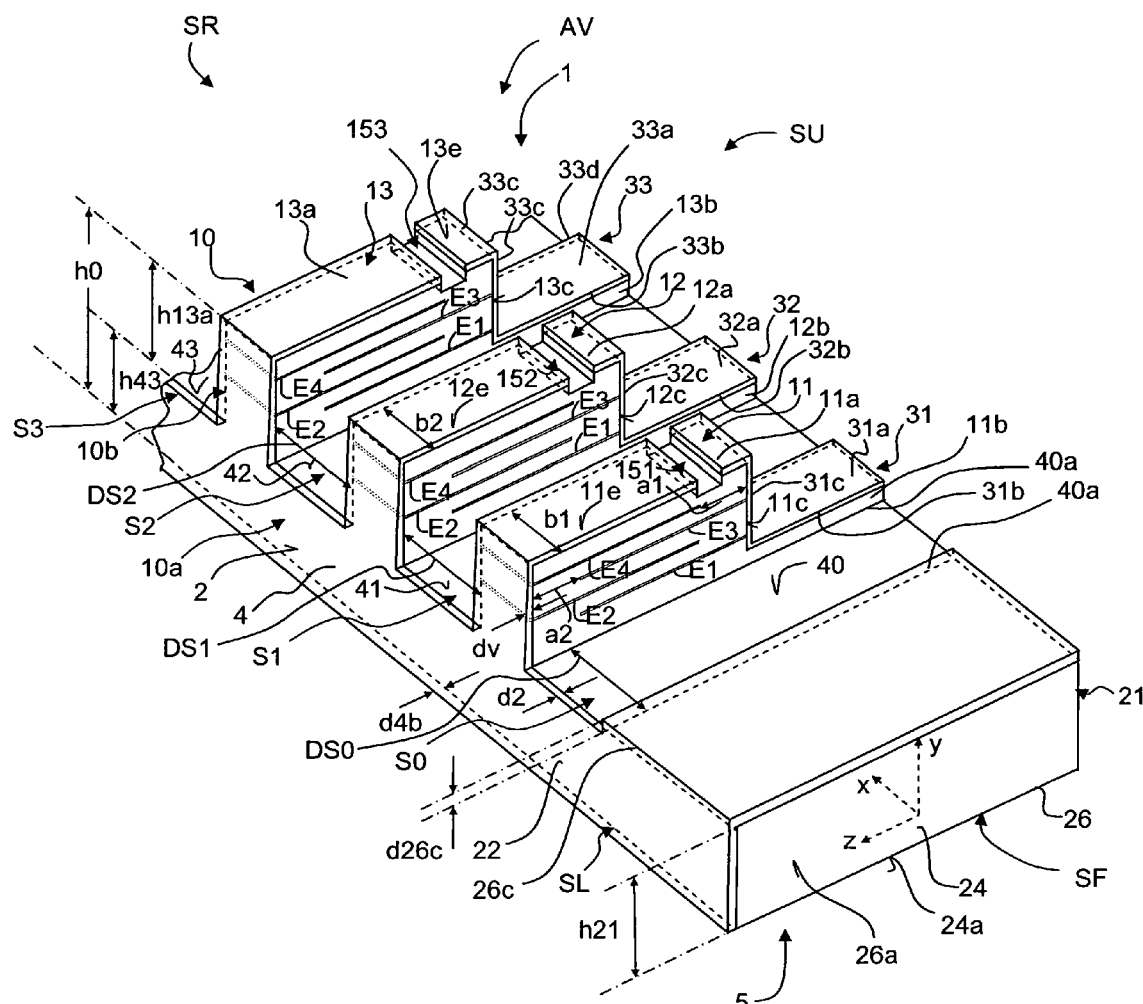
FIG. 24 is a perspective illustration of a part of a further embodiment of the actuator device according to the disclosure on the basis of the actuator device of FIG. 22, wherein the coating on the upper side of the actuator bodies is divided by an actuator groove in the region of the front side of the actuator device.

FIGS. 23 and 24 show further embodiments of the actuator device AV according to the disclosure based on the embodiment shown in FIG. 22 which, compared with the embodiment shown in FIGS. 1 and 2 have respectively grooves 151, 152, 153 on the upper side of the actuators 11, 12, 13 and optionally on the upper side 21a of the return body 21, and the function of which was described by means of FIGS. 4 and 5.

Figure 25:
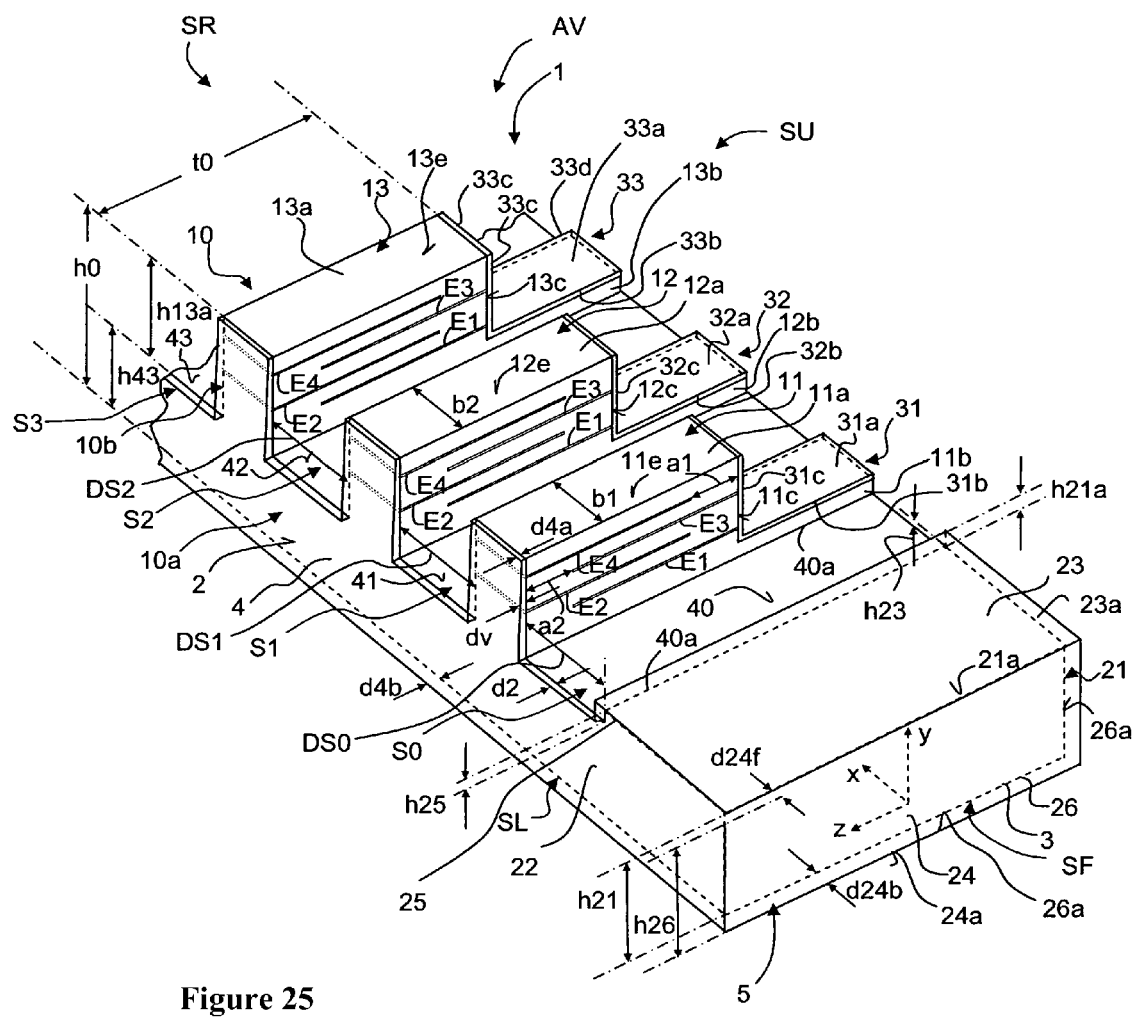
FIG. 25 is a perspective illustration of a part of a further embodiment of the actuator device according to the disclosure based on the embodiment of FIG. 19 in the manner of illustration of FIG. 19, wherein the return partial piece has an alternative type of coating.

The further embodiment of the actuator device AV according to the disclosure, shown in FIG. 25, has a return section 26, which is formed in one piece with the return connection piece 23 and viewed in the Z direction with respect to the embodiment of the actuator device AV illustrated in FIG. 19 extends over the entire depth of the actuator device AV and rises from the recess surface 40 on the rear side 2 with the height h25 and on the front side 1 with the height h21a, so that the return section 26 forms the return body 21. In this embodiment, the return body connection coating 23a extends from the rear side 2 up to the front side 1 and is connected with the rear-side layer 4.

Figure 26:
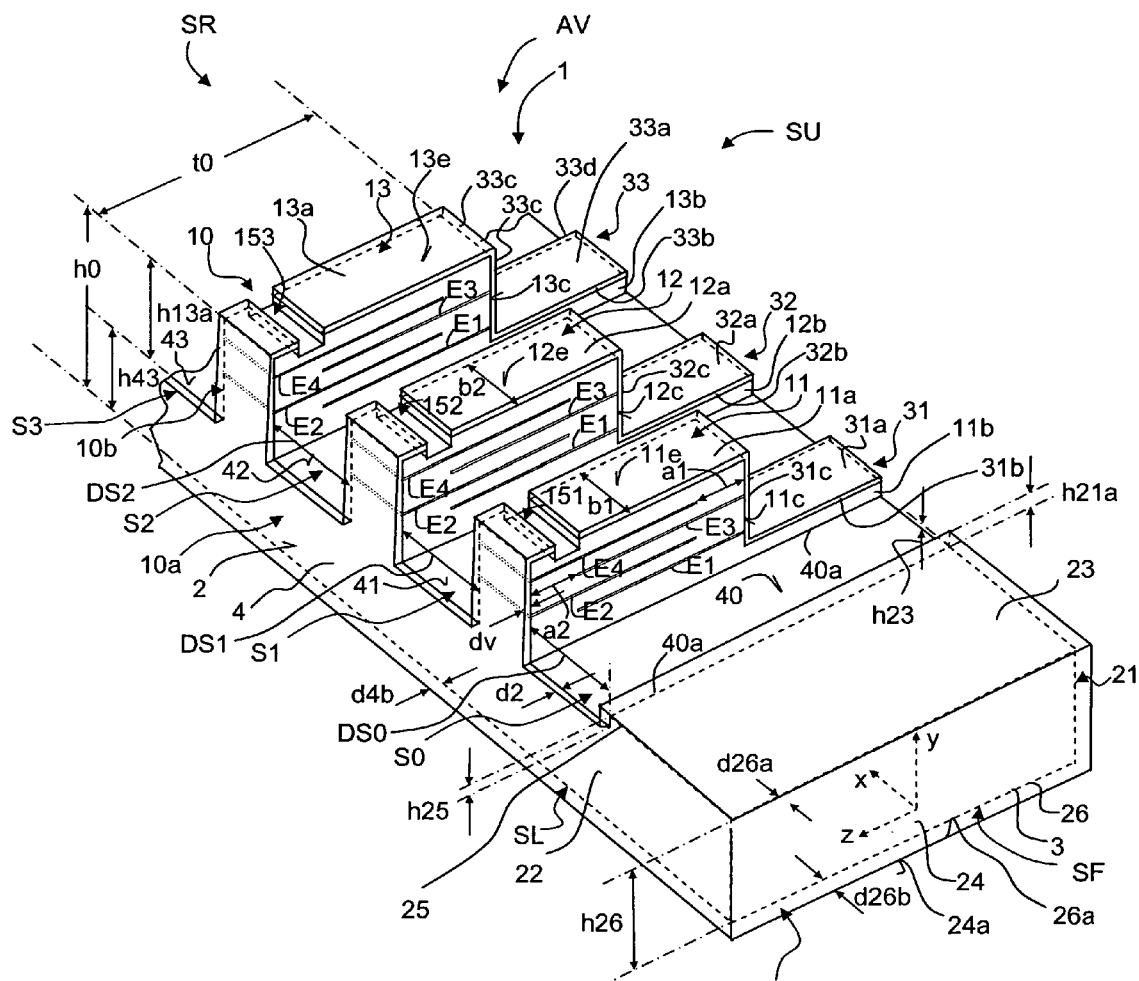
FIG. 26 is a perspective illustration of a part of a further embodiment of the actuator device according to the disclosure on the basis of the actuator device of FIG. 25, wherein the further embodiment of the actuator device, compared with the embodiment of FIG. 25, has a coating on the upper side of the actuator bodies, which is divided by an actuator groove in the region of the rear side of the actuator device.
Figure 27:
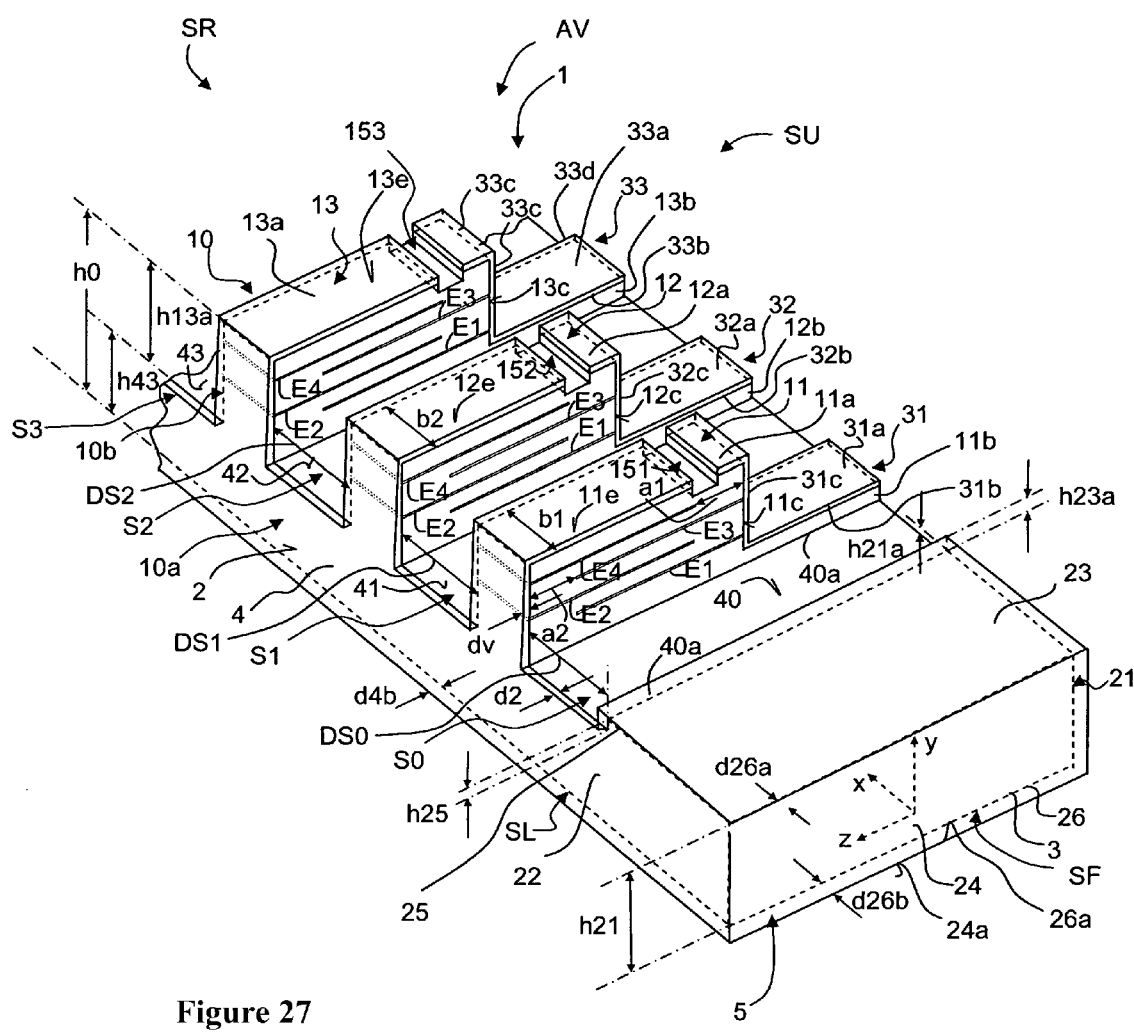
FIG. 27 is a perspective illustration of a part of a further embodiment of the actuator device according to the disclosure on the basis of the actuator device of FIG. 25, wherein in contrast to the embodiment according to FIG. 26 the coating on the upper side of the actuator bodies is divided in the region of the front side of the actuator device.

FIGS. 26 and 27 show respectively a further embodiment of the actuator device AV according to the disclosure, which has a groove 151, 152, 153 running in the Y direction on the upper side of each actuator body 11a, 12a, 13a. Furthermore, each actuator 11, 12, 13 is coated with an electrically conductive layer, wherein the respective groove 151, 152, 153 is deeper than the thickness of the respective layer, so that each actuator 11, 12, 13 has a layer (reference number 153-1 for the actuator 13) situated in the negative Z direction laterally to the groove, and a layer (reference number 153-2 for the actuator 13) situated in the negative Z direction laterally to the groove. The two respectively opposite layers in relation to a groove of an actuator 11, 12, 13 are therefore electrically separated.

Figure 28:
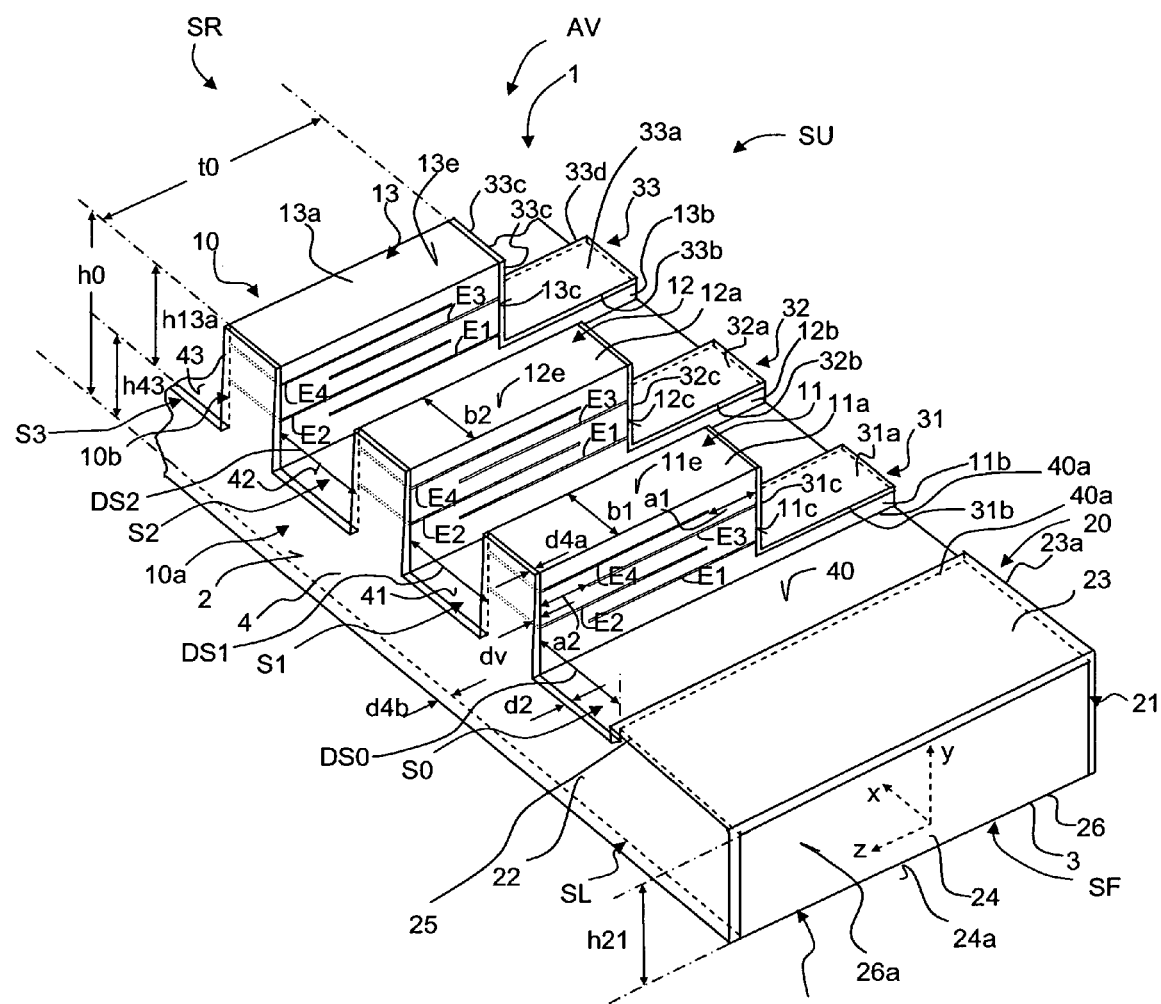
FIG. 28 is a perspective illustration of a part of a further embodiment of the actuator device according to the disclosure based on the embodiment of FIG. 25 in the manner of illustration of FIG. 25, in which compared with the embodiment illustrated in FIG. 22 the return partial piece has no coating on the face side; \

The further embodiment of the actuator device AV according to the disclosure, shown in FIG. 28, is based on the embodiment shown in FIG. 25, compared with which in the embodiment of FIG. 28 the return section surface 26a pointing in the negative X direction is not coated.

Figure 29:
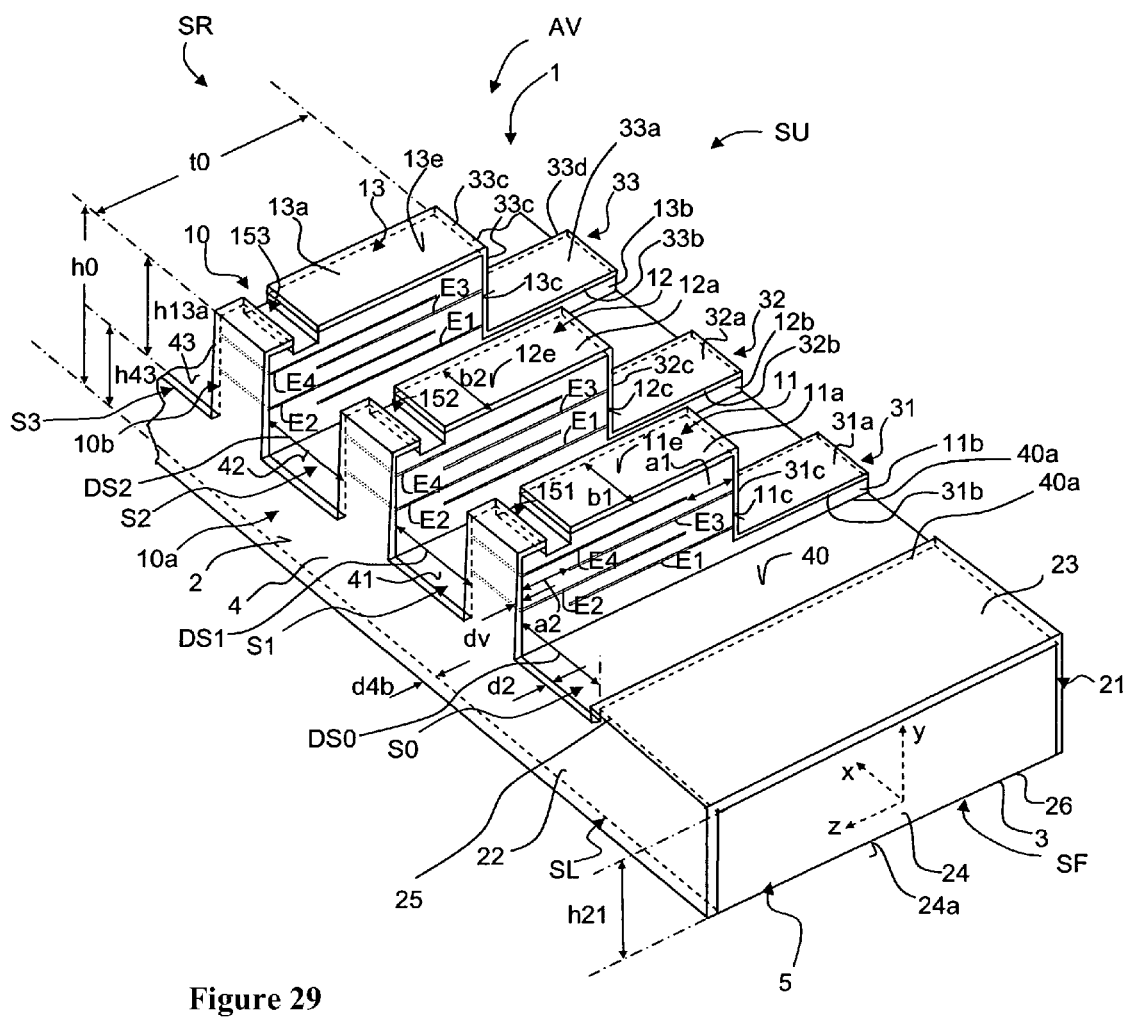
FIG. 29 is a perspective illustration of a part of a further embodiment of the actuator device according to the disclosure on the basis of the actuator device of FIG. 28, wherein the further embodiment of the actuator device, compared with the embodiment of FIG. 28, has a coating on the upper side of the actuator bodies, which is divided by an actuator groove in the region of the rear side of the actuator device.
Figure 30:
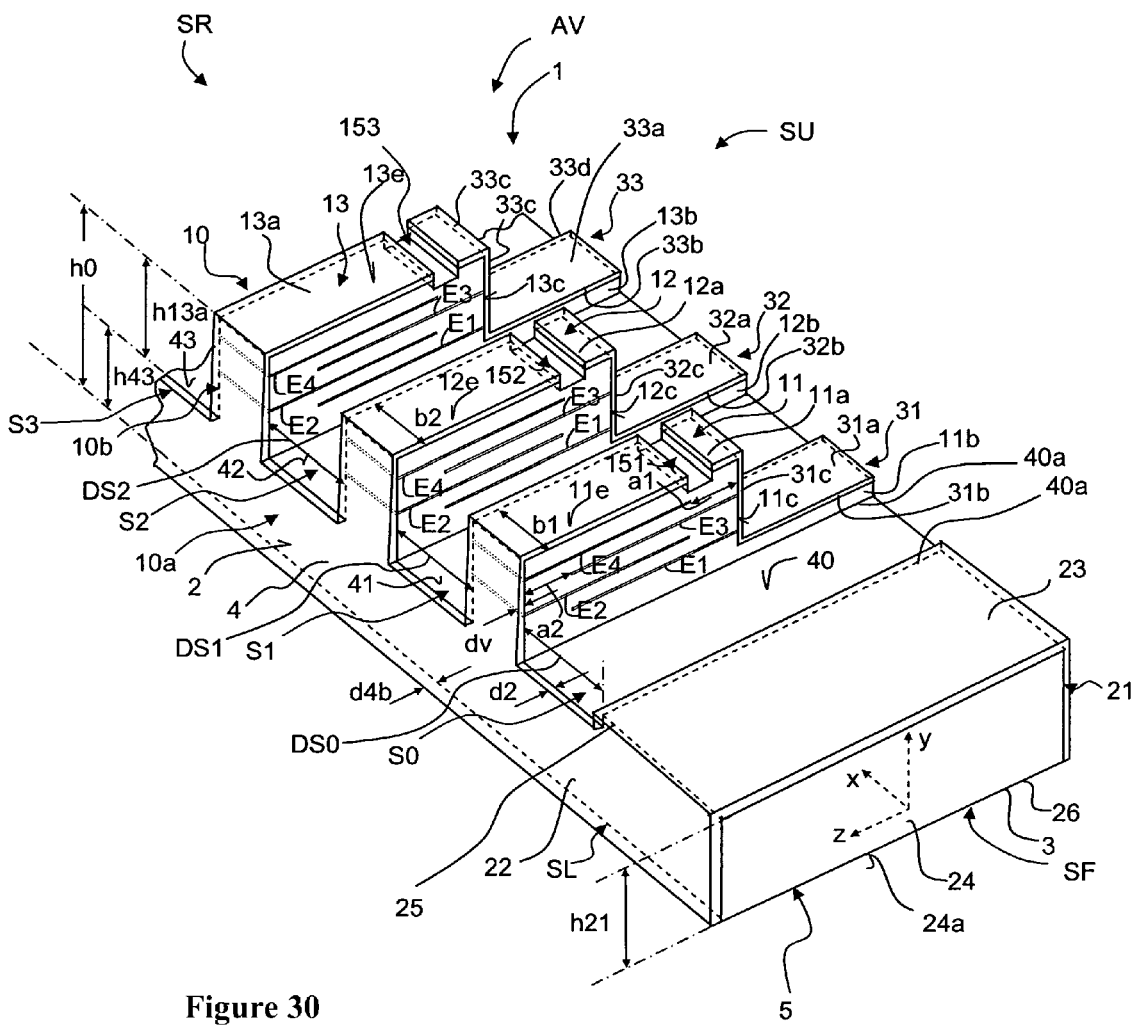
FIG. 30 is a perspective illustration of a part of a further embodiment of the actuator device according to the disclosure on the basis of the actuator device of FIG. 28, wherein in contrast to the embodiment according to FIG. 29 the coating on the upper side of the actuator bodies is divided by an actuator groove in the region of the front side of the actuator device.

FIGS. 29 and 30 show respectively a further embodiment of the actuator device AV according to the disclosure which, compared with the embodiment shown in FIGS. 25 and 26, has a groove 151, 152, 153 running in the Y direction on the upper side of each actuator body 11a, 12a, 13a. Furthermore, each actuator 11, 12, 13 is coated with an electrically conductive layer, wherein the respective groove 151, 152, 153 is deeper than the thickness of the respective layer, so that each actuator 11, 12, 13 has a layer (reference number 153-1 for the actuator 13) situated in the negative Z direction laterally to the groove, and a layer (reference number 153-2 for the actuator 13) situated in the negative Z direction laterally to the groove. The two respectively opposite layers in relation to a groove of an actuator 11, 12, 13 are therefore electrically separated.

Figure 31:
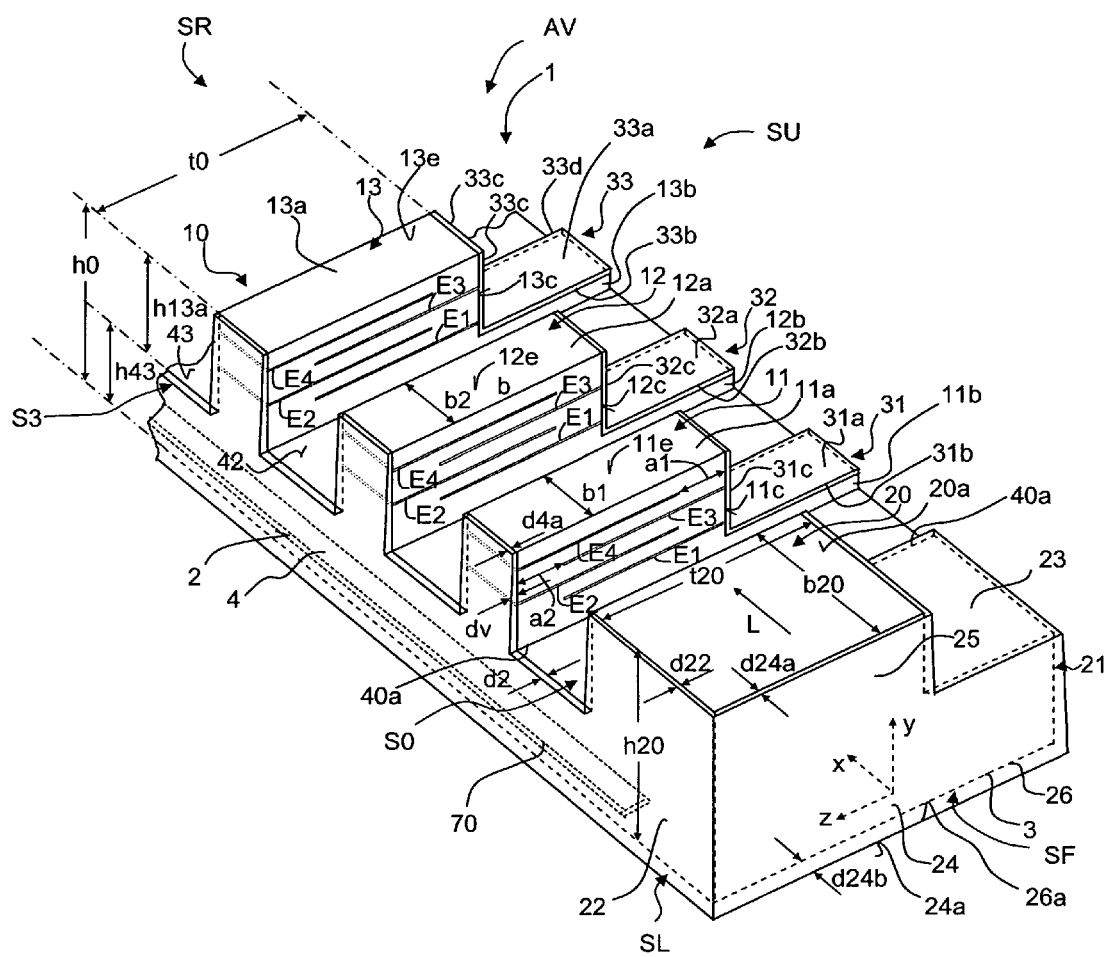
FIG. 31 is a perspective illustration of a part of a further embodiment of the actuator device according to the disclosure in the manner of illustration of FIG. 1, in which compared with the embodiment illustrated in FIG. 1, on the rear side of the actuator device a collector electrode is arranged as inner electrode.

According to the embodiment of the actuator device according to the disclosure in accordance with FIG. 31, a collector electrode 70 is arranged on the rear side 2, which collector electrode is connected with the rear-side layer 4 and in particular continues into the latter. In this way, the current flow on the rear side 2 is supported, because it no longer—as according to the embodiments of FIGS. 1 to 30—flows only through the rear-side layer 4, but also through the collector electrode 70. This is particularly advantageous for the supporting of the current flow in the region of the recesses S2, S3.

Figure 32:
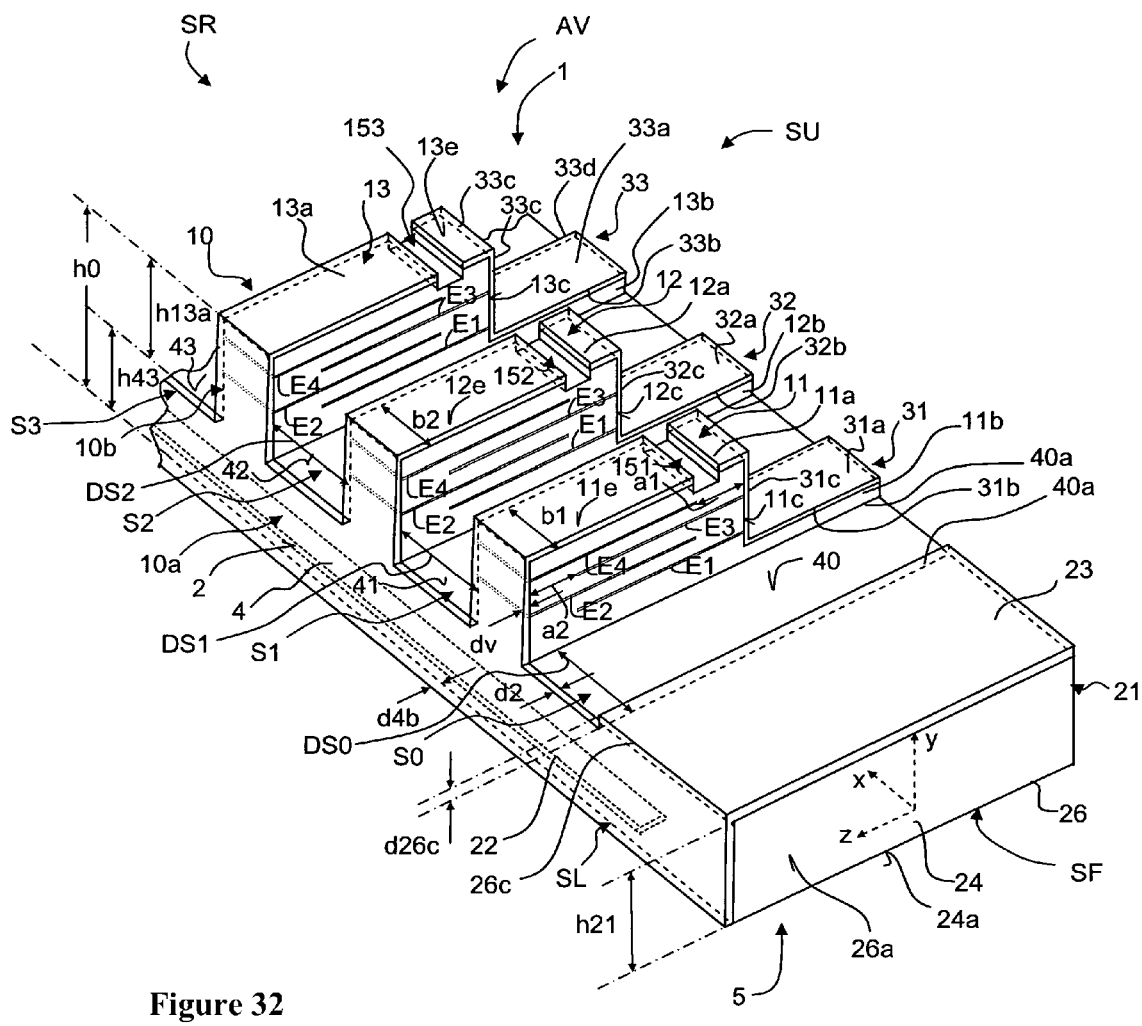
FIG. 32 is a perspective illustration of a part of a further embodiment of the actuator device according to the disclosure based on the embodiment of FIG. 31, in the manner of illustration of FIG. 31, in which compared with the embodiment illustrated in FIG. 31 the return partial piece has no support section.

In the embodiment of FIG. 31 the return partial piece 20 is formed according to FIG. 1 and in the embodiment of FIG. 31 the return partial piece 20 is formed according to FIG. 19. FIG. 32 is a perspective illustration of a part of a further embodiment of the actuator device according to the disclosure based on the embodiment of FIG. 31 in the manner of illustration of FIG. 31 in which, compared with the embodiment illustrated in FIG. 32, the return partial piece 20 has no support section.

Alternatively or additionally, in the embodiments of FIGS. 31 and 32, in particular for the same technical reason, provision can be made that the rear-side layer 4, viewed in the Z direction, has a greater thickness d4b on the base body 10a of the main body 10 on the rear side 2 than in the regions 10b, which the actuators 11, 12, 13 form on the rear side 2 of the actuator device AV (FIG. 4).

Figure 33:
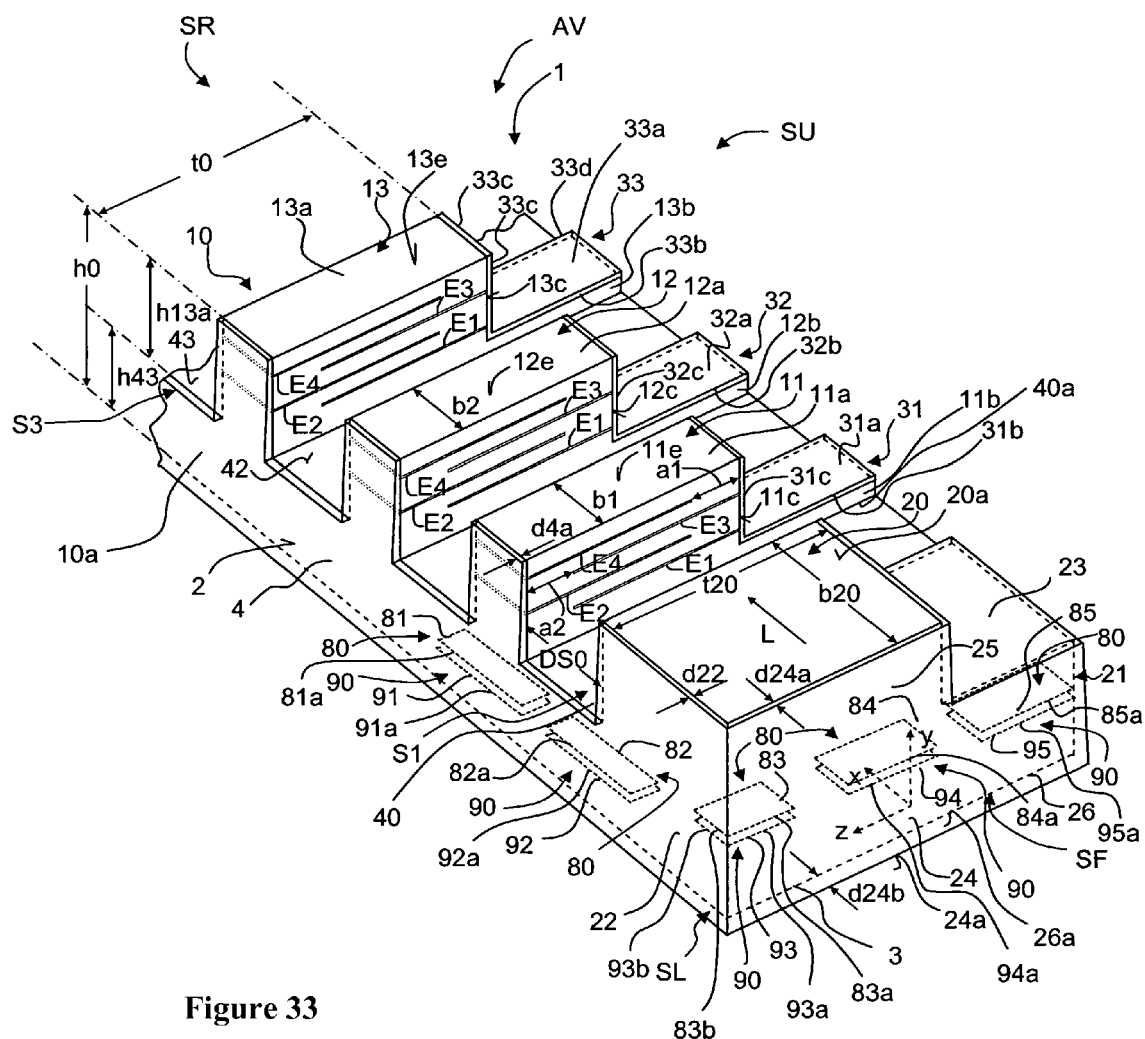
FIG. 33 is a perspective illustration of a part of a further embodiment of the actuator device according to the disclosure in the manner of illustration of FIG. 1, in which compared with the embodiment illustrated in FIG. 1 in the base body shrinkage adaptation electrodes are arranged as inner electrodes.

According to the embodiment of the actuator device AV according to the disclosure in accordance with FIG. 33, at least one shrinkage adaptation electrode is, or shrinkage adaptation electrodes 80, 90 are, introduced in the base body 10a. These serve to achieve a shrinkage process in particular in the production of the main body 10 from a piezoelectric or electrostrictive material in a sintering process, in which the main body 10 undergoes a largely uniform shrinkage. The shrinkage adaptation electrodes 80, 90 can be additionally arranged in the actuator device AV in each of the embodiments thereof shown in FIGS. 1 to 32, and are arranged by way of example in the embodiment shown in FIGS. 1 and 2.

Generally, the shrinkage adaptation electrodes 80, 90 are situated in the base body 10a. In these embodiments, the base body 10a is the part of the main body 10 which, viewed in the Y direction, is situated beneath the recess surfaces 40, 41, 42. In the region of the actuators 11, 12, 13 the base body 10a is delimited, viewed in the Y direction, by the connecting plane in which the edge lines (e.g. for the actuator 11 the edge lines K11-1 and K11-2) of the respective actuator lie with the respective connection piece (e.g. of the actuator 11 with the connection piece 11b). In the region of the return body 21, the base body is delimited in the positive Y direction by the XZ plane in which the edge line 40a or at least the highest point of the edge line 40a, viewed in the Y direction, is situated. This definition of the base body 10a can apply generally for the base body 10a of individual or of all embodiments of the actuator device AV according to the disclosure.

Therefore, the base body 10a can generally be understood as the part of the main body 10 from which the actuators forming the superstructure body 10b extend with the connection pieces of the actuators 11b, 12b, 13c, and if applicable the return connection piece 23 of the return partial piece 20 and if applicable the support section 25. In FIGS. 19 to 21 embodiments of the actuator device AV according to the disclosure are shown, in which no connection piece 23 (FIGS. 19 to 24) or support section 25 (FIGS. 1 to 18 and FIGS. 25 to 30) extends from the base body 10a with the actuator region 9 and the return section 26. Alternatively thereto, the return section 26 can be defined as a region which extends from the underside SL up to the extension of the planar extent of the recess surface 40. The embodiments of the actuator device AV according to the disclosure can also be configured such that the recess surfaces 40, 41, 42 lie on a plane or recess plane which can also be understood as the boundary, up to which the base body 10a extends. Generally, therefore, the actuator device AV has a base body 10a, from which the actuators 11, 12, 13 extend.

The shrinkage adaptation electrodes 80, 90 are embodied so as to be plate-shaped and extend respectively along the ZX plane, wherein in particular a maximum deviation angle of a shrinkage adaptation electrode from the ZX plane by 15 degrees can be provided. The shrinkage adaptation electrodes 80, 90 are arranged in the production of the starting materials and in particular of the base body 10a for the formation of a respective actuator device AV.

The shrinkage adaptation electrodes 80, 90 are provided in particular when the actuator device AV is composed of a first device component, which has at least partially the base body 10a and not the actuators 11, 12, 13, and of a first device component which has the actuators 11, 12, 13, as respectively separate components, as is shown for example in FIGS. 40 to 50 and is described herein by means of these figures. The shrinkage adaptation electrodes 80, 90, or the at least one shrinkage adaptation electrode, can be configured in various ways and situated in the actuator device AV. Preferably, the shrinkage adaptation electrodes 80, 90 are arranged on the face sides SF1, SF2. In addition, provision can be made that at least one shrinkage adaptation electrode lies with marginal sections against the return section surface 26a. In this way, precisely at the marginal sections of the actuator device AV according to the disclosure, at which side surfaces are situated and in particular the return section surface 26a is situated, a shrinkage of the base body 10a in its marginal regions and therefore a distortion or a curvature of the base body 10a along the X axis (about the Z axis) in the production process is prevented. Furthermore, provision can be made that the at least one shrinkage adaptation electrode lies against the rear-side layer 4. In this way, such a shrinkage adaptation electrode arranged in such a manner is also in electrical contact with the rear-side layer 4.

Provision can be generally made that the at least one shrinkage adaptation electrode 80, 90 lies against the return connecting layer 5. In particular, provision can be generally made that the at least one shrinkage adaptation electrode 80, 90 lies against one or more side faces of the actuator device AV, e.g. at least against the return section surface 26a and, at the same time, against the rear side 2, and in particular here against the rear-side section 26r.

Furthermore, provision can be generally made that the at least one shrinkage adaptation electrode 80, 90 extends in the Z direction from the rear side 2 to the front side 1. Provision can also be made that the respective shrinkage adaptation electrode lies against one of the two sides, i.e. against the rear side 2 or the front side 1. The shrinkage adaptation electrode 80, 90 can run here with a marginal section at a distance to the return section surface 26a. On the one hand, provision can be made here that the shrinkage adaptation electrode extends from the rear side 2 and lying against the latter up to the front side 1 and lying here against the latter. On the other hand, provision can be made that the respective shrinkage adaptation electrode extends from the rear side 2 and spaced apart therefrom here up to the front side 1 and spaced apart therefrom here. The distance between the respective shrinkage adaptation electrode and the rear side 2 or the front side 1 can be in particular up to 20% of the longitudinal extent of the return section surface 26a in the Z direction.

Generally, the arrangement of the shrinkage adaptation electrode or the arrangements of the shrinkage adaptation electrodes can be present on the return section surfaces 26a of both face sides SF1, SF2 or only on one of the two face sides SF1, SF2.

Also, at least one layer of respectively several shrinkage adaptation electrodes can be provided. A layer in this context means that several shrinkage adaptation electrodes are situated on an XZ plane with a deviation of 15% of the longitudinal extent of the return section surface 26a in the Z direction. The embodiment of the actuator device AV according to the disclosure illustrated in FIG. 33 has on the first face side SF1 a first layer 80 and a second layer 90 of shrinkage adaptation electrodes. The same or another constellation of shrinkage adaptation electrodes can likewise be arranged on the second face side SF2 of the same actuator device AV. Basically, provision can be made that only one layer or more than two layers of shrinkage adaptation electrodes is or respectively are situated in the base body 10a.

The first layer 80 and second layer 90 of shrinkage adaptation electrodes illustrated in FIG. 33 has the shrinkage adaptation electrodes 81, 82, which are situated with a marginal section 81a or respectively 82a in the rear side 4, i.e. emerge from the base body 10a. Furthermore, the first layer 80 illustrated in FIG. 33 and second layer 90 of shrinkage adaptation electrodes has respectively a shrinkage adaptation electrode 83, 93 which is situated with a marginal section 83b or respectively 93b in the rear side 4 and with a marginal section 83a or respectively 93a in the return section surface 26a. The first layer 80 and second layer 90 of shrinkage adaptation electrodes illustrated in FIG. 33 also has respectively two shrinkage adaptation electrodes 84, 85 or respectively 94, 95, which is situated with a marginal section 84a, 85a or respectively 94a, 95a in the return section surface 26a.

In the illustrated embodiment as generally provision can be made that individual shrinkage adaptation electrodes of different layers, i.e. for example the shrinkage adaptation electrodes 81 and 91, are arranged one over another in the Y direction. Here, provision can also be made that the shrinkage adaptation electrodes which are situated respectively one over the other have an identical shape. In the dimensioning parameters illustrated in the figures, in the cases of application provided according to the disclosure in particular the following dimensions can be provided:

| | |
|---|---|
| b20 | 0.05 to 5 mm, |
| h1 | 0.5 mm to 3 mm, |
| h2 | 0.1 mm to 1.5 mm, |
| h0 | 1 mm to 2.5 mm, | d1, d2, d3 with thin layer (PVD) process 0.5 μm to 1.5 μm, with chemical-galvanic production 2 μm to 7 μm, with production by screen printing method 10 μm to 100 μm;

| | |
|---|---|
| h20 | 1 mm to 2.5 mm, |
| b1 | 0.05 mm to 2.5 mm, |
| b2 | 0.05 mm to 2.5 mm, in particular with b1 = b2, |
| a1 | 0.1 mm to 1 mm, |
| a2 | 0.1 mm to 1 mm, in particular with a1 = a2, |
| DS1 | 0.02 mm to 1 mm, |
| DS2 | 0.02 mm to 1 mm, in particular with DS1 = DS2. |

Basically, according to the disclosure, it is not compulsory that the return body 21 is arranged on one of the face sides of the actuator device AV, but rather it can also be arranged between two actuators 11, 12, 13. Generally, the actuator device according to the disclosure can also have several return bodies 21. In particular, provision can be made here that a return body 21 is arranged on each of the face sides, situated opposed to one another, of the actuator device AV, so that the actuators 11, 12, 13 are situated between these.

The return body 21 can be formed from a piezoelectric or electrostrictive material and in particular can be formed in one piece with the base body 10a and the actuators 11, 12, 13. In the embodiment in which the base body 10a and the actuators 11, 12, 13 extending therefrom are produced from different materials, and the base body 10a is produced from a material which is not piezoelectric or electrostrictive, provision can be made that the return body 21 is likewise produced from a material which is not piezoelectric or electrostrictive. According to a further embodiment, provision can be made additionally here that the return body 21 and the base body 10a are produced in one piece.

According to an embodiment of the actuator device AV, the base body 10a and the actuators 11, 12, 13 extending therefrom are produced in one piece, i.e. from one piece, and are formed here from a piezoelectric or electrostrictive material. In this embodiment, the component formed from the base body 10a and the actuators 11, 12, 13 extending therefrom can be produced in that firstly a starting body of a piezoelectric or electrostrictive material is manufactured, which can be formed in a cuboid shape, and subsequently the actuators 11, 12, 13 are formed by the formation of recesses S1, S2, S3. Provision can be made here that the recesses S1, S2, S3 are produced by a corresponding removal process such as for example grinding, sawing or milling out of the starting body.

Figure 34:
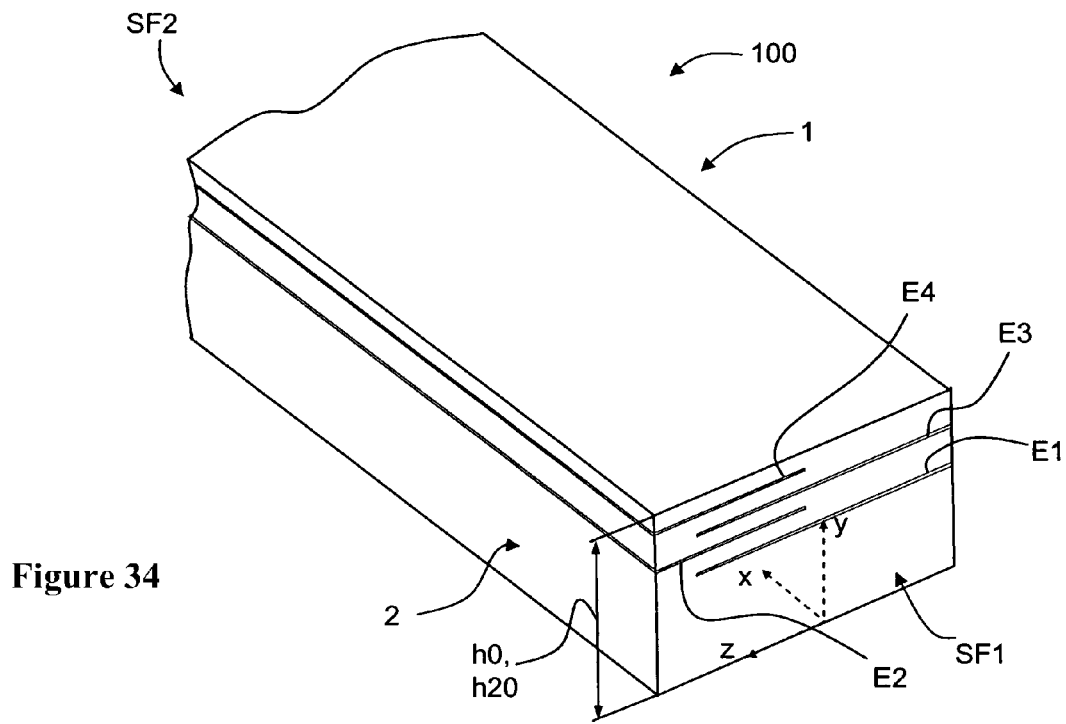
FIG. 34 is an embodiment of a main body intermediate product for the production of one of the embodiments according to FIGS. 1 to 33, wherein the intermediate product is a monolithic block.

According to a method according to the disclosure for the production of the main body 10 according to an embodiment in accordance with FIGS. 1 to 33, a monolithic block 100 is produced as first intermediate product from layers of a piezoelectric or electrostrictive material, which are layered on one another in the thickness direction Y (FIG. 34). The monolithic block has a height of at least h0 or h20 in the vertical direction Y. In the monolithic block, the electrodes E1, E2, E3, E4 are contained respectively as layers extending in a planar manner along the XZ plane between layers of a piezoelectric or electrostrictive material. In a further step, an overall coating (not shown) is carried out, i.e. depending on the embodiment, a coating of outer faces of the monolithic block, wherein the coating material is electrically conductive.

Figure 35:
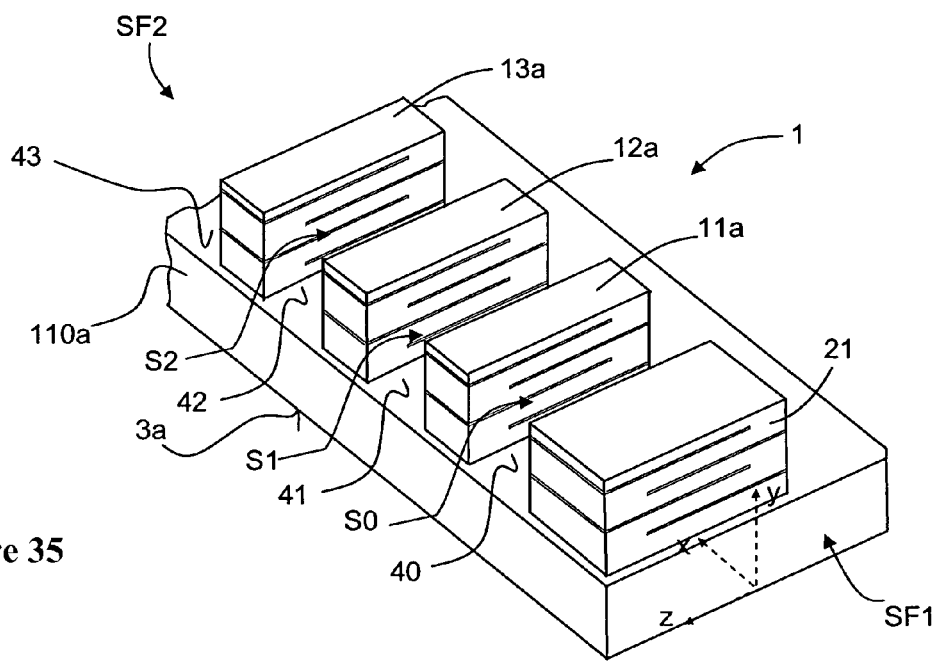
FIG. 35 is an embodiment of a further intermediate product which follows the intermediate product of FIG. 34 by processing thereof.

According to a first embodiment of the method, the monolithic block 100 is produced such that from this the actuator bodies 11a, 12a, 13a and the return body 21, on which a subsequent coating for the formation of the actuators 11, 12, 13 or respectively of the at least one return partial piece 20 is to be take place, can be formed (FIG. 34). By shaping and in particular by sawing, grinding or milling of the recesses S0, S1, S2, S3, the main body 10 with the base body 10a, the actuator bodies 11a, 12a, 13a and the return body 21 with the support section 25 (FIG. 35) are formed from the monolithic block, wherein the return body 21 is formed from the same material as the actuator body 11a, 12a, 13a. Furthermore, the return body 21 can be formed in particular from the same material as the actuator body 11a, 12a, 13a and as the base body 10a. This method sequence is particularly advantageous if in the return body 21 or respectively in its support section 25 the same electrodes are to be contained in number, shape and position as in the actuators 11, 12, 13 of the main body 10 which is to be produced (e.g. embodiment according to FIG. 3). Here, in addition two further method steps can be provided for the production of an upper-side groove (e.g. embodiment according to FIG. 4). Subsequently, an upper-side coating is firstly produced. This can take place in a step for the production of the overall coating. In the embodiment according to FIG. 1, the overall coating comprises the first connection layer 31a, 32a, 33a, the return connection coating 23a, the rear-side layer 4 and the return connecting layer 5. Subsequently, the production of the surface grooves takes place.

Alternatively, the production of the surface grooves can take place after the formation of the monolithic block and before the formation of the recesses S0, S1, S2 S3. Here, however, in the production of the overall coating, a covering of surface regions must take place which are not to be coated according to the respective embodiment of the actuator device AV according to the disclosure.

Figure 36:
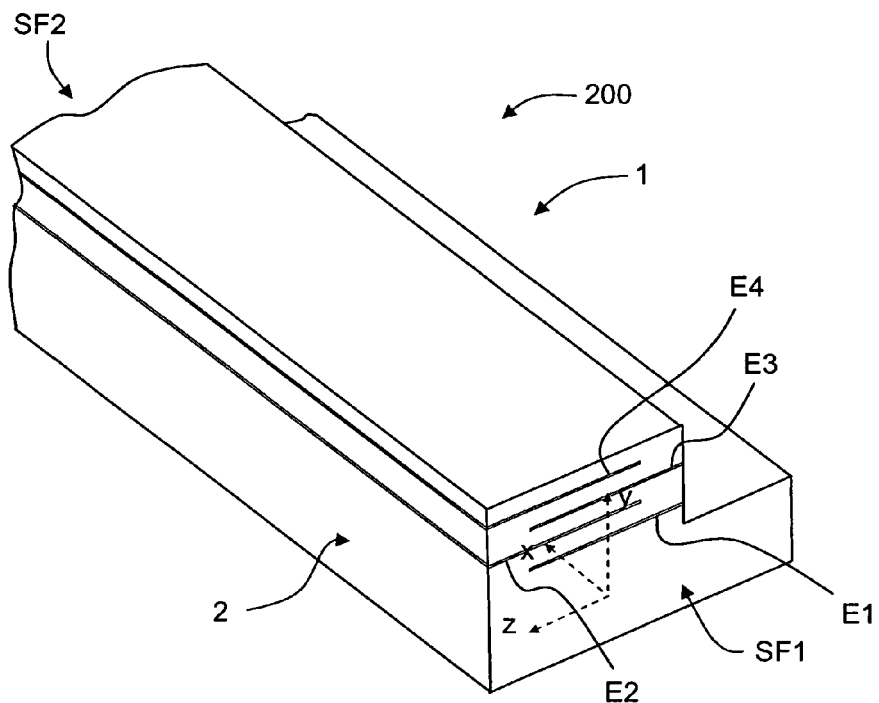
FIG. 36 discloses an alternative production method with respect to FIGS. 34 and 35 an embodiment of a main body intermediate product for the production of the actuator device according to the disclosure, wherein the intermediate product is a monolithic block onto which a return body is able to be fastened.
Figure 37:
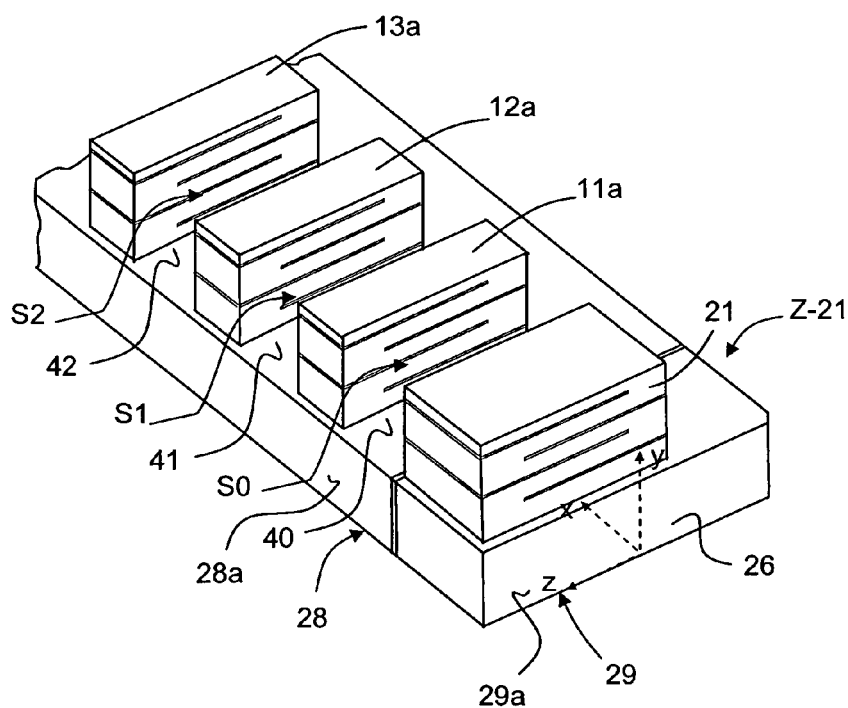
FIG. 37 is a further intermediate product of the method, to which the intermediate product according to FIG. 36 refers, wherein the intermediate product shown in FIG. 37 has the return body.

Alternatively to this, provision can be made that the monolithic block 200 is produced such that the base body and the actuator bodies 11a, 12a, 13a can be or respectively are produced therefrom, but not the return body 21 (FIG. 36). In this case, provision can be made in particular that firstly the recesses S0, S1, S2 are produced from the monolithic block by shaping and in particular by sawing out, grinding or sawing, and an additional block Z-21 for the formation of the return body 21 is glued to the produced monolithic block onto a partial piece 10c of the base body 10a on which the recess 40 is to be formed (FIG. 37). In this way, the main body 10 is produced with the base body, the actuator bodies 11a, 12a, 13a and the return body 21 (here having a support section 25). This method sequence is advantageous in particular when no or not the same electrodes in number, shape and position or additionally e.g. shrinkage adaptation electrodes are to be contained in the return body 21 as in the actuators 11, 12, 13 of the main body 10 which is to be produced.

Figure 38:
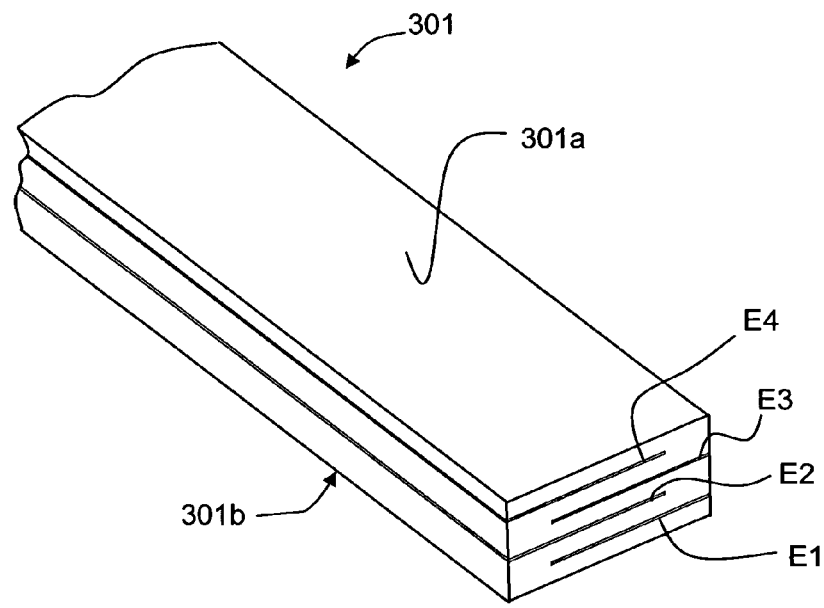
FIG. 38 is an embodiment of a superstructure body intermediate product for the production of the actuator device according to the disclosure, in which the main body is composed from separate parts from a base body intermediate product and the upper body intermediate product according to FIG. 38.
Figure 39:
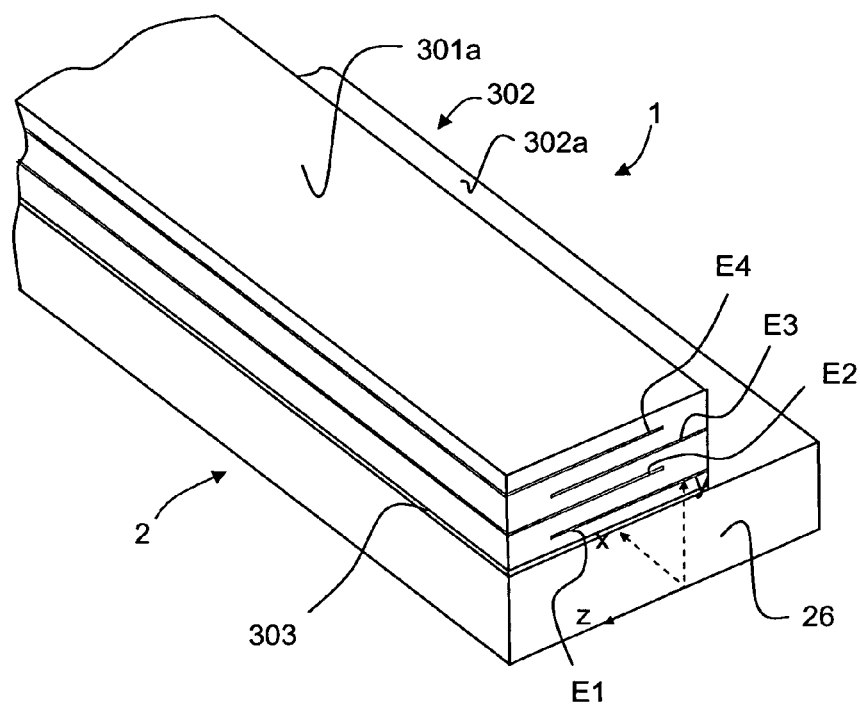
FIG. 39 is an embodiment of a main body intermediate product for the production of the actuator device according to the disclosure, wherein the main body intermediate product is composed from the upper body intermediate product according to FIG. 38 and a base body intermediate product as separate intermediate products.

According to an embodiment of the production of the actuator device AV alternative hereto, a material block 301 and in particular a first partial body or a monolithic block 301 of a piezoelectric or electrostrictive material with electrodes E1, E2, E3, E4 embedded therein is produced as a separate body of the main body 10 (FIG. 38). In the method step following therefrom, the first partial body 301 is connected with its surface 301b via a connecting layer 303 with the surface 302a of a second partial body 302, wherein the connecting layer is preferably an adhesive layer. Alternative types of connection with a corresponding connecting layer 303 are conceivable, e.g. soldering or welding (FIG. 39). The second partial body 302 can consist here both of a piezoelectric or electrostrictive material and of a non-piezoelectric or non-electrostrictive material. The second partial body can have in particular Al2O3 or consist of Al2O3. Provision can be made that—as illustrated in FIG. 39—the first partial body 301 has in Z direction a different, e.g. smaller extent than the second partial body 302. Likewise, provision can be made that the first partial body and second partial body, viewed in Z direction, have the same dimensions.

In the further method sequence, provision can be made that by shaping and in particular by sawing, grinding or milling of the recesses S0, S1, S2, the main body 10 with the base body 10a, the actuator bodies 11a, 12a, 13a and the return body 21 with the support section 25 is formed. Here, the recesses S0, S1, S2 extent up to the connecting layer 303. Provision can also be made that in the region of the recesses S0, S1, S2 the connecting layer 303 is removed by the shaping process, so that the recesses extend up to the second partial body 302.

Figure 40:
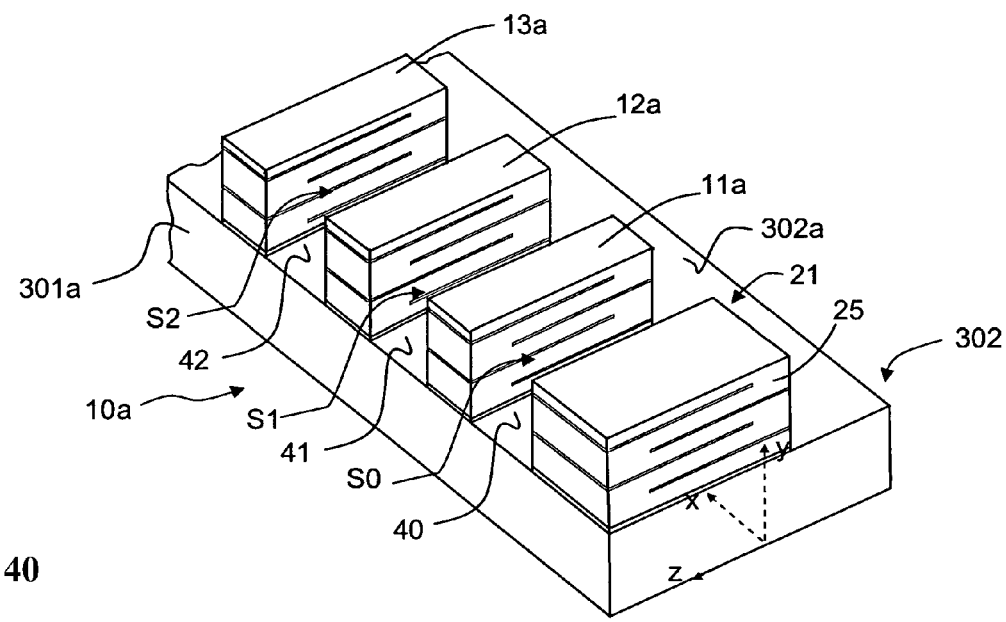
FIG. 40 is an embodiment of a further intermediate product, which is formed from a main body intermediate product according to FIG. 39 and in which several actuator bodies and a support section of the return body are formed from the upper body intermediate product.

In an alternative method, the partial body 301 can be divided according to FIG. 38 in a method step into individual sections, in order to thus produce the actuator bodies 11a, 12a, 13a or respectively the support section 25 as separate bodies, which then in a further method step are arranged individually on the second partial body 302 forming the base body 10a and are connected therewith in a materially connected manner and are preferably glued on (FIG. 40).

Figure 41:
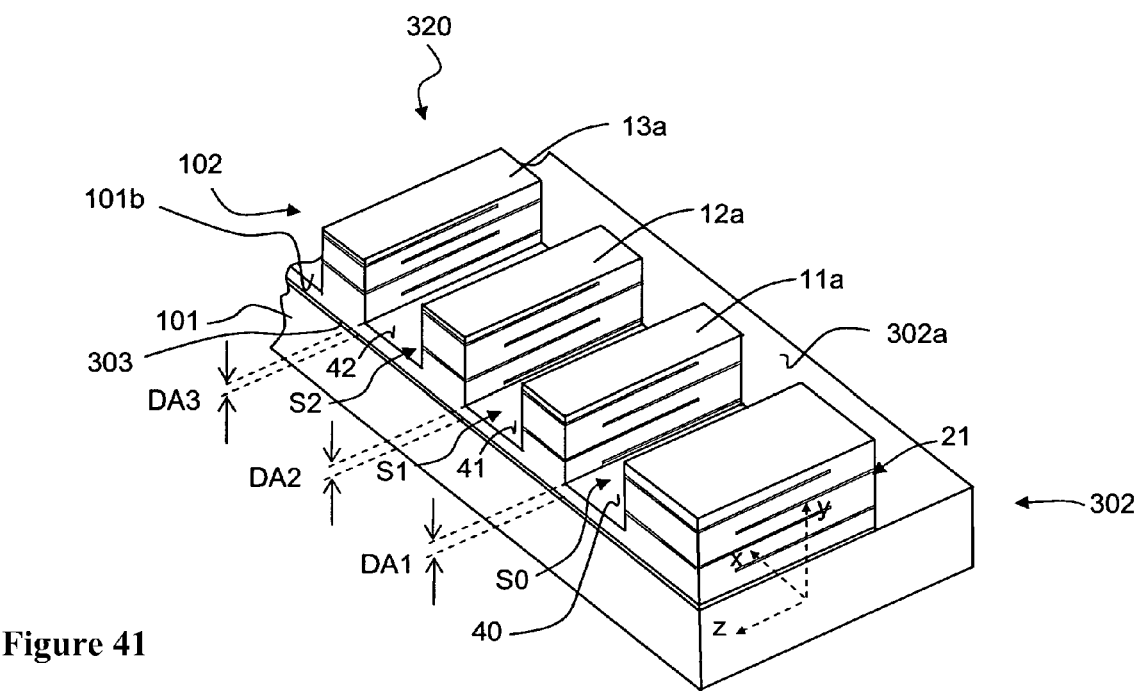
FIG. 41 is an embodiment of a further intermediate product, which is formed alternatively to the embodiment of an intermediate product shown in FIG. 40, by the actuator bodies and the support section of the return body being formed in a manner alternative thereto.

In an embodiment of the method according to the disclosure in accordance with FIG. 41, provision can be made that for the formation of an intermediate product 320, the recesses S0, S1, S2 are constructed here such that, viewed from the surface 301b of the first partial body 301, they extend only up to a distance DA1, DA2, DA3 in positive Y direction above the connecting layer 303, so that the recesses S0, S1, S2 do not intersect the connecting layer 303.

Figure 42:
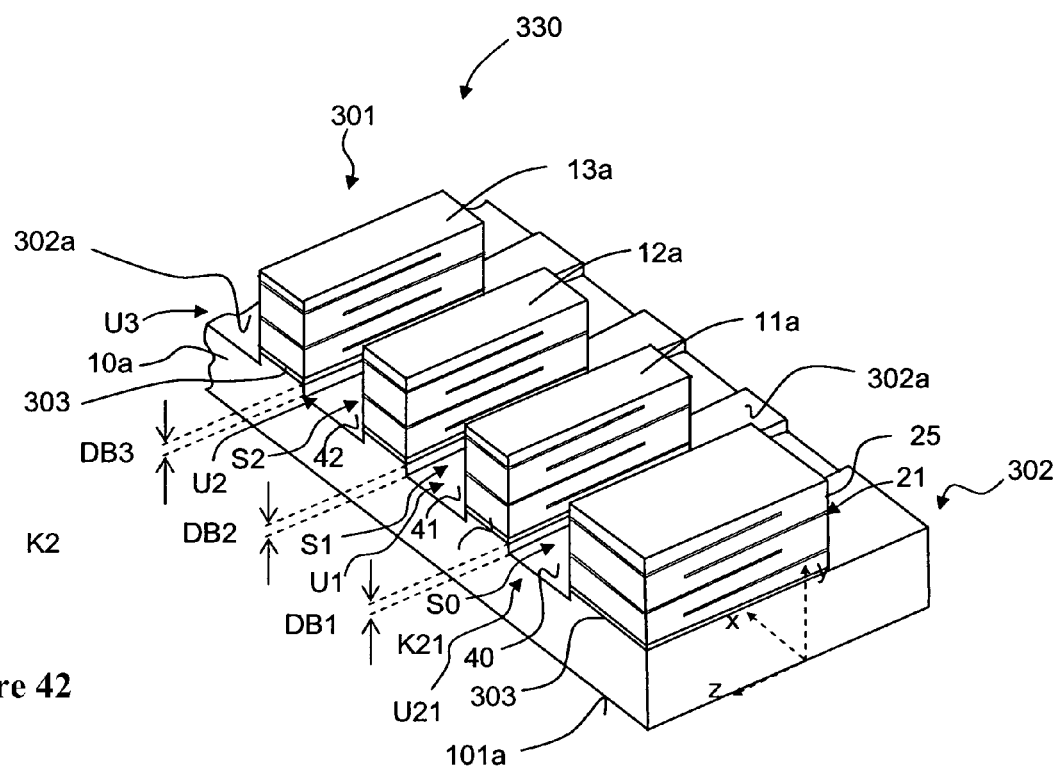
FIG. 42 is an embodiment of a further intermediate product which is formed alternatively to the embodiment of an intermediate product shown in FIG. 40, by the actuator bodies and the return body together with the support section being formed in a further alternative manner thereto.

In a further embodiment of the method according to the disclosure in accordance with FIG. 42, provision can be made that for the formation of an alternative intermediate product 330 thereto, the recesses S0, S1, S2 are constructed here such that, viewed from the surface 302a of the second partial body 302, they extend up to a distance DB1, DB2, DB3 into the second partial body 302, so that the recesses S0, S1, S2 intersect the connecting layer 303. In this way, transition sections U1, U2, U3, U21 form on the base body 302 or respectively 10a, adjoining which, viewed in the thickness direction Y, is an actuator body 11a, 12a, 13a respectively. The actuator bodies 11a, 12a, 13a therefore form in a lower region, which borders on the respective surfaces 41, 42, 43 of the recesses S1, S2, S3 which have arisen, no opposite sections, viewed in the longitudinal direction X, with a piezoelectric or electrostrictive material.

Figure 43:
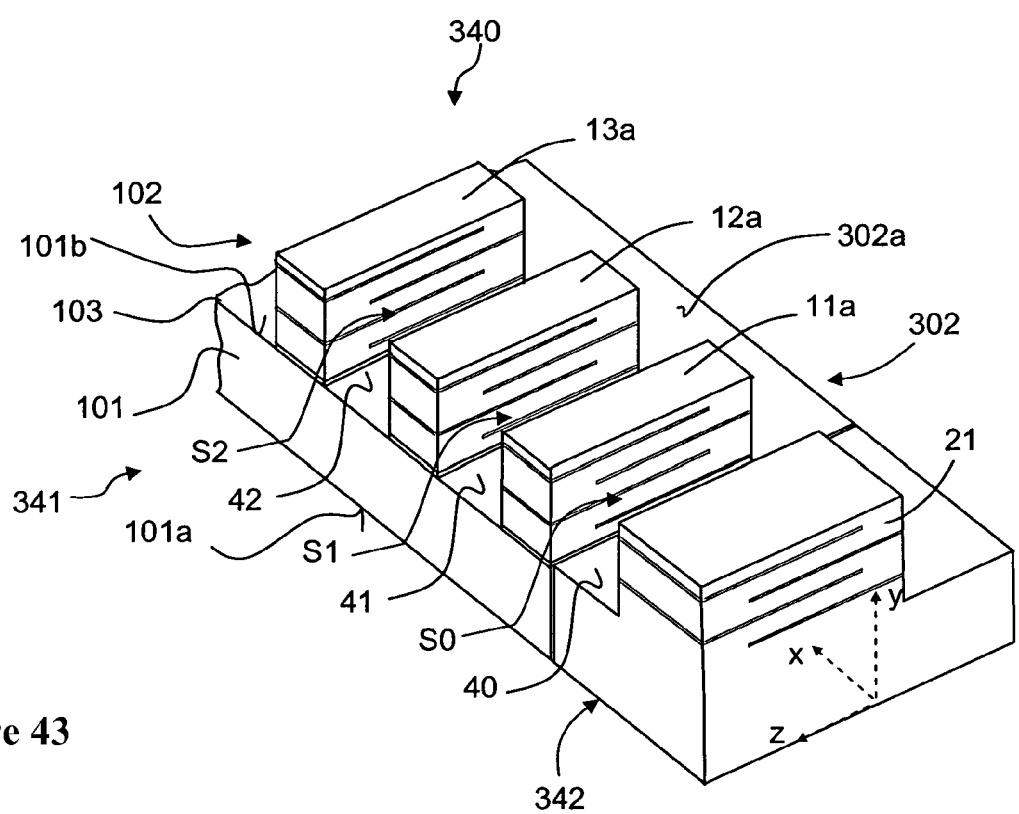
FIG. 43 is an embodiment of a further intermediate product, which is formed alternatively to the embodiment of an intermediate product shown in FIG. 40, by the return body of the intermediate product being formed as a distinct intermediate product.
Figure 44:
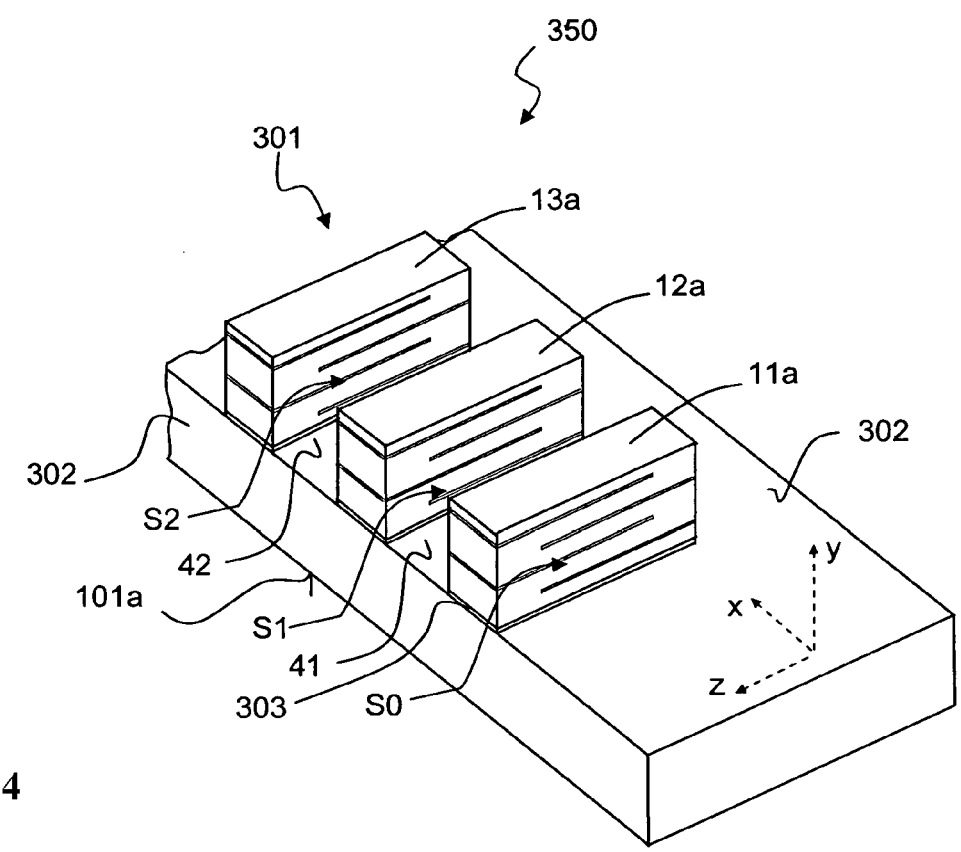
FIG. 44 is an embodiment of a further intermediate product, which is formed alternatively to the embodiment of an intermediate product shown in FIG. 40, by the return body of the intermediate product having no support section.
Figure 45:
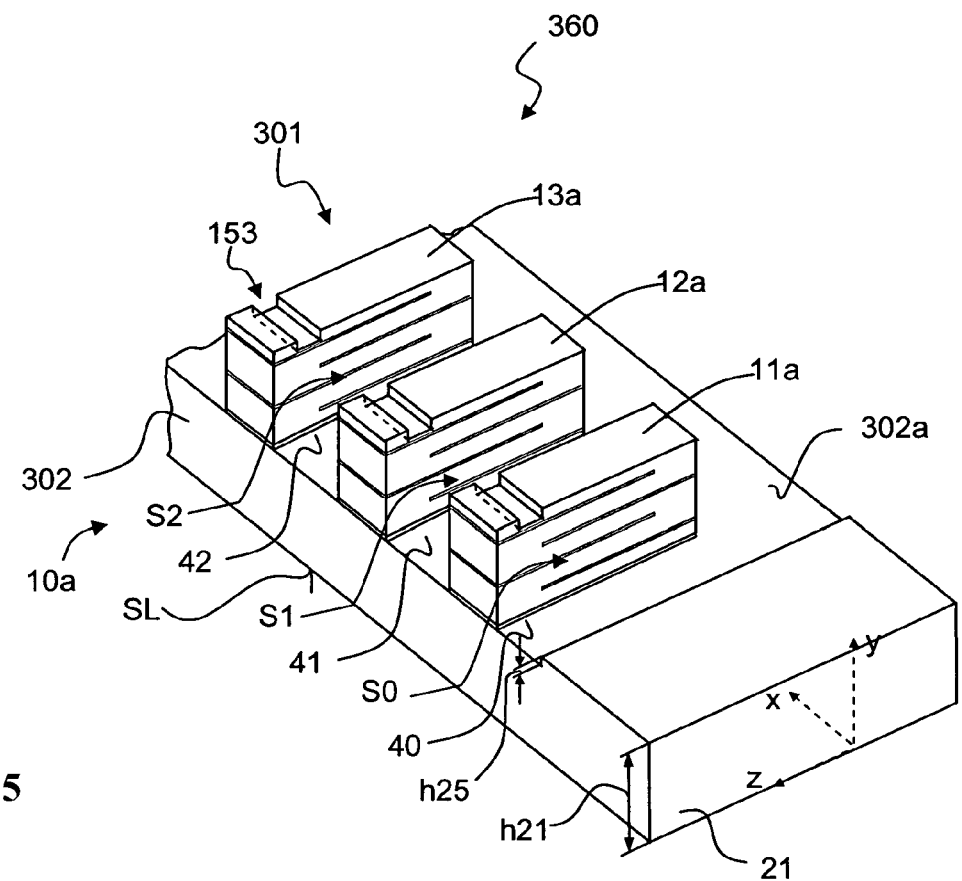
FIG. 45 is a perspective illustration of a part of a further intermediate product of the actuator device according to the disclosure on the basis of the actuator device of FIG. 44, wherein in the illustrated embodiment the return partial piece has a smaller height compared with the support section shown in FIG. 1, wherein the further embodiment of the actuator device, compared with the embodiment of FIG. 40, has an upper actuator groove in the region of the rear side of the actuator device.
Figure 46:
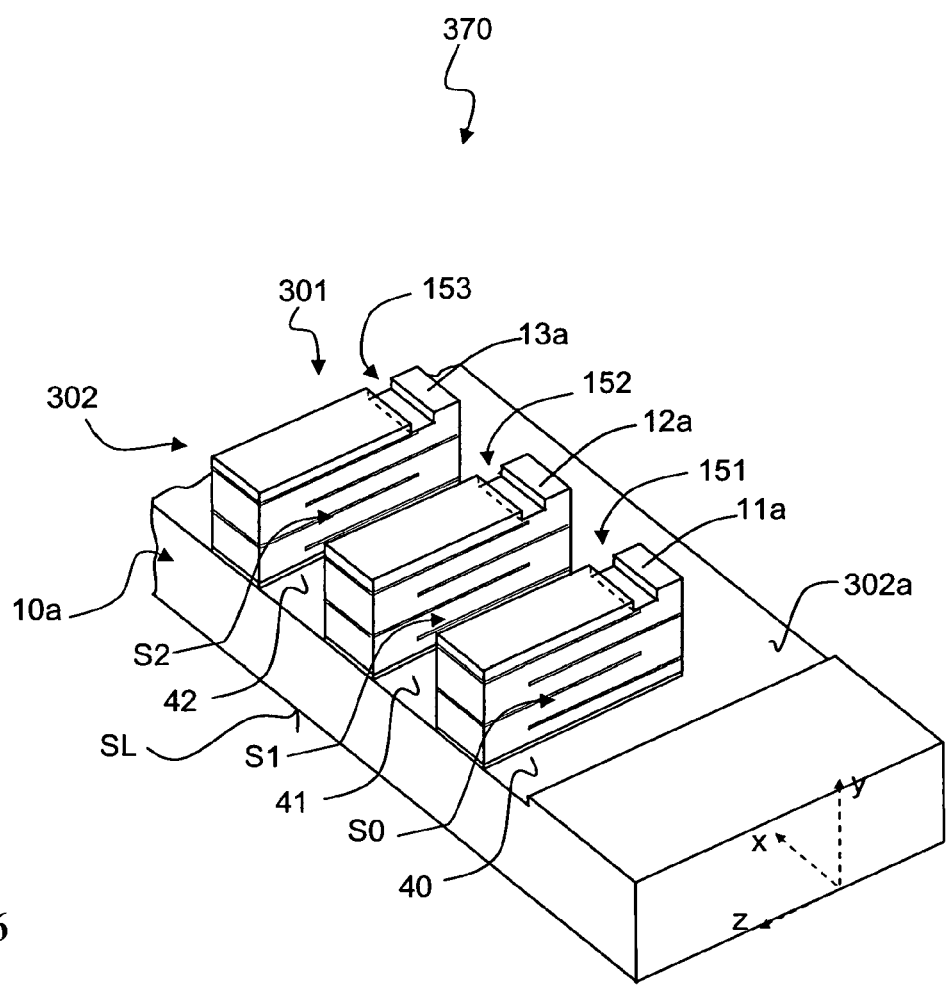
FIG. 46 is a perspective illustration of a part of a further intermediate product of the actuator device according to the disclosure on the basis of the actuator device of FIG. 44, wherein in the illustrated embodiment the return partial piece has a smaller height compared with the embodiment of the support section shown in FIG. 1, wherein the further embodiment of the actuator device, compared with the embodiment of FIG. 44 has an upper actuator groove in the region of the front side of the actuator device.
Figure 47:
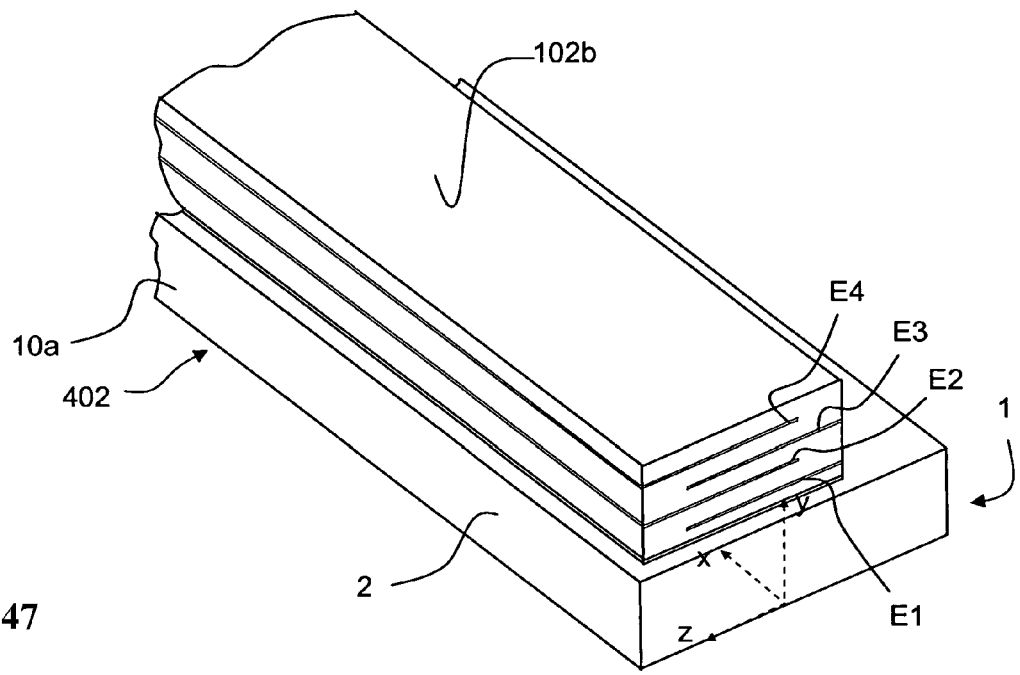
FIG. 47 is a further embodiment of the main body intermediate product, compared with the embodiment of a main body intermediate product illustrated in FIG. 39, wherein the base body intermediate product has a first main body end piece and a second main body end piece.
Figure 48:
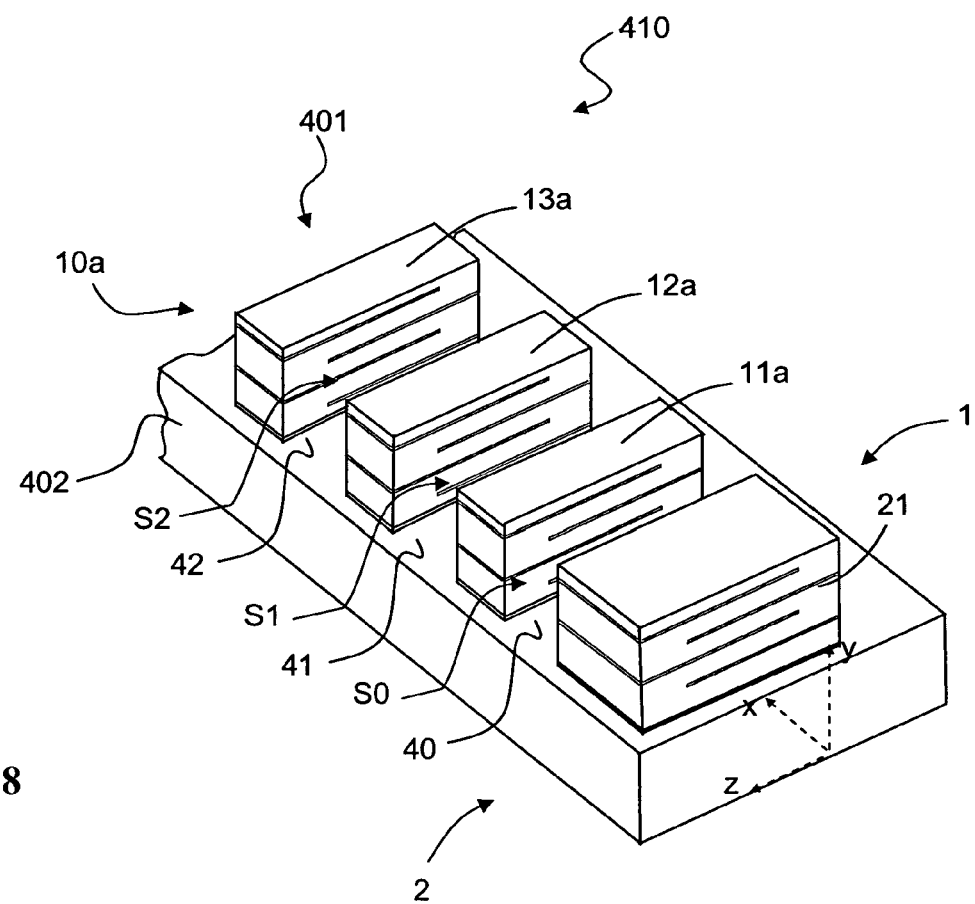
FIG. 48 is an embodiment of a further intermediate product, which is formed from a main body intermediate product according to FIG. 47, and in which several actuator bodies and a return body with support section are formed from the intermediate product.
Figure 49:
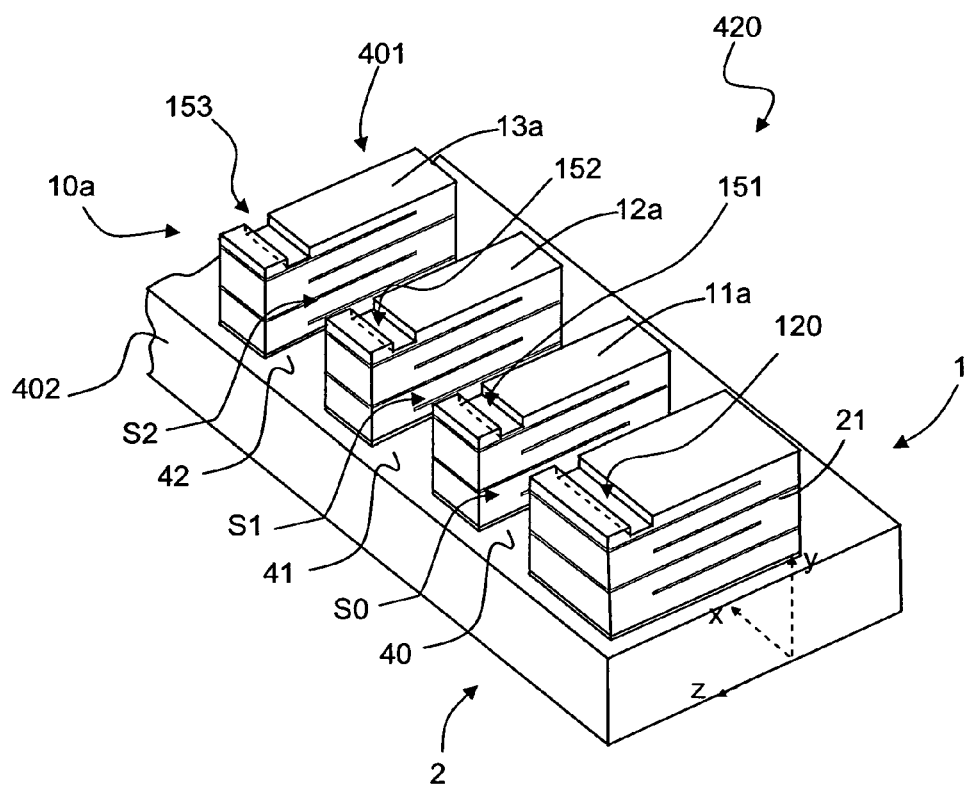
FIG. 49 is a perspective illustration of a part of a further intermediate product of the actuator device according to the disclosure on the basis of the actuator device of FIG. 48, wherein the further embodiment of the actuator device, compared with the embodiment of FIG. 48, has an upper actuator groove in the region of the rear side of the actuator device.

Furthermore, provision can be made that for the formation of an intermediate product 340 alternative thereto, the shapings and e g millings go precisely into the connecting layer 303 (FIG. 43). In a continuation of this method, illustrated in FIG. 43, one end piece is or two end pieces are on opposed face sides of the component 341 respectively an end piece 342 connected in a force-fitting manner, which is suited for the formation of a return body 21 according to an embodiment of the disclosure.

The intermediate products 301, 302 can also be formed and glued with one another in such a manner and the shapings can take place in such a manner that an intermediate product 350 (FIG. 44) is produced, with which an actuator device AV in the embodiments illustrated in FIGS. 19 to 24 is able to be produced;

an intermediate product 360 (FIG. 45) is produced, with which an actuator device AV in the embodiments illustrated in FIG. 25 or 26 is able to be produced, and an intermediate product 370 (FIG. 46) is produced, with which an actuator device AV in the embodiments illustrated in FIG. 27 is able to be produced.

Figure 50:
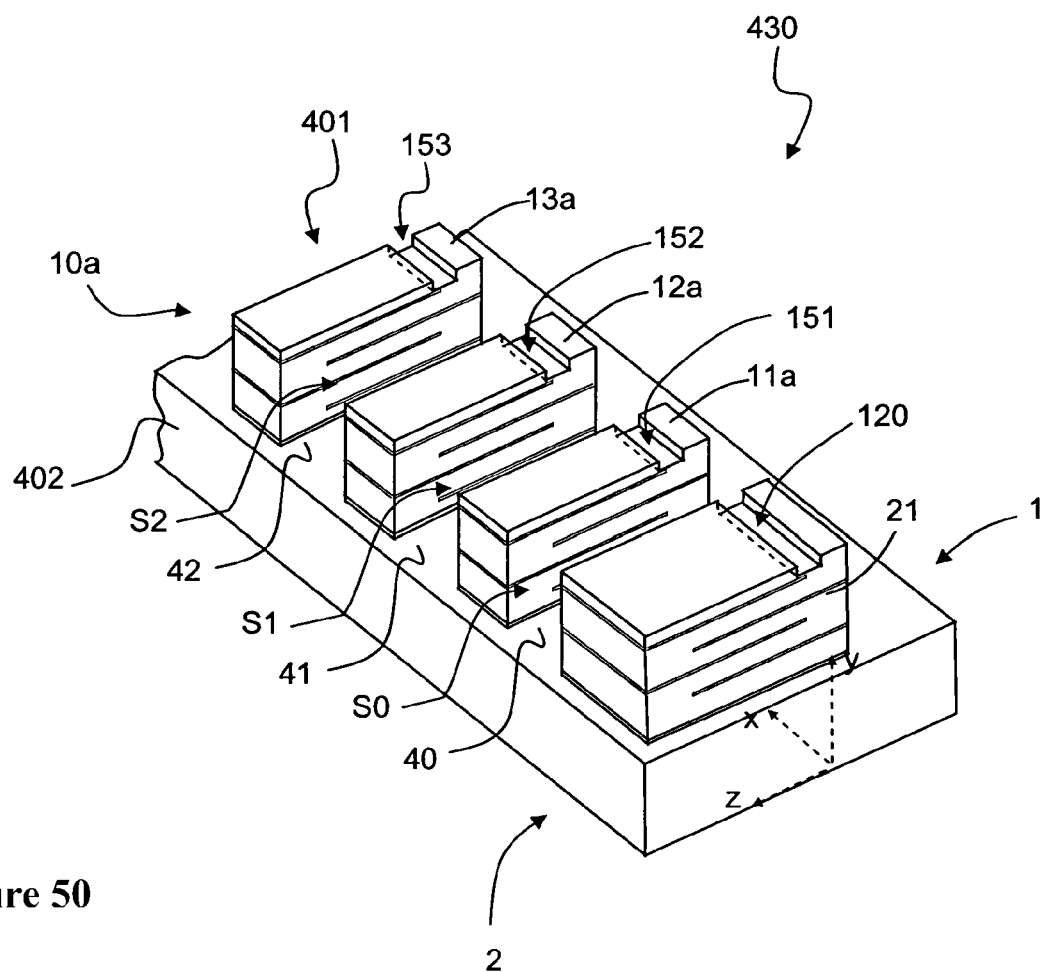
FIG. 50 is a perspective illustration of a part of a further intermediate product of the actuator device according to the disclosure, on the basis of the actuator device of FIG. 48, wherein in the illustrated embodiment, compared with the embodiment of FIG. 48, there is an upper actuator groove in the region of the front side of the actuator device. In the figures, components and constituent parts having a similar or identical function are partly provided with respectively the same reference number.

Furthermore, provision can be made that for the formation of an embodiment of the actuator device AV according to the disclosure with a main body end piece 29 according to FIGS. 9 to 17 or with two end pieces main body end pieces 28 and 29 in particular according to FIG. 18 an intermediate product 400 is produced by force-fitting connecting according to a method named herein from a first starting product 401 with electrodes E1, E2, E3, E4 such as e.g. also with the component 301 of FIG. 38 and a second starting product 402. The starting products 401, 402 can be glued to one another and the shapings can take place such that an intermediate product 410 (FIG. 48) is produced, with which an actuator device AV in the embodiment illustrated in FIG. 18 is able to be produced, an embodiment of the actuator device AV according to the disclosure, in which in addition grooves 120, 151, 153 are formed (cf. FIG. 4), which are situated closer to the rear side 2 (FIG. 49); and an embodiment of the actuator device AV according to the disclosure, in which in addition grooves 120, 151, 153 are formed (cf. FIG. 5), which are situated closer to the front side 1 (FIG. 50).

There are many possible embodiments of the present disclosure, of which only a few have been described herein. It is intended that the foregoing detailed description be regarded as illustrative rather than limiting, and that it be understood that it is the following claims, including all equivalents, that are intended to define the spirit and scope of this disclosure.

What is claimed is:

1. An actuator device (AV), comprising:
   a main body (10) which comprises a base body (10a) and a superstructure body (10b), wherein the main body (10) extends in a longitudinal direction (X), a depthwise direction (Z) running transversely to the longitudinal direction (X), and a thickness direction (Y) directed transversely to the longitudinal direction (X) and transversely to the depthwise direction (Z), the thickness direction (Y) defining an upper side (SU) for being an abutment of an application component, wherein the main body (10) has a front side (1), a rear side (2) situated opposed to the front side (1) in relation to the longitudinal direction (X) of the actuator device (AV), and face sides (SF1, SF2) situated opposed to one another and each situated between the front side (1) and the rear side (2);

a plurality of actuators (11, 12, 13), which form the superstructure body (10b) and which are each formed from a piezoelectric or electrostrictive material and extend respectively in the thickness direction (Y) from the base body (10a), wherein the actuators are arranged behind one another in the longitudinal direction (X) of the actuator device (AV) and between respectively two adjacent actuators a recess (S0, S1, S2, S3) is formed, wherein the actuators (11, 12, 13) each have at least two inner actuating electrodes (E1, E2, E3, E4), of which at least one first inner actuating electrode (E1, E3) extends, in a positive depthwise direction (Z) from the front side (1) up to a distance (a2) to a surface (2a) at the rear side (2), and of which at least one second inner actuating electrode (E2, E4) extends, in a negative depthwise direction (Z), from the rear side (2) up to a distance (a1) to a surface (11c, 12c, 13c) at the front side (1), wherein the at least one first inner actuating electrode (E1, E3) of each actuator (11, 12, 13) is provided for electrical connection to a first connection pole of an actuating device;

actuator connection coatings (31, 32, 33) each of which are disposed on a respective one of surfaces (11c, 12c, 13c) which are lying at the front side (1) and each of which are connected with the respective at least one first inner actuating electrode (E1, E3) of the actuators (11, 12, 13);

at least one return body (21) which is disposed in the longitudinal direction (X) of the actuator device (AV) at a face side (SF1, SF2) at an end of a row of actuators (11, 12, 13) and which comprises a rear-side section (26r) lying at the rear side (2), a return section surface (26a) lying at the respective face side (SF1, SF2) and a surface (21a) lying at the upper side (SU), a rear-side layer (4) which is formed from electrically conductive material, extends at the rear side (2) of the actuator device (AV) over the main body (10) and the rear-side section (26r) of the return body (21) and is connected electrically to the at least one second inner actuating electrode (E2, E4) of the actuators (11, 12, 13), an outer return connecting layer (5), which is connected electrically to the rear-side layer (4) and is formed of one or both of the following alternatives:
(a) a face-side layer section (24) which is disposed on a return section surface (26a) lying at the respective face side (SF1, SF2),
(b) an outer layer (26c) which is disposed on the surface (21a) lying at the upper side (SU); and
a return connection coating (23) on the front side (1) of the actuator device (AV), for electrical connection to a second connection pole of the actuating device, wherein the return connection coating (23) is connected electrically to the outer return connecting layer (6), wherein the distance (a2) of the respective first inner actuating electrode (E1, E3) to the surface (2a) at the rear side (2) and the distance (a1) of the respective second inner actuating electrode (E2, E4) to the front side (1) are provided such that when a piezoelectric or inverse piezoelectric effect of the actuators (11, 12, 13) occurs, the actuator connection coatings (31, 32, 33) and the return connection coating (23) are respectively connected to a respective pole of opposed poles of an actuating device.

2. The actuator device (AV) according to claim 1, wherein the actuator device (AV) has an actuator connection coating (31a, 32a, 33a), which is electrically connected to the respective first inner actuating electrode (E1, E3) of the actuators (11, 12, 13) of the plurality of actuators and to which respectively a first electrical pole of a plurality of electrical poles of the actuating device is adapted for connection for the independent activation of the individual actuators (11, 12, 13).

3. The actuator device (AV) according to claim 1, wherein the outer return connecting layer (5) is formed of the face-side layer section (24) of the return body which is disposed on the return section surface (26a) and wherein in the return body (21) inner return electrodes (RE1, RE2, RE3, RE4) are arranged, of which at least one first inner return electrode (RE1, RE3) extends in the positive depthwise direction Z from the front side (1) up to a distance from the rear side (2), and of which at least one second inner return electrode (RE2, RE4) extends in the negative depthwise direction (Z) from the rear side (2) up to a distance from the front side (1).

4. The actuator device (AV) according to claim 3, wherein the inner return electrodes (RE1, RE2, RE3, RE4) which are disposed in the return body (21) correspond in number, shape and position to the inner actuating electrodes (E1, E2, E3, E4) which are disposed in the actuators (11, 12, 13).

5. The actuator device (AV) according to claim 1, wherein the rear-side layer (4) in a region of the base body (10a) of the main body (10) has a greater thickness (dv) in the depthwise direction (Z) than in a region of the superstructure body (10b).

6. The actuator device (AV) according to claim 1, wherein the main body (10) with the base body (10a) and the superstructure body (10b), which comprises actuator bodies (11a, 12a, 13a) forming the actuators (11, 12, 13), forms a monolithic body.

7. The actuator device (AV) according to claim 1, wherein the base body (10a) and the superstructure body (10b) of the main body (10) is respectively formed as a distinct partial body.

8. The actuator device (AV) according to claim 7, wherein the base body (10a) and the superstructure body (10b) are respectively produced from different materials and the base body (10a) is produced from a material which is not piezoelectric or electrostrictive.

9. The actuator device (AV) according to claim 7, wherein the base body (10b) and the superstructure body (10b) are glued to one another.

10. The actuator device (AV) according to claim 1, wherein the rear-side layer (4) and the return connecting layer (6) together form a one-piece layer.

11. The actuator device (AV) according to claim 1, wherein in the base body (10a) at least one plate-shaped shrinkage adaptation electrode (80, 90) is situated, wherein at least one shrinkage adaptation electrode (80, 90) is situated in the base part (10a) such that a marginal section thereof lies in each of two return section surfaces (26a, 26a-2), in order to balance out a local shrinkage behavior of the base body (10a) during a production thereof.

12. The actuator device (AV) according to claim 11, wherein a shrinkage adaptation electrode (80, 90) lying against the return section surface (26*a*, 26*a*-2), viewed in the depthwise direction (Z), extends from the rear side (2) into a region of the connection piece (23).

13. The actuator device (AV) according to claim 11, wherein the return section surface (26) is coated with a face-side layer section (24).

\* \* \* \* \*